(12) United States Patent
Kawachi

(10) Patent No.: US 7,791,077 B2
(45) Date of Patent: Sep. 7, 2010

(54) ELECTRONIC DEVICE, DISPLAY DEVICE, INTERFACE CIRCUIT AND DIFFERENTIAL AMPLIFICATION DEVICE, WHICH ARE CONSTITUTED BY USING THIN-FILM TRANSISTORS

(75) Inventor: Genshiro Kawachi, Chiba (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 245 days.

(21) Appl. No.: 11/834,372

(22) Filed: Aug. 6, 2007

(65) Prior Publication Data

US 2008/0042152 A1 Feb. 21, 2008

(30) Foreign Application Priority Data

Aug. 18, 2006 (JP) .............................. 2006-223310
Jul. 30, 2007 (JP) .............................. 2007-197893

(51) Int. Cl.
H01L 27/08 (2006.01)
H01L 29/04 (2006.01)
H01L 29/76 (2006.01)
H01L 31/036 (2006.01)
H01L 31/112 (2006.01)

(52) U.S. Cl. .............................. 257/69; 257/66; 257/67
(58) Field of Classification Search .................. 257/66, 257/67, 68, 69, 347, E21.382, E27.015
See application file for complete search history.

(56) References Cited

U.S. PATENT DOCUMENTS 7,508,034 B2 * 3/2009 Takafuji et al. ............. 257/347
7,588,973 B2 * 9/2009 Ushiku ....................... 438/154

FOREIGN PATENT DOCUMENTS

| JP | 10-32337 | 2/1998 |
|----|----------|--------|
| JP | 2002-176350 | 6/2002 |
| JP | 2003-76345 | 3/2003 |
| JP | 2005-18088 | 1/2005 |

OTHER PUBLICATIONS

U.S. Appl. No. 11/760,926, filed Jun. 11, 2007, Kawachi.
B. Y. Tsaur, et al., "Fully isolated Lateral Bipolar-MOS Transistors Fabricated in Zone-Melting-Recrystallized Si Films on $SiO_2$", IEEE Electron Device Letters, vol. EDL-4, No. 8, Aug. 1983, pp. 269-271.
James C. Sturm, et al. "A Lateral Silicon-on-Insulator Bipolar Transistor with a Self-Aligned Base Contact," 1987 IEEE, 3 pages.

(Continued)

Primary Examiner—Phuc T Dang
(74) Attorney, Agent, or Firm—Oblon, Spivak, McClelland, Maier & Neustadt, L.L.P.

(57) ABSTRACT

An integrated circuit, which is configured such that a MOS transistor and a bipolar transistor are integrated at the same time, is formed on an insulating substrate which includes a display device. An electronic device or a display includes a plurality of semiconductor devices which are formed by using a semiconductor thin film and are formed in the semiconductor thin film that is provided on an insulating substrate and is crystallized in a predetermined direction. The plurality of semiconductor devices include a MOS transistor and at least either one of a lateral bipolar thin-film transistor and a MOS-bipolar hybrid thin film transistor.

8 Claims, 38 Drawing Sheets

OTHER PUBLICATIONS

Stephen Parke, et al., "A Versatile, SOI BiCMOS Technology with Complementary Lateral BJT's", 1992 IEEE, IEDM 92, pp. 453-455.

T. Shino, et al. "A 31 GHz$f_{max}$ Lateral BJT on SOI Using Self-Aligned External Base Formation Technology", IEEE, 1998, IEDM98 pp. 953-956.

Richard McCartney, et al. "9.3: WhisperBus™: An Advanced Interconnect Link for TFT Column Driver Data", SID 01 Digest, pp. 1-4, 2001.

Jorgen Olsson, et al., "High Current Gain Hybrid Lateral Bipolar Operation of DMOS Transistors", IEEE Transactions on Electron Devices, vol. 42, No. 9, Sep. 1995, pp. 1628-1635.

Stephen A. Parke, et al., "Bipolar-FET Hybrid-Mode Operation of Quarter-Micrometer SOI MOSFET's", IEEE Electron Device Letters, vol. 14, No. 5, May 1993, pp. 234-236.

Sophie Verdonckt-Vanderbroek, et al., "High-Gain Lateral Bipolar Action in a MOSFET Structure", IEEE Transactions on Electron Devices, vol. 38, No. 11, Nov. 1991, pp. 2487-2496.

* cited by examiner

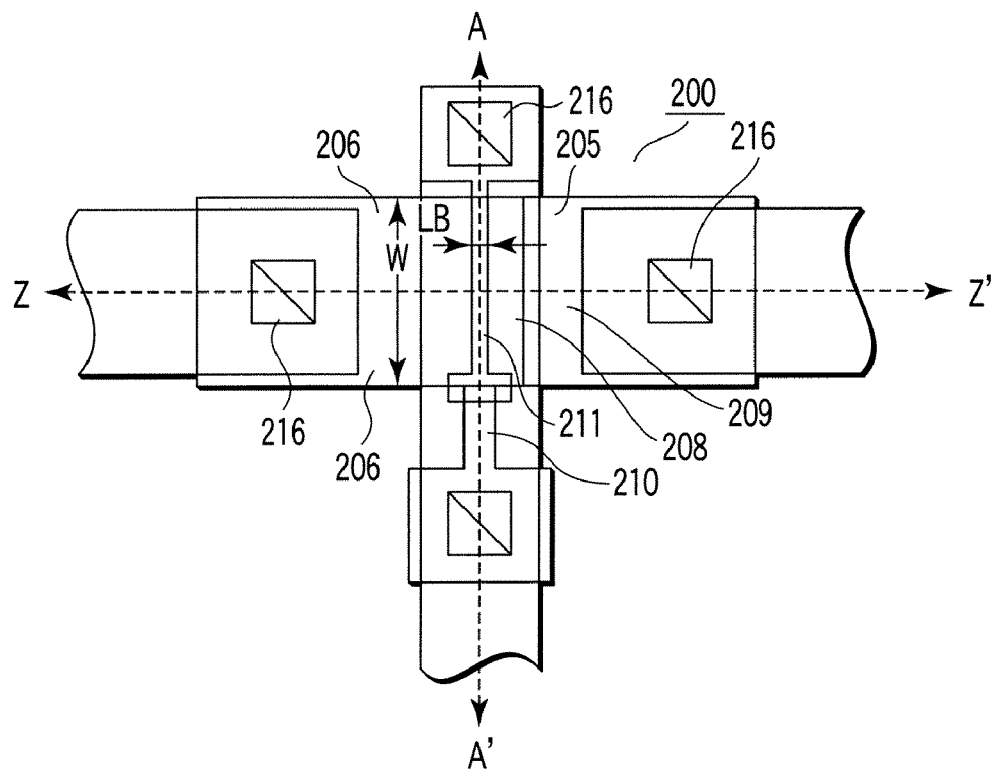
F I G. 6
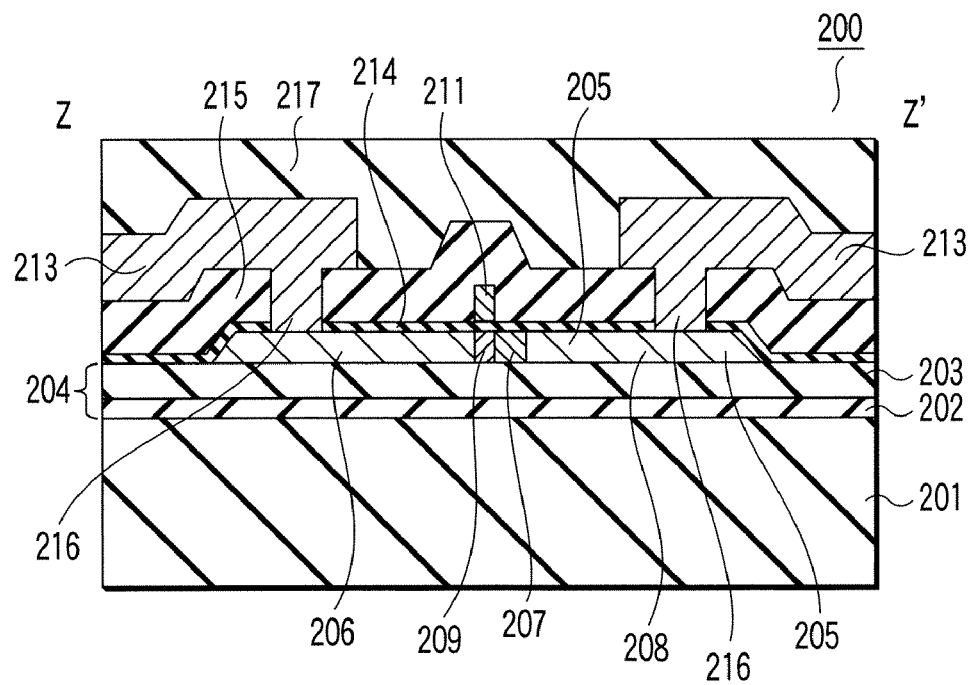
F I G. 7

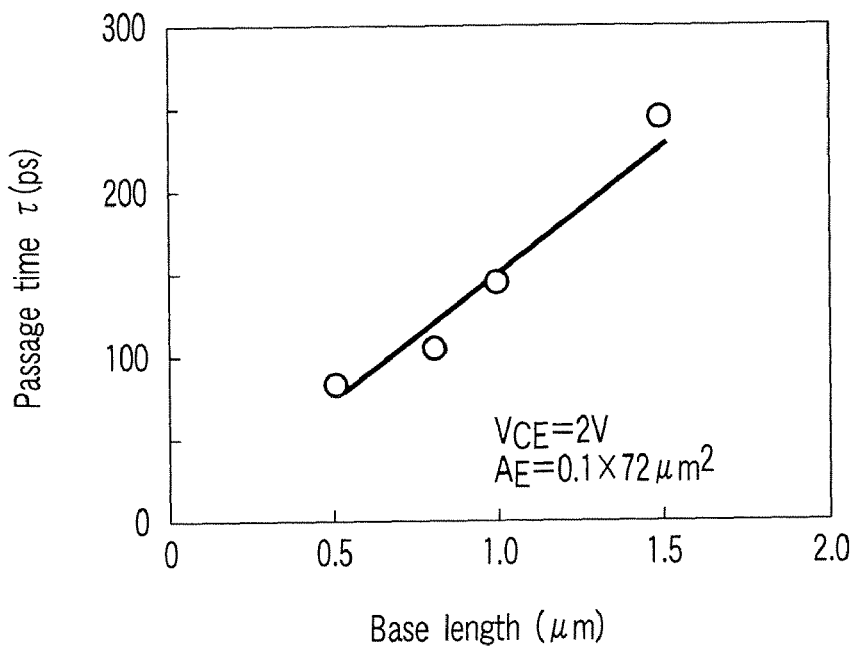
F I G. 13B
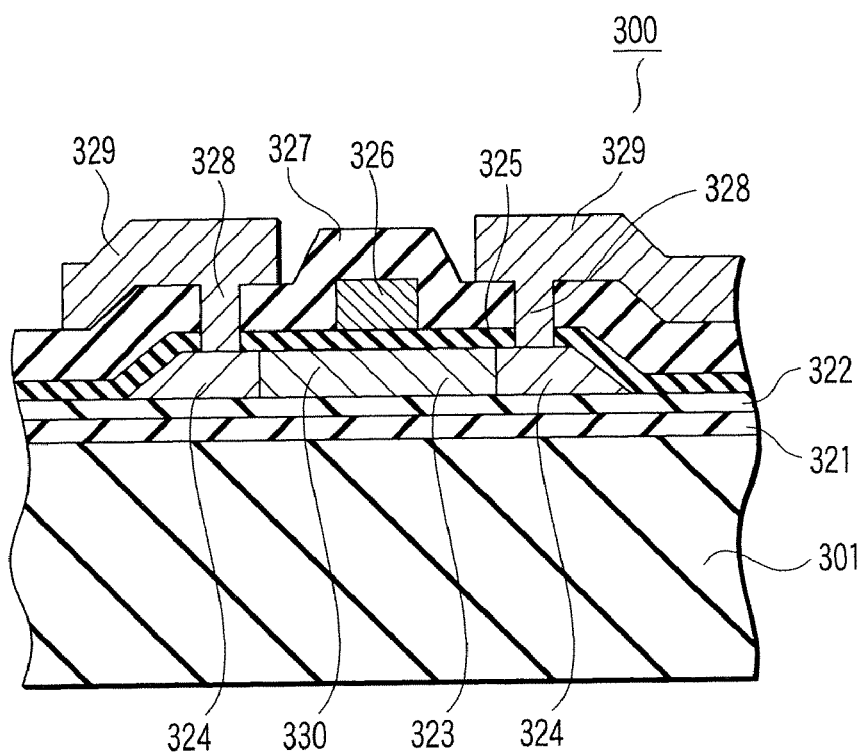
F I G. 14A

550e : Phase 0
550f : Phase $\pi/2$
550g : Phase $\pi$
550h : Phase $3\pi/2$

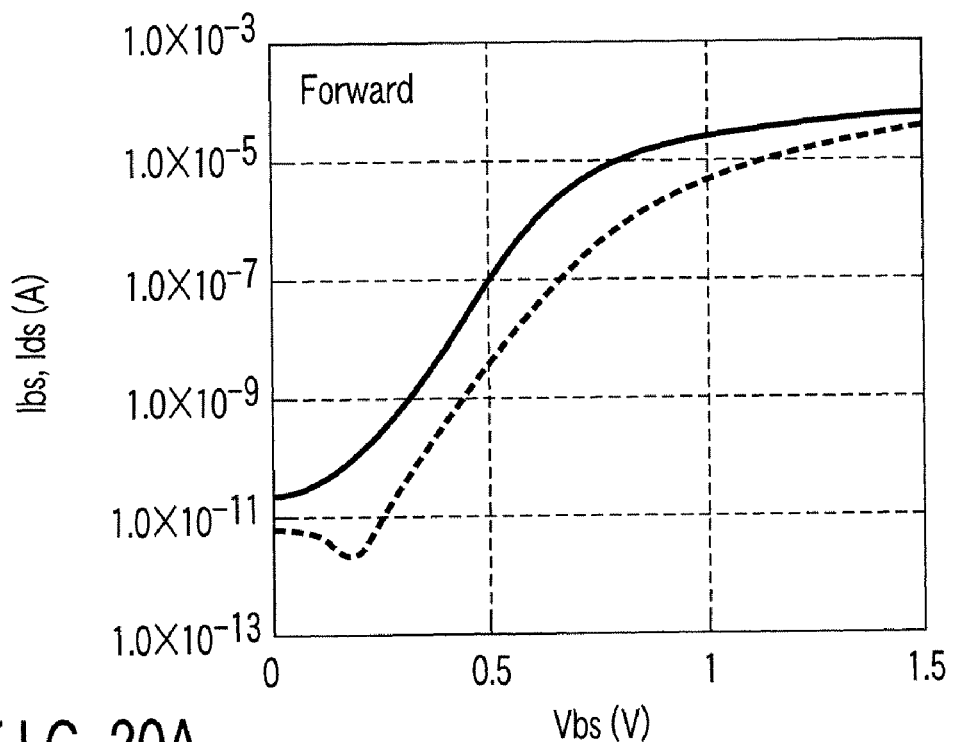
F I G. 20A
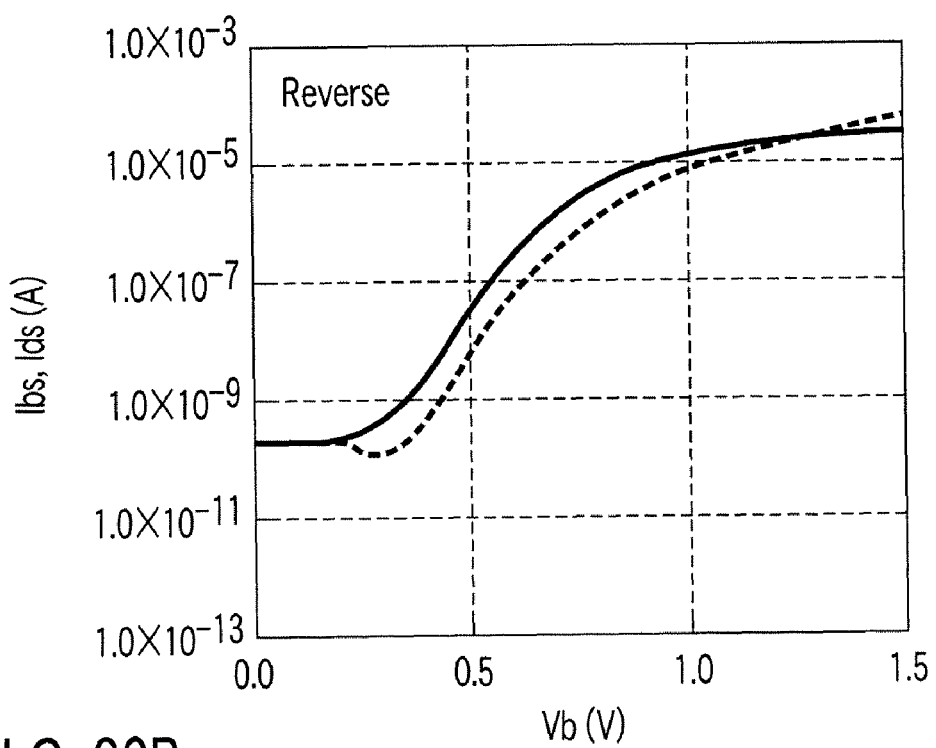
F I G. 20B

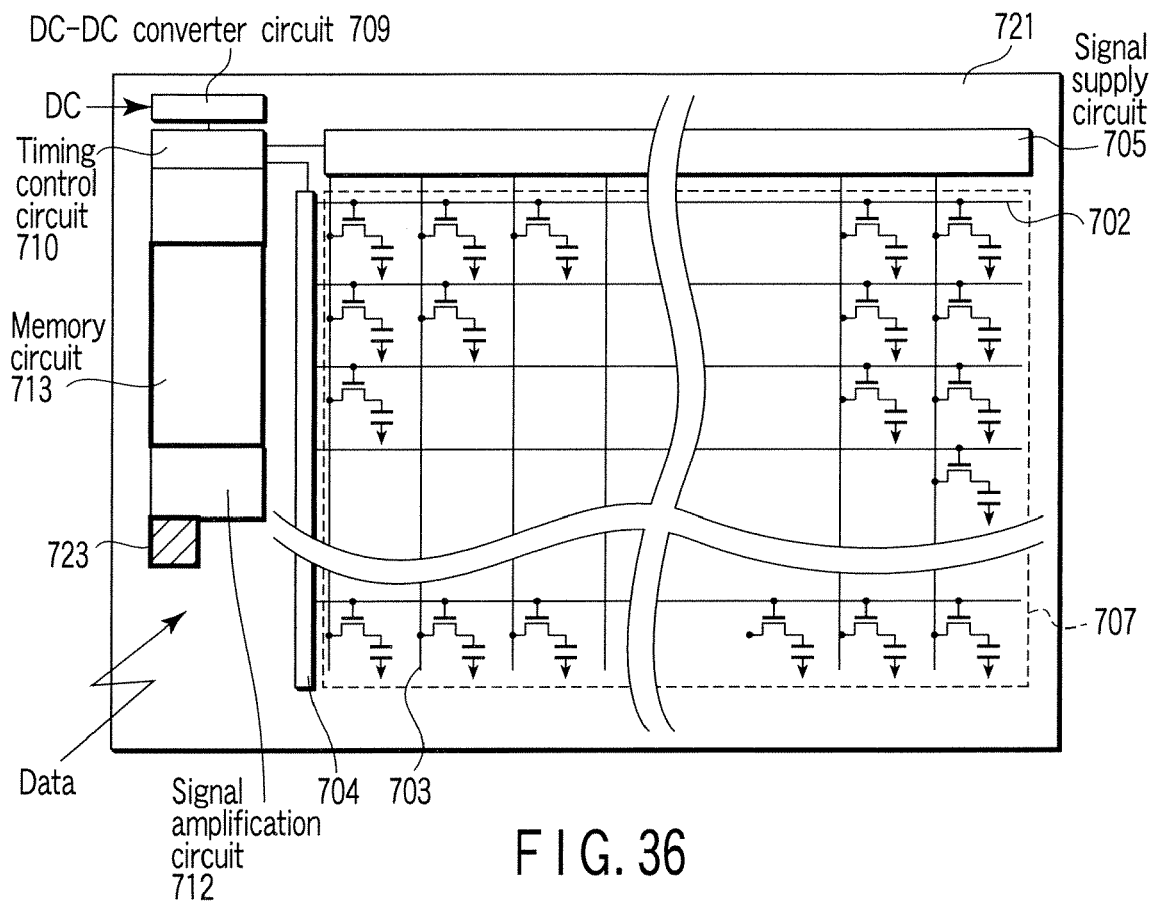
F I G. 36
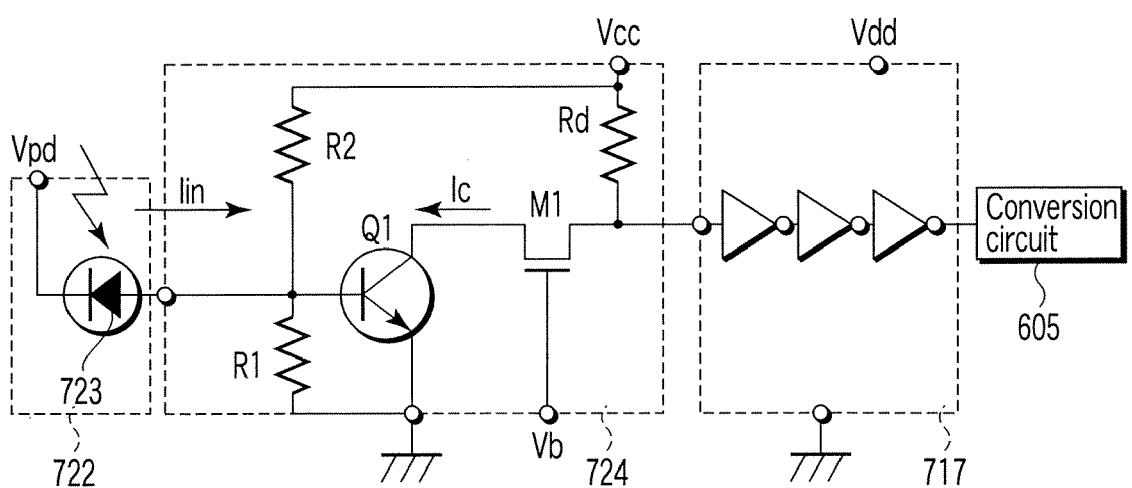
F I G. 37

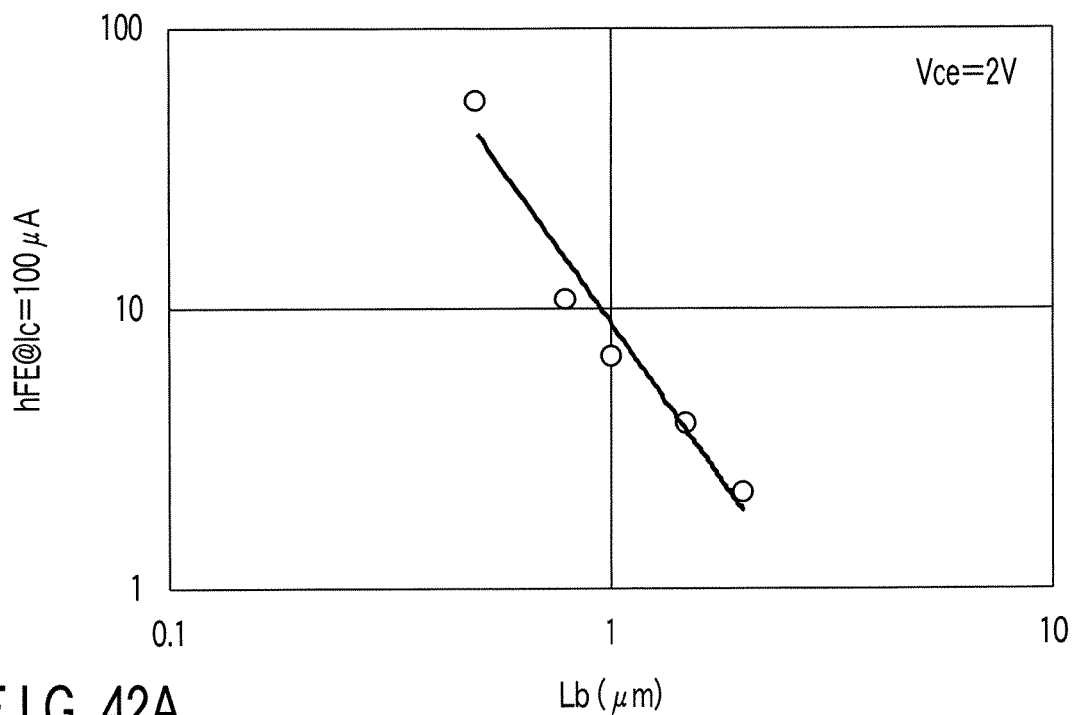
F I G. 42A
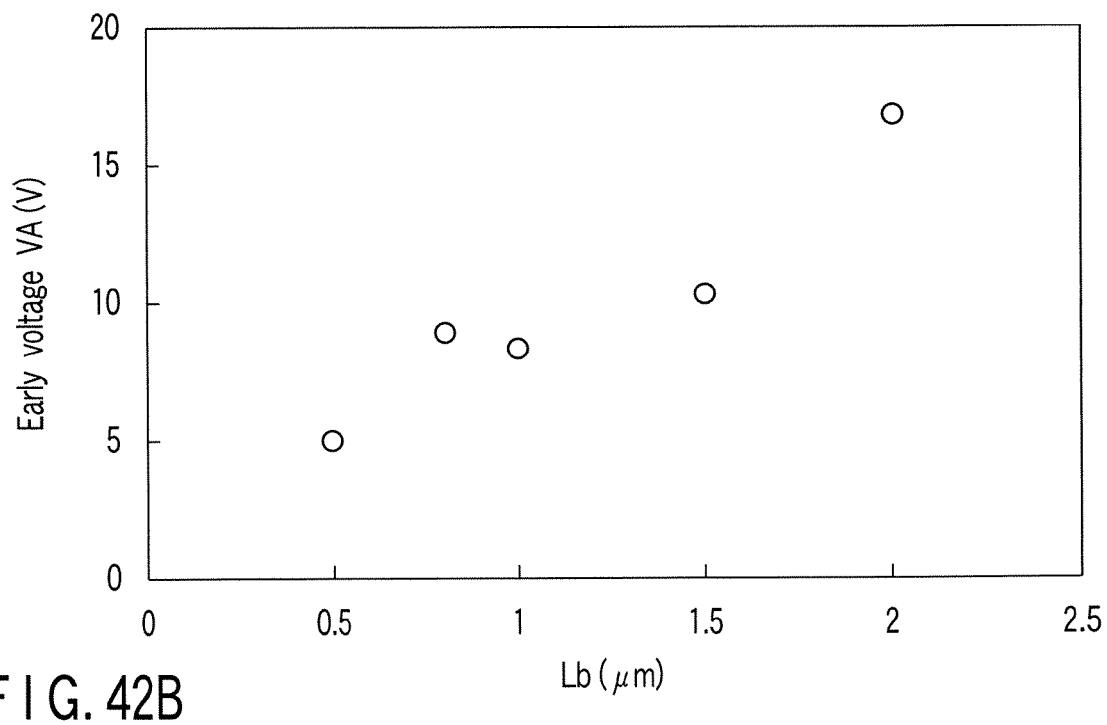
F I G. 42B

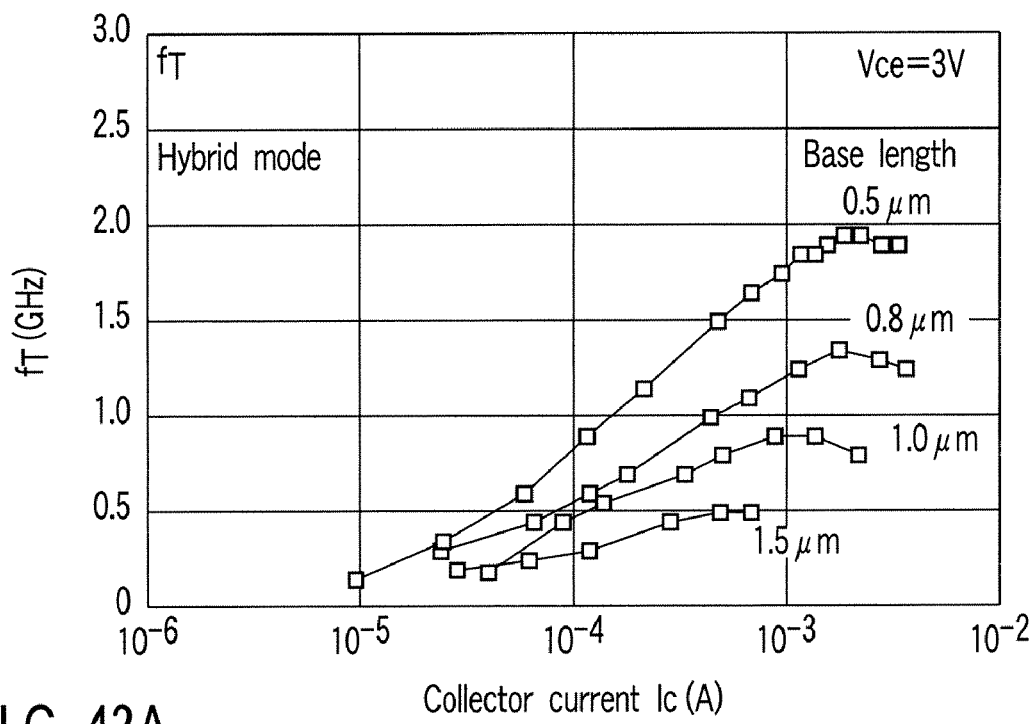
F I G. 43A
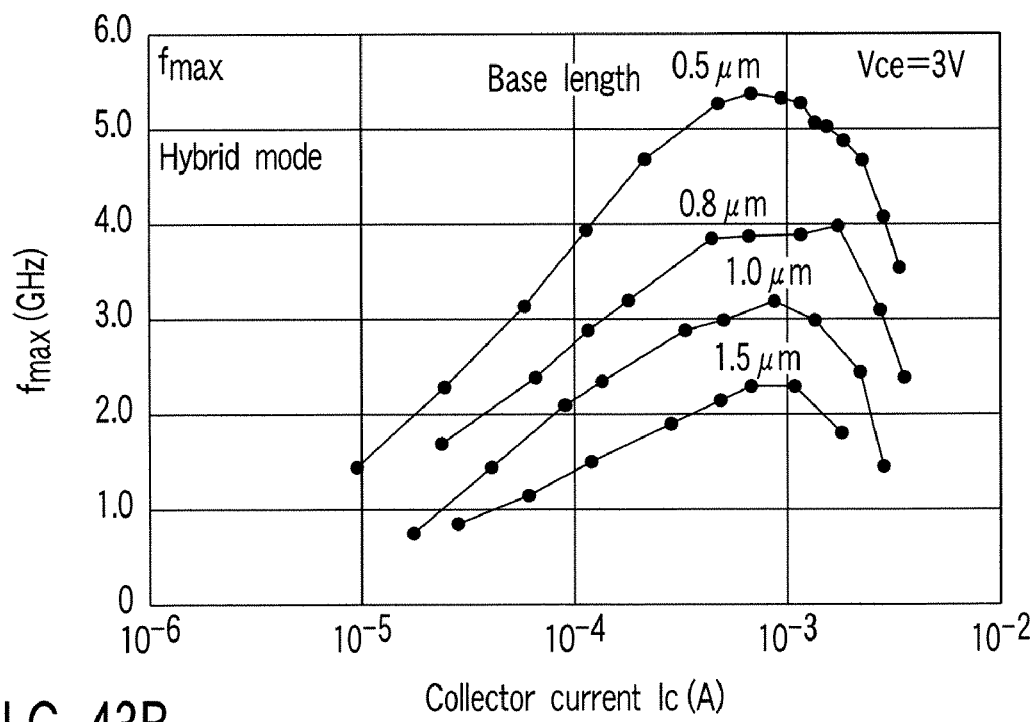
F I G. 43B

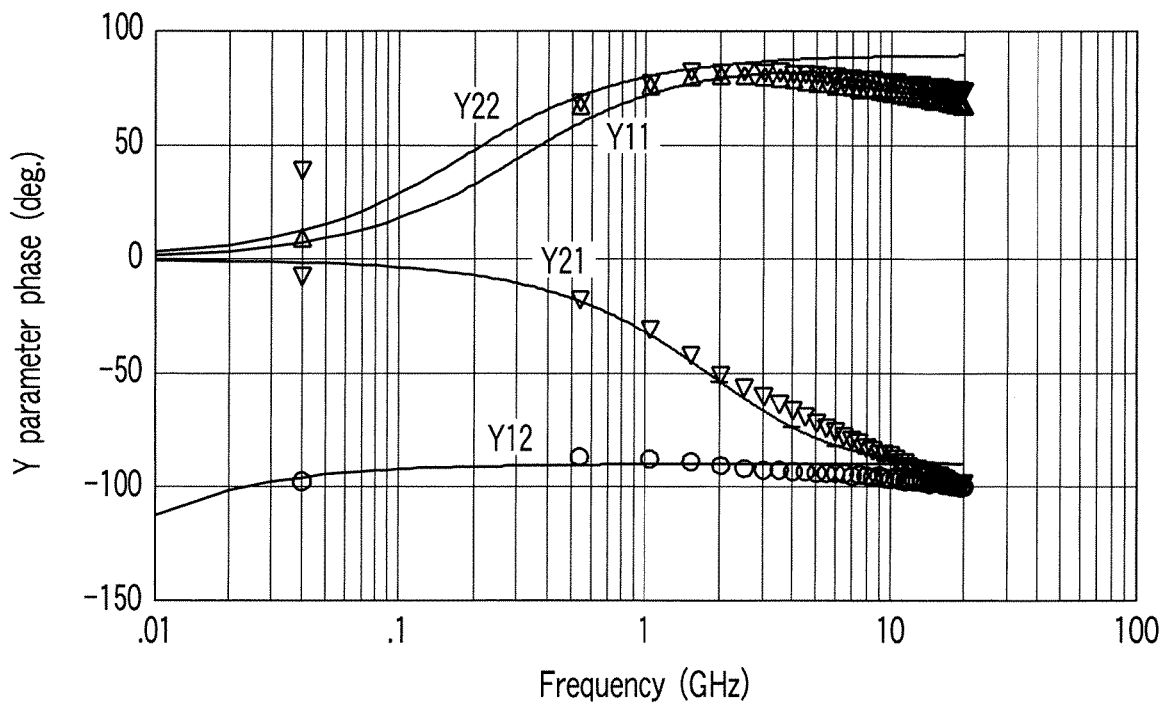
F I G. 44B
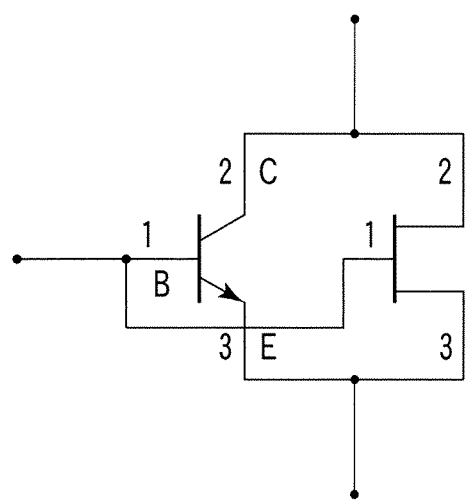
F I G. 44C

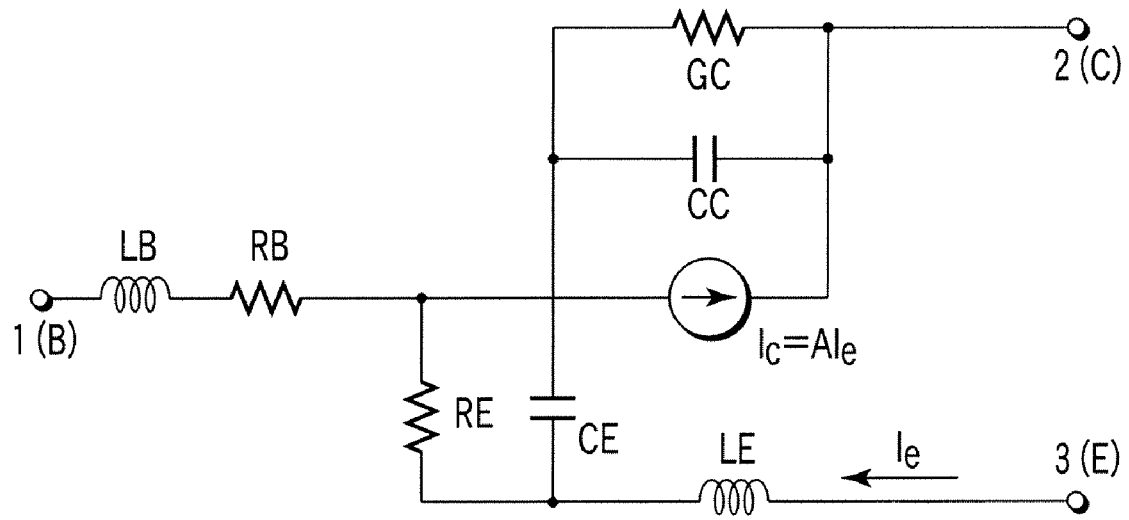
F I G. 44D
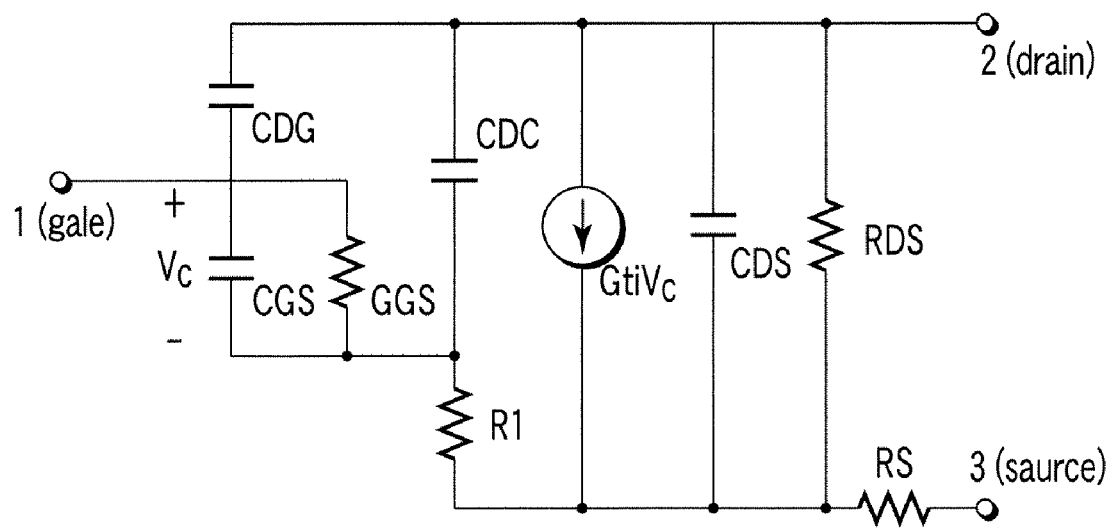
F I G. 44E

ELECTRONIC DEVICE, DISPLAY DEVICE, INTERFACE CIRCUIT AND DIFFERENTIAL AMPLIFICATION DEVICE, WHICH ARE CONSTITUTED BY USING THIN-FILM TRANSISTORS

CROSS-REFERENCE TO RELATED APPLICATIONS

This application is based upon and claims the benefit of priority from prior Japanese Patent Applications No. 2006-223310, filed Aug. 18, 2006; and No. 2007-197893, filed Jul. 30, 2007, the entire contents of both of which are incorporated herein by reference.

BACKGROUND OF THE INVENTION

1. Field of the Invention

The present invention relates to an electronic device, a display device, an interface circuit and a differential amplification device, which are constituted by using thin-film transistors that are formed on insulating substrates.

2. Description of the Related Art

As a display device of, e.g. OA equipment, which displays image information and character information, there is known an active-matrix flat-panel display which uses thin-film transistors (TFTs). In recent years, with the development of multi-media communication technology, attention has been paid to an integrated-function type display as a next-generation display, which is called a "system-on-panel" display. This integrated-function type display is designed for personal use, has a small size and light weight, and has a high resolution and a high image quality. Moreover, peripheral functions relating to image display, such as driver circuits, memory circuits, DA converters and image processing circuits, are integrated on a display panel. As an example of the integrated-function type display, Jpn. Pat. Appln. KOKAI Publication No. 2005-18088 discloses a liquid crystal display device having an input function using light from, e.g. a light pen, by providing photoelectric conversion elements in individual pixels.

If the resolution and the number of colors of a display image on a display device increase, the amount of data to be transmitted increases accordingly. However, since the refresh speed of image display is fixed, the clock frequency of a transmission path needs to be increased if the amount of data increases. In this way, if the frequency of the transmission path increases, such a problem arises that unwanted electromagnetic radiation occurs from the transmission path and noise is caused in an external device due to electromagnetic interference (EMI). To solve this problem, a method is adopted in which EMI is reduced by low-voltage differential driving, which is known as, e.g. LVDS (Low Voltage Differential Signaling). An example of this technique is disclosed in, e.g. Jpn. Pat. Appln. KOKAI Publication No. 2002-176350. In addition, in recent years, as a transmission scheme that is capable of more effectively reducing EMI, there has been proposed a serial interface by current driving. One example is disclosed in Jpn. Pat. Appln. KOKAI Publication No. 2003-76345.

Conventionally, MOS (Metal Oxide Semiconductor) transistors, which fall in a category of field-effect transistors, are mainly used as TFTs which are formed on a display glass substrate. The MOS transistors are widely used since the MOS transistors can advantageously constitute digital circuits such as display pixel switches and shift registers of displays.

Examples of patent documents are Jpn. Pat. Appln. KOKAI Publication No. 2005-18088, Jpn. Pat. Appln. KOKAI Publication No. 2002-176350, Jpn. Pat. Appln. KOKAI Publication No. 2003-76345 and Jpn. Pat. Appln. KOKAI Publication No. 10-32337.

Examples of technical documents are (1) B. Y. TSAUR, MEMBER, IEEE, D. J. SILVERSMITH, SENIOR MEMBER, IEEE, J. C. C. FAN, AND R. W. MOUNTAIN; "Fully Isolated Lateral Bipolar-MOS Transistors Fabricated in Zone-Melting-Recrystallized Si Films on SiO2", IEEE ELECTRON DEVICE LETTERS, VOL, EDL-4, NO. 8, pp. 269-271, AUGUST 1983; (2) JAMES C. STURM, MEMBER, IEEE, JAMES P. McVITTIE, MEMBER, IEEE, JAMES F. GIBBONS, FELLOW, IEEE AND L. PFIFFER, "A Lateral Silicon-on-Insulator Bipolar Transistor with a Self-Aligned Base Contact", 0741-3106/87/0300-0104$01.00 (c) 1987 IEEE; (3) Stephen Parke, Fariborz Assaderaghi Jian Chen, Joe King, Chenming Hu, and Ping K. Ko, "A Versatile, SOI BiCMOS Technology with Complementary Lateral BJT's", 0-7803-0817-4/92$3.00 (c) IEDM92 453-456 1992 IEEE; (4) T. Shino, K. Inoh, T. Yamada, H. Nii, S. Kawanaka, T. Fuse, M. Yoshimi, Y. Katsumata, S. Watanabe, and J. Matsunaga, "A 31 GHz $f_{max}$ Lateral BJT on SOI Using Self-Aligned External Base Formation Technology"; 0-7803-4774-9/98$10.00(c) IERM 98 953-956 1998 IEEE; (5) Richard McCartney, Jsmes Kozisek, Marshall Bell, "9.3: WhisperBus™: An Advanced Interconnect Link For TFT Column Driver Data", SID 01 DIGEST, pp. 1-4; (6) Jorgen Olsson, Bengt Edholm, Anders Soderbiirg, and Kjell Bohlin, "High Current Gain Hybrid Bipolar Operation of DMOS Transistors", IEEE TRANSACTIONS ON ELECTRON DEVICES, VOL. 42, NO. 9, SEPTEMBER, pp. 1628-1635, 1995; (7) Stephen A. Parke, Chenming Hu, and Ping K. KO, "Bipolar-FET Hybrid-Mode Operation of Quarter-Microm; and (8) Sophie Verdonckt-Vandebroek, S. Simon Wong, Jason C. S. Woo, and Ping K. KO, "High-Gain Lateral Bipolar Action in a MOSFET Structure," IEEE TRANSACTIONS ON ELECTRON DEVICES, VOL. 38, NO. 11, NOVEMBER, pp. 2487-2496, 1991.

BRIEF SUMMARY OF THE INVENTION

In the TFT circuit, as described above, when various functions are to be integrated, if there is a function of detecting and amplifying an electric current, the circuit structure can be simplified and the power consumption of the circuit can be reduced. However, in a common source type amplifying circuit which is composed of MOS transistors, an input impedance is high and the electric current cannot directly be amplified. In such a case, the electric current is received by providing a current buffer circuit having a common gate structure. In order to obtain a sufficient gain with the MOS transistor alone, however, the circuit structure becomes complex. Thus, there is the problem that a sufficient detection sensitivity is hardly obtained with a simple-structured circuit.

On the other hand, a bipolar transistor is known as a transistor driven by a current input. In the case of using a single-crystal Si or SOI (Silicon On Insulator) substrate, the BiCMOS (Bipolar Complementary Metal-Oxide Semiconductor) technology has already been established in which bipolar transistors and CMOS transistors are provided in the same substrate, and these transistors are selectively used, as needed.

In conventional techniques, however, it is difficult to implement such a structure on a low-heat-tolerance substrate such as a glass substrate. The reason for this is considered to be that a minimum device size, which is realized on a largesized glass substrate of, e.g. about 1 m, is about 3 microns at the most, the crystal quality of a Si thin film, which can be formed on a glass substrate at low temperatures, is poor, and the lifetime of minor carriers is short.

The object of the present invention is to solve the above-described problems, and to provide, in order to realize a display with more various functions, a display device in which a MOS thin-film transistor and a bipolar-type thin-film transistor, which is usable as a serial interface by current driving, are integrated at the same time on a glass substrate.

In order to achieve the above object, the present invention adopts the following means.

According to an aspect of the present invention, there is provided an electronic device including a plurality of semiconductor devices which are formed by using a semiconductor thin film and are formed in the semiconductor thin film that is provided on an insulating substrate and is crystallized in a predetermined direction, the plurality of semiconductor devices including: a MOS transistor; and at least either one of a lateral bipolar thin-film transistor and a MOS-bipolar hybrid thin-film transistor.

According to another aspect of the invention, there is provided a display device including a plurality of semiconductor devices which are formed by using a semiconductor thin film and are formed in the semiconductor thin film that is provided on an insulating substrate and is crystallized in a predetermined direction, wherein the display device includes a current mode signal input interface circuit having two current values, or two or more current values, and the current mode signal input interface circuit includes: a thin-film transistor which is at least either one of at least one lateral bipolar thin-film transistor and at least one hybrid thin-film transistor, which are formed by using the semiconductor thin film; and at least one MOS transistor which is formed by using the semiconductor thin film.

According to still another aspect of the invention, there is provided a display device including a plurality of semiconductor devices which are formed by using a semiconductor thin film and are formed in the semiconductor thin film that is provided on an insulating substrate and is crystallized in a predetermined direction, the display device including a voltage-differential-signal-type signal input interface circuit, wherein the voltage-differential-signal-type signal input interface circuit includes: a thin-film transistor which is at least either one of at least one lateral bipolar thin-film transistor and at least one hybrid thin-film transistor, which are formed by using the semiconductor thin film; and at least one MOS transistor which is formed by using the semiconductor thin film.

According to still another aspect of the invention, there is provided a display device including a plurality of semiconductor devices which are formed by using a semiconductor thin film and are formed in the semiconductor thin film that is provided on an insulating substrate and is crystallized in a predetermined direction, the display device including a signal input interface circuit of a non-contact electromagnetic coupling transmission scheme, wherein the signal input interface circuit of the non-contact electromagnetic coupling transmission scheme includes: a thin-film transistor which is at least either one of at least one lateral bipolar thin-film transistor and at least one hybrid thin-film transistor, which are formed by using the semiconductor thin film; and at least one MOS transistor which is formed by using the semiconductor thin film.

According to still another aspect of the invention, there is provided a display device including a plurality of semiconductor devices which are formed by using a semiconductor thin film and are formed in the semiconductor thin film that is provided on an insulating substrate and is crystallized in a predetermined direction, the display device including a signal input interface circuit of a non-contact optical transmission scheme, wherein the signal input interface circuit of the non-contact optical transmission scheme includes: at least one photoelectric conversion element; a thin-film transistor which is at least either one of at least one lateral bipolar thin-film transistor and at least one hybrid thin-film transistor, which are formed by using the semiconductor thin film; and at least one MOS transistor which is formed by using the semiconductor thin film.

According to still another aspect of the invention, there is provided a display device including a plurality of semiconductor devices which are formed by using a semiconductor thin film and are formed in the semiconductor thin film that is provided on an insulating substrate and is crystallized in a predetermined direction, the display device including a memory circuit which includes a plurality of memory cell units, a level shift circuit unit and a sense amplifier unit, wherein the sense amplifier unit includes: a thin-film transistor which is at least either one of at least one lateral bipolar thin-film transistor and at least one hybrid thin-film transistor, which are formed by using the semiconductor thin film; and at least one MOS transistor which is formed by using the semiconductor thin film.

According to still another aspect of the invention, there is provided a display device including a plurality of semiconductor devices which are formed by using a semiconductor thin film and are formed in the semiconductor thin film that is provided on an insulating substrate and is crystallized in a predetermined direction, the display device including one of a DC-DC converter circuit, a timing control circuit, a signal amplification circuit, an expansion circuit for expanding compressed data and a memory circuit which stores image data, each of the circuits includes: a MOS thin-film transistor; and at least one of a lateral bipolar thin-film transistor and a MOS-bipolar hybrid thin-film transistor.

In the display device including a plurality of semiconductor devices which are formed by using a semiconductor thin film and are formed in the semiconductor thin film that is provided on an insulating substrate and is crystallized in a predetermined direction, a signal input circuit includes: a current amplification unit which employs a thin-film transistor which is at least either one of a lateral bipolar thin-film transistor and a hybrid thin-film transistor, which are formed by using the semiconductor thin film; and a voltage amplification unit which is connected to the current amplification unit and employs a MOS transistor which is formed by using the semiconductor thin film.

In the display device including a plurality of semiconductor devices which are formed by using a semiconductor thin film and are formed in the semiconductor thin film that is provided on an insulating substrate and is crystallized in a predetermined direction, a signal input circuit includes a cascode-connected differential amplification circuit which is configured such that a set of a load transistor and two lateral bipolar thin-film transistors or two hybrid thin-film transistors, which are successively connected in series, and another set of a load transistor and two lateral bipolar thin-film transistors or two hybrid thin-film transistors, which are successively connected in series, are connected in parallel, and one of the parallel-connected sets is connected to a power supply and the other of the parallel-connected sets is grounded via a MOSFET which functions as a constant current source.

In the display device, a minimum value of a base length of the lateral bipolar thin-film transistor or the hybrid thin-film transistor is 2 μm or less.

In the display device, a minimum value of a base width of the lateral bipolar thin-film transistor or the MOS-bipolar hybrid thin-film transistor is 2 μm or less, and a minimum value of a gate length of the MOS transistor is 1 μm or less.

In the display device, a maximum value of a current amplification factor of the lateral bipolar thin-film transistor or the MOS-bipolar hybrid thin-film transistor is 10 or more.

In the display device, a maximum value of a current amplification factor of the lateral bipolar thin-film transistor or the MOS-bipolar hybrid thin-film transistor is 10 or more, and a maximum value of field-effect mobility of the MOS transistor is 350 cm$^2$/Vs or more.

In the electronic device or the display device, the predetermined direction is a lateral direction in which a non-single crystal semiconductor thin film is crystallized.

According to still another aspect of the invention, there is provided an interface circuit comprising: a semiconductor thin film provided on an insulating substrate; a crystallized region provided in the semiconductor thin film; a thin-film transistor which at least either one of a lateral bipolar thin-film transistor and a hybrid thin-film transistor, which are provided in the crystallized region; and a MOS thin-film transistor which is provided in the crystallized region and is connected to the thin-film transistor.

According to still another aspect of the invention, there is provided an electronic device including a plurality of semiconductor devices which are formed by using a semiconductor thin film and are formed in the semiconductor thin film that is provided on an insulating substrate and is crystallized in a predetermined direction, wherein the plurality of semiconductor devices include a MOS transistor, and at least either one of a lateral bipolar thin-film transistor and a MOS-bipolar hybrid thin film transistor, and the lateral bipolar thin-film transistor or the MOS-bipolar hybrid thin film transistor has a function of detecting a small current and converting the small current to a current or a voltage.

According to still another aspect of the invention, there is provided a display device including a plurality of semiconductor devices which are formed by using a semiconductor thin film and are formed in the semiconductor thin film that is provided on an insulating substrate and is crystallized in a predetermined direction, wherein the display device includes a differential-input-type signal interface circuit, and the differential-input-type signal interface circuit includes either one of at least one pair of lateral bipolar thin-film transistors and at least one pair of hybrid thin-film transistors, which are formed by using the semiconductor thin film, and at least one pair of MOS transistors which are formed by using the semiconductor thin film.

According to still another aspect of the invention, there is provided a display device including a plurality of semiconductor devices which are formed by using a semiconductor thin film and are formed in the semiconductor thin film that is provided on an insulating substrate and is crystallized in a predetermined direction, wherein a signal input circuit is a differential amplification circuit, which includes: a current-mirror-type current source composed of a pair of P-type MOS transistors; a pair of hybrid thin-film transistors which are connected, respectively, to drain terminals of the pair of P-type MOS transistors which constitute the current source; and an N-type MOS transistor which is connected to a common source terminal of the pair of the hybrid thin-film transistors and operates as a constant current source.

In the display device, a maximum oscillation frequency of the hybrid thin-film transistor is higher than 2 GHz.

According to still another aspect of the invention, there is provided a differential amplification device including a plurality of semiconductor devices which are formed by using a semiconductor thin film and are formed in the semiconductor thin film that is provided on an insulating substrate and is crystallized in a predetermined direction, the differential amplification device including a differential-input-type signal interface circuit, wherein the differential-input-type signal interface circuit includes: either one of at least one pair of lateral bipolar thin-film transistors and at least one pair of hybrid thin-film transistors, which are formed by using the semiconductor thin film; and at least one pair of MOS transistors which are formed by using the semiconductor thin film.

According to still another aspect of the invention, there is provided a differential amplification device including a plurality of semiconductor devices which are formed by using a semiconductor thin film and are formed in the semiconductor thin film that is provided on an insulating substrate and is crystallized in a predetermined direction, wherein a signal input circuit is a differential amplification circuit which includes: a current-mirror-type current source composed of a pair of P-type MOS transistors; a pair of hybrid thin-film transistors which are connected, respectively, to drain terminals of the pair of P-type MOS transistors which constitute the current source; and an N-type MOS transistor which is connected to a common source terminal of the pair of the hybrid thin-film transistors and operates as a constant current source.

As has been described above, the present invention can provide an electronic device which includes at least one of a lateral bipolar thin-film transistor and a MOS-bipolar hybrid thin-film transistor, and a MOS transistor, and is capable of directly amplifying an input current.

BRIEF DESCRIPTION OF THE SEVERAL VIEWS OF THE DRAWING

FIG. 6 is a plan view of a MOS-bipolar hybrid transistor according to the first embodiment of the invention;

FIG. 7 is a cross-sectional view, taken along line Z-Z' in FIG. 6, showing the MOS-bipolar hybrid transistor according to the first embodiment of the invention;

FIG. 13B is a graph showing an inherent carrier passage time, relative to a base length, in a thin-film transistor according to a second embodiment of the invention;

FIG. 14A is a cross-sectional view of a MOS thin-film transistor which can be formed together with a lateral bipolar thin-film transistor or a MOS-bipolar hybrid transistor according to the present invention;

FIG. 20A is a graph showing Gummel plots of the bipolar thin-film transistor (forward-arrangement) shown in FIG. 19 according to the invention;

FIG. 20B is a graph showing Gummel plots of the bipolar thin-film transistor (reverse-arrangement) shown in FIG. 19 according to the invention;

FIG. 36 shows the entire structure of a liquid crystal display device according to an eighth embodiment of the invention;

FIG. 37 shows the structure of a signal interface circuit in the eighth embodiment of the invention;

FIG. 42A is a graph showing the base length dependency of hFE at a time when the collector current, which is found from the characteristic diagram of FIG. 41B, is 0.1 mA;

FIG. 42B is a graph showing the base length dependency of an early voltage (VA);

FIG. 43A is a graph showing the collector current dependency of a cutoff frequency ($f_T$) of hybrid TFTs having different base lengths;

FIG. 43B is a graph showing the collector current dependency of a maximum oscillation frequency (fmax) of hybrid TFTs having different base lengths;

FIG. 44B is a graph in which an S parameter measurement value of a hybrid TFT with a base length of 0.5 μm is converted to a Y parameter and is plotted in relation to a frequency, the ordinate indicating a phase of the Y parameter;

FIG. 44C shows a device model in which a bipolar transistor and a MOS transistor are connected in parallel;

FIG. 44D shows an equivalent circuit of the bipolar transistor shown in FIG. 44C;

FIG. 44E shows an equivalent circuit of the MOS transistor shown in FIG. 44C;

DETAILED DESCRIPTION OF THE INVENTION

Embodiments of the present invention will now be described with reference to the accompanying drawings.

First Embodiment

This embodiment relates to an electronic device including a plurality of semiconductor devices which are formed in a semiconductor thin film that is provided on an insulating substrate. Specifically, a description is given of a lateral bipolar thin-film transistor in the electronic device which includes a MOS thin-film transistor, and at least the lateral bipolar thin-film transistor or a MOS-bipolar hybrid thin-film transistor, which is formed in the semiconductor thin film that is crystallized in a predetermined direction.

The above-mentioned MOS thin-film transistor, and the lateral bipolar thin-film transistor or the MOS-bipolar hybrid thin-film transistor are formed on the same insulating substrate. There is a feature that no crystal grain boundary is present in at least a base region or a channel region of the lateral bipolar thin-film transistor or the MOS-bipolar hybrid thin-film transistor, and the base region or channel region is a single-crystal region. An amorphous semiconductor thin film, a polycrystalline semiconductor thin film or a single-crystal semiconductor thin film, for instance, is selectively used for the channel region of the MOS thin-film transistor, depending on the use of the device for a large-current circuit, a small-current circuit, etc.

(1-1) Lateral Bipolar Thin-Film Transistor

Figure 1A:
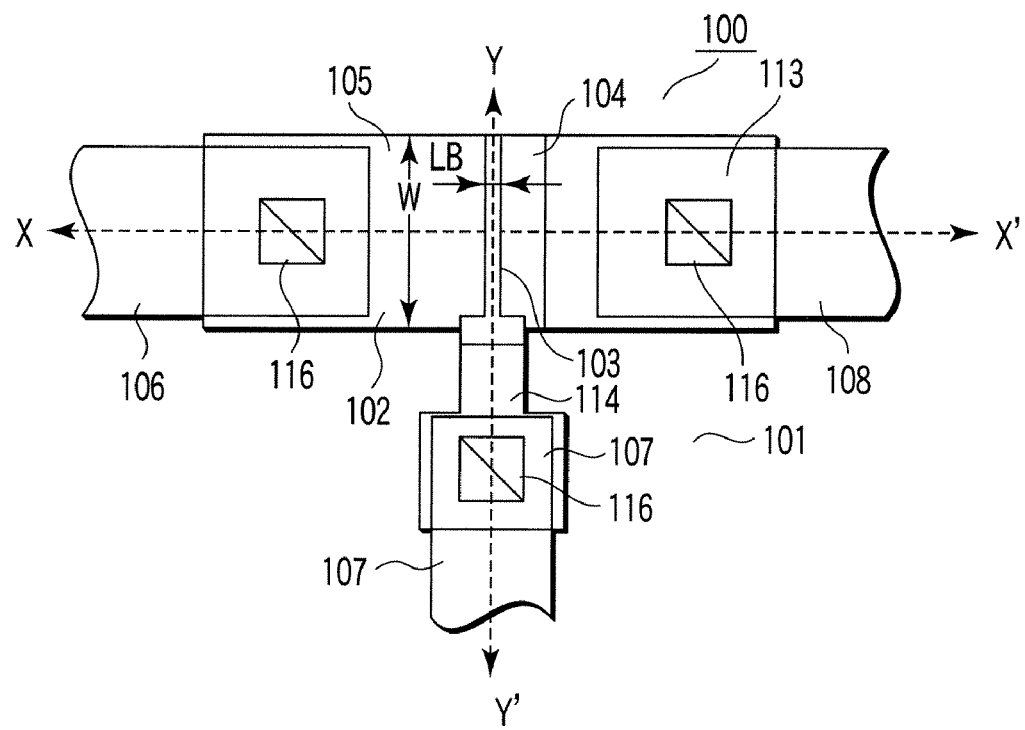
FIG. 1A is a plan view of a lateral bipolar thin-film transistor according to a first embodiment of the present invention.
Figure 1B:
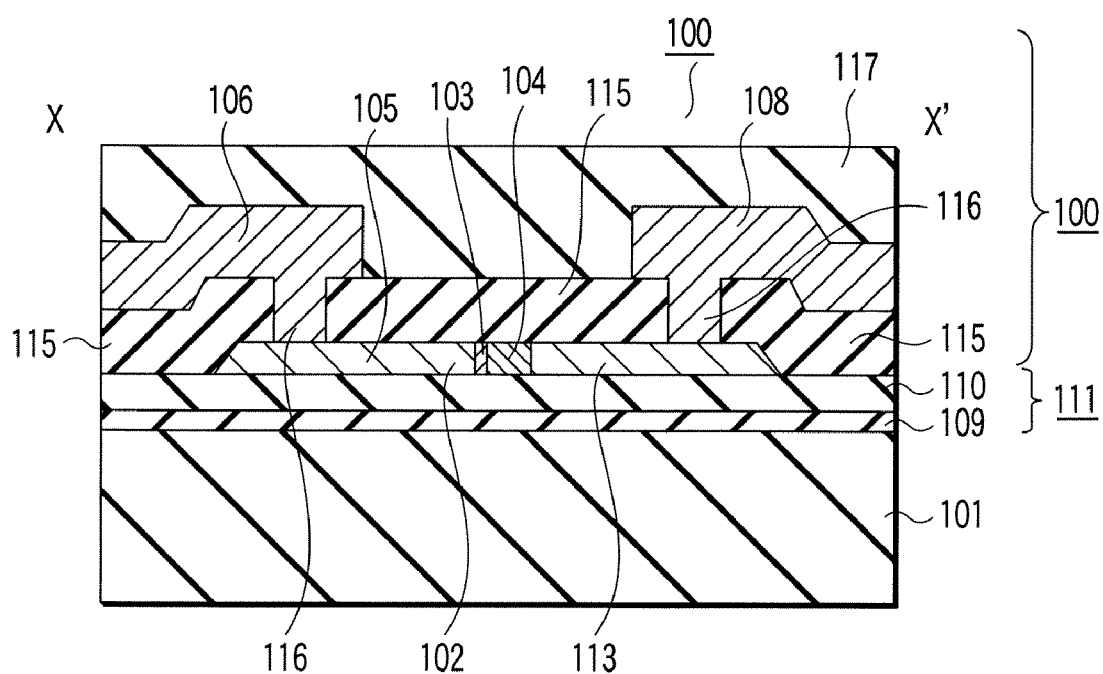
FIG. 1B is a cross-sectional view, taken along line X-X' in FIG. 1, showing the lateral bipolar thin-film transistor according to the first embodiment of the invention.

FIG. 1A is a plan view of a lateral bipolar thin-film transistor 100, which is formed on a no-alkali glass substrate 101. FIG. 1B is a cross-sectional view taken along line X-X' in FIG. 1A. FIG. 3 is a cross-sectional view taken along line Y-Y' in FIG. 1A.

Figure 1C:
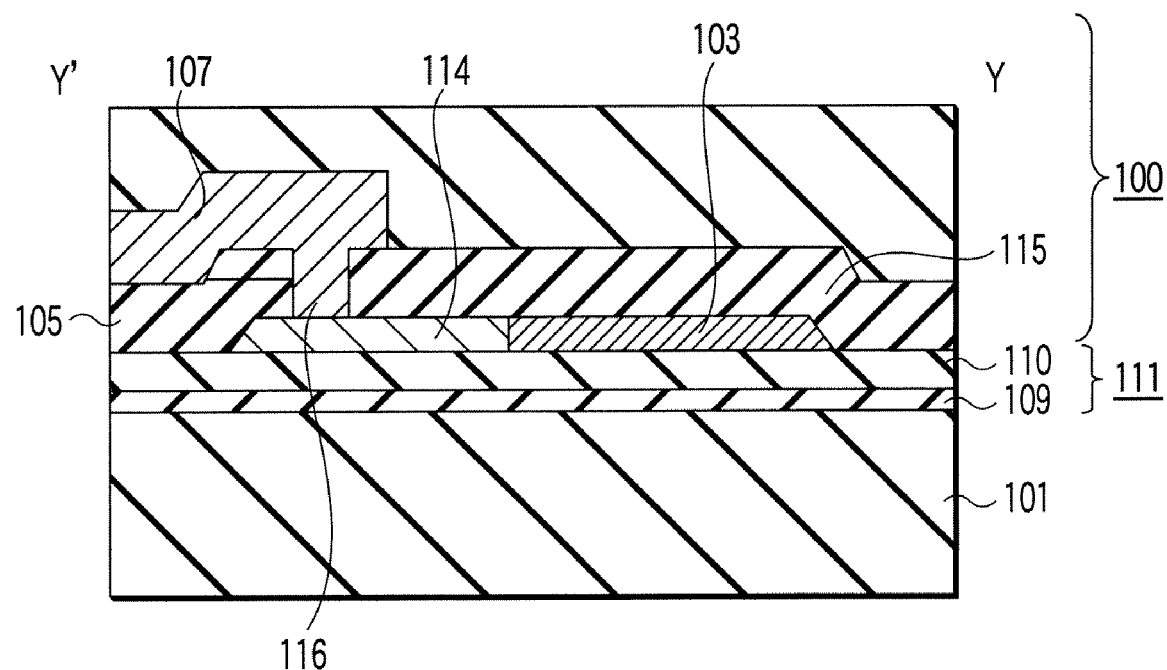
FIG. 1C is a cross-sectional view, taken along line Y-Y' in FIG. 1, showing the lateral bipolar thin-film transistor according to the first embodiment of the invention.

FIG. 1A to FIG. 1C show an emitter 102, a base 103 and a collector 104 which are formed in a crystallized semiconductor thin film 105. The semiconductor thin film 105 is crystallized in a predetermined direction. The semiconductor thin film 105 crystallized in the predetermined direction is a crystal region which is crystallized in a lateral direction (horizontal direction) by irradiating a semiconductor thin film with a pulse laser beam having, e.g. a light intensity distribution with an inverted peak pattern. The semiconductor thin film 105 crystallized in the predetermined direction can be formed by a crystallizing method which will be described later in detail. The region to be crystallized does not need to be the entire semiconductor thin film, and it may be a predetermined region where the device is to be formed. An emitter electrode 106, a base electrode 107 and a collector electrode 108 are formed on the semiconductor thin film 105.

As shown in FIG. 1B and FIG. 1C, the entirety of the bipolar thin-film transistor 100 is formed on a buffer insulation film 111. The buffer insulation film 111 comprises an SiNx film 109 with a thickness of, e.g. 50 nm and an $SiO_2$ film 110 with a thickness of, e.g. 100 nm, which are formed on the no-alkali glass substrate 101. The buffer insulation film 111 functions to prevent diffusion of impurities from the glass substrate 101. The structure of the buffer insulation film 111 is not limited to this example. For instance, the buffer insulation film 111 may be formed of an $SiO_2$ film alone, or an SiNx film alone. The substrate that is usable is a substrate with low heat resistance, and is not limited to the no-alkali glass substrate. For example, a quartz substrate, a plastic substrate, a silicon substrate having an $SiO_2$ film on its surface, or a stacked substrate of a metal or semiconductor substrate and an insulating substrate may be used.

Figure 2:
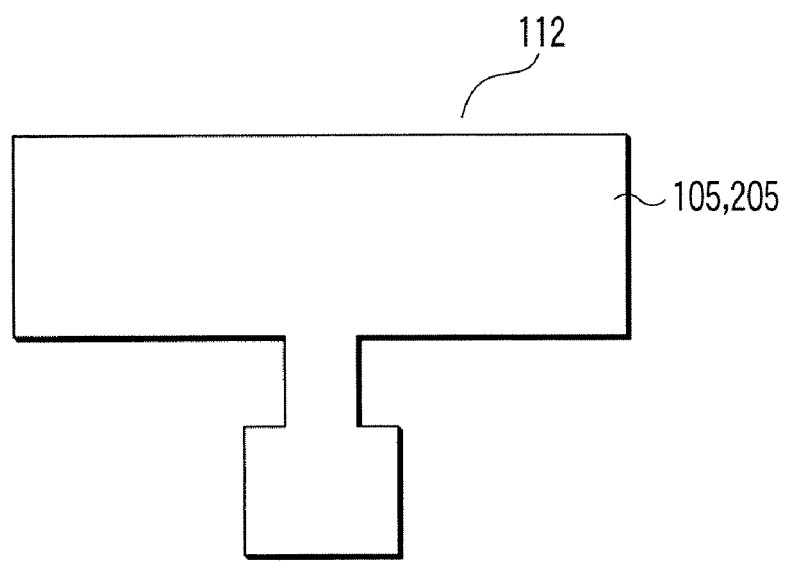
FIG. 2 shows a pattern of a semiconductor thin film in the first embodiment of the invention.

As shown in FIG. 1, a semiconductor thin film with a thickness of, e.g. 200 nm is formed on the $SiO_2$ film 110 in order to form the transistor 100. This semiconductor thin film is a crystallized semiconductor thin film, as shown in FIG. 2, which has, e.g. a substantially T-shaped plan-view shape. This crystallized semiconductor thin film is a substantially T-shaped insular-region pattern 112, which is formed of the Si thin film 105 that is crystallized in a predetermined direction, for example, in the lateral direction. The semiconductor material is not limited to Si, and other materials, such as Ge and GaAs, are usable. In addition, the film thickness is not limited to 200 nm, and may be set in a range of 30 nm to 360 nm, within which crystallization can be effected. The crystallized Si film may be an entirely crystallized Si film formed on the buffer insulation film 111, or may be an Si film in which only the transistor formation region is crystallized.

The emitter region 102 which is doped with $N^+$ impurities, the collector region 104 which is doped with $N^-$ impurities, a collector contact portion 113 which is doped with $N^+$ impurities, the base region 103 which is doped with $P^-$ impurities, and a base contact portion 114 which is doped with $P^+$ impurities are formed in the crystallized Si thin film 105.

Electrode wiring lines (106, 107, 108), which are formed of three-layer metal films of, e.g. Ti/Al/Ti, are connected to the upper surface of the Si film 105 via contact through-holes 116 which are formed in a first interlayer insulation film 115 that is formed of, e.g. an $SiO_2$ film. A second interlayer insulation film 117, which is formed of, e.g. an $SiO_2$ film, is formed so as to cover the entirety of the above-described parts.

The width W of the base region 103 is 5 μm and the length (equal to the distance between the emitter and collector) LB is 1.0 μm in the present embodiment. The emitter 102 is doped with impurities, e.g. phosphorus at a concentration of $1 \times 10^{20}$ ($cm^{-3}$). In this embodiment, the base region 103 is doped with impurities, e.g. boron at a concentration of $1 \times 10^{16}$ ($cm^{-3}$), and the base contact portion 114 is doped with impurities, e.g. boron at a concentration of $1 \times 10^{20}$ ($cm^{-3}$). The collector region 104 is doped with impurities, e.g. phosphorus at a concentration of $1 \times 10^{17}$ ($cm^{-3}$), and the collector contact portion 113 is doped with impurities, e.g. phosphorus at a concentration of $1 \times 10^{20}$ ($cm^{-3}$). These selective doping processes can be carried out by using ion implantation techniques in ordinary semiconductor fabrication technologies. The dopants are not limited to the above-mentioned materials. The structure of this thin-film transistor is the structure of an NPN-type lateral bipolar thin-film transistor device 100 in which an electric current is caused to flow not in a film thickness direction of the Si thin film but in a horizontal direction, thereby to enable simultaneous formation with a MOS transistor. The base contact portion 114 is led out from a side portion of the base region 103. The first embodiment is not limited to the NPN-type lateral bipolar thin-film transistor device 100, and it may be a PNP-type lateral bipolar thin-film transistor device.

The operation of the transistor 100 is the same as that of an ordinary bipolar transistor. An emitter-collector current is controlled by flowing a base current between the base region 103 and emitter region 102 while applying a positive voltage to the collector region 104.

In the lateral bipolar thin-film transistor 100, the most important parameters which determine the current amplification factor hFE are the crystal quality of the Si thin film 105 and the base length LB. Preferably, a minimum value of the base length should be 2 μm or less. An adequate quality of the Si thin film 105 can be obtained by using a crystal film with a length of several μ or more by adopting a lateral crystal growth method using a laser, as will be described later. In this case, it is desirable that the direction of movement of carriers in the lateral bipolar thin-film transistor 100 be the same as the direction of crystallization of the semiconductor thin film. The reason is that moving carriers hardly cross crystal grain boundaries. In addition, it was found that since the length of diffusion of injected minor carriers does not exceed 2 μm, it is important that the base length LB be set, at most, at 2 μm or less, and preferably at 1 μm or less, in order to secure a high hFE. As regards the polycrystalline silicon TFT that is used in the conventional display, the lifetime of holes is short and the formation of the base with the length of 1 μm or less is difficult due to restrictions of lithography. It is thus difficult to obtain a high hFE.

In the structure in which the contact is led out from the side portion as shown in FIG. 1A, the design of the width W of the transistor is important. The bipolar operation takes place only in the region where holes injected from the base region 103 are present. The density of holes decreases in a direction away from the base contact that is provided on the side surface of the base region 103. The degree of decrease is determined by the distance of diffusion of holes in the Si film. According to the inventors' simulation experiments, it was found that the density of holes remarkably decreases at a distance of 5 μm or more from the side-surface portion and a collector current hardly flows. It is thus desirable to set the width W of the base region 103 at about 5 μm or less, preferably 3 μm or less.

Figure 3A:
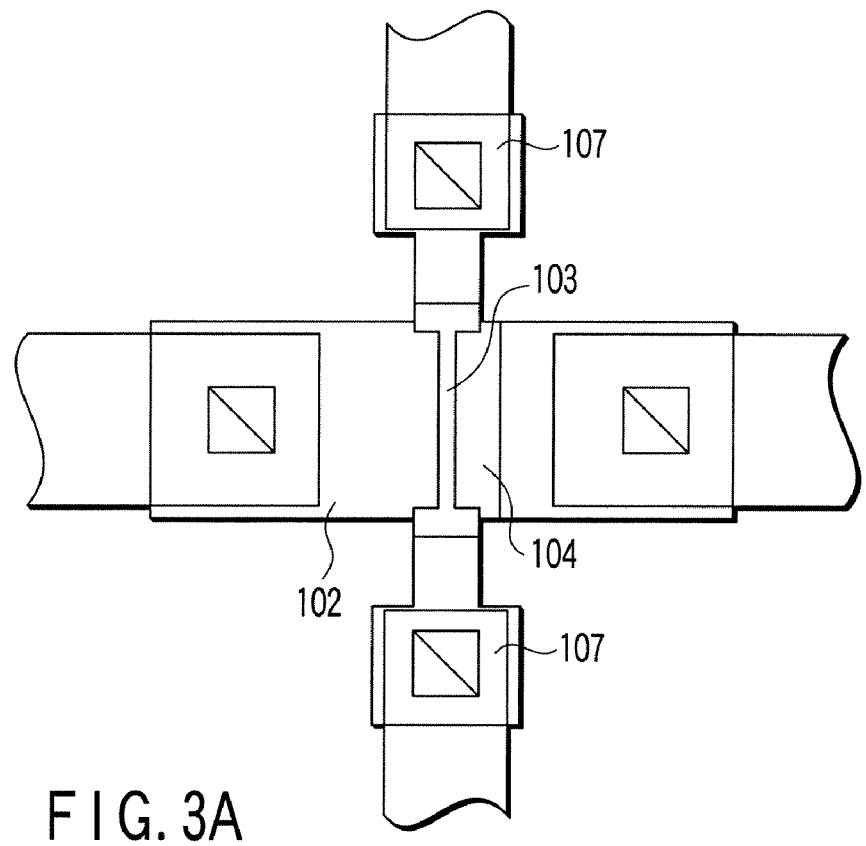
FIG. 3A is a plan view of a thin-film transistor in which a base electrode is led out of both sides of a base layer in the first embodiment of the invention.
Figure 3B:
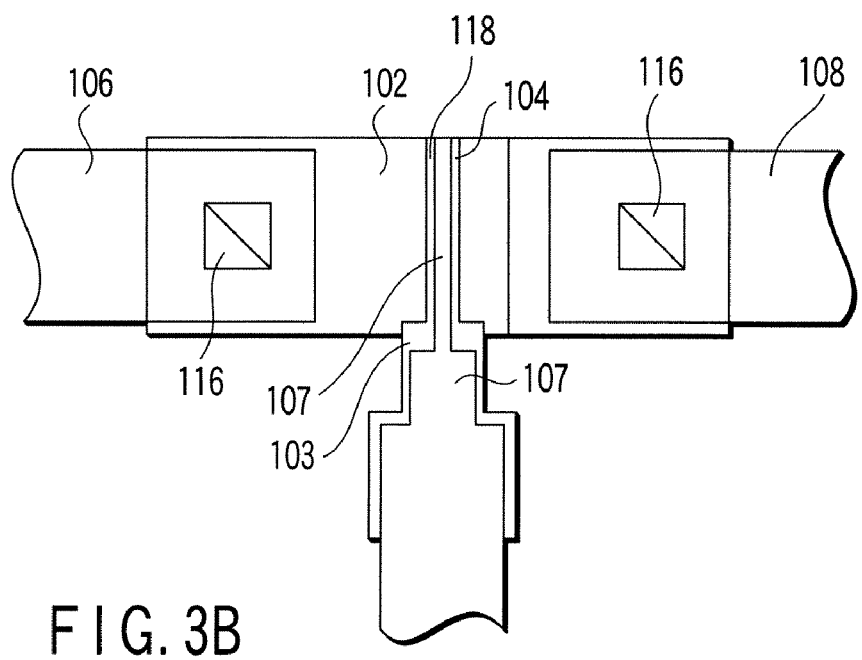
FIG. 3B is a plan view of a thin-film transistor in which a base electrode is directly formed in a substantial base region in the first embodiment of the invention.

In FIG. 1A and FIG. 1C, the base contact portion 114 is led out from only one side surface of the base region 103. Alternatively, the base contact portion 114 may be led out from only the other side surface of the base region 103 or, as shown in FIG. 3A, the base contact portion 114 may be led out from both sides of the base region 103. Thereby, the width W of the effective Si thin film that functions as the bipolar transistor can be increased, and thus the collector current can be increased. Moreover, alternatively, as shown in FIG. 3B, the base electrode 107 may be configured to be directly connected to a base operation region 118 which is interposed between the emitter region 102 and collector region 104. The base operation region 118 can be formed by using a selective diffusion step and/or a selective ion implantation step using lithography, which is used in a fabrication process of an ordinary semiconductor device.

In the lateral bipolar thin-film transistor 100 formed on the insulating substrate, e.g. the glass substrate 101, the cross-sectional area of the junction between the base region and emitter region and the cross-sectional area of the junction between the collector region and the base region are small, and accordingly the junction capacitance is small. Therefore, this transistor is a TFT that is suited to high-frequency operations.

On the other hand, the demerit of this transistor is that since the cross-sectional area of the emitter region 102 is small, a large current, as in an ordinary vertical-type bipolar transistor, cannot be obtained. The driving current itself is smaller than that of the MOS transistor formed on the same Si thin film 105. Thus, the feature of a high current driving performance, which is conventionally recognized as the merit of the bipolar transistor, does not apply to the present device. Rather, the present device is suited to a small-current, high-speed operation. This feature is advantageous for, e.g. an input/output interface of a display, or a pre-amplifier for current sensing.

Figure 4:
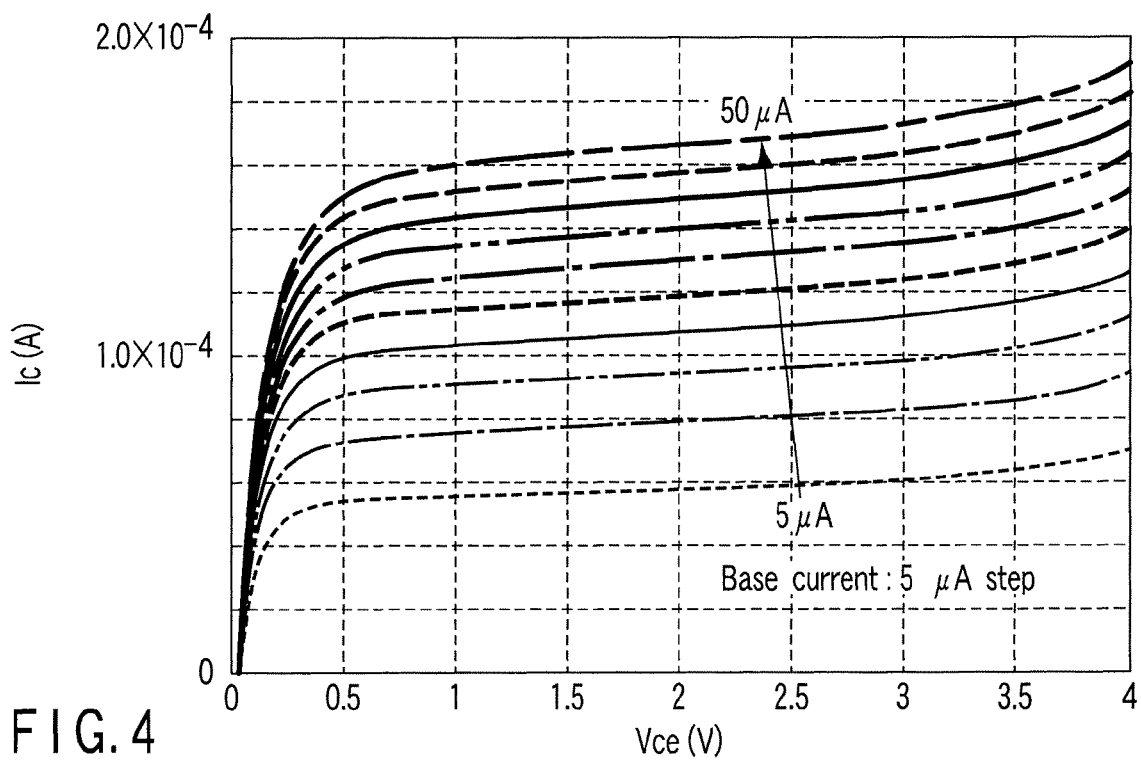
FIG. 4 is a graph showing input/output characteristics of the thin-film transistor according to the first embodiment of the invention.
Figure 5:
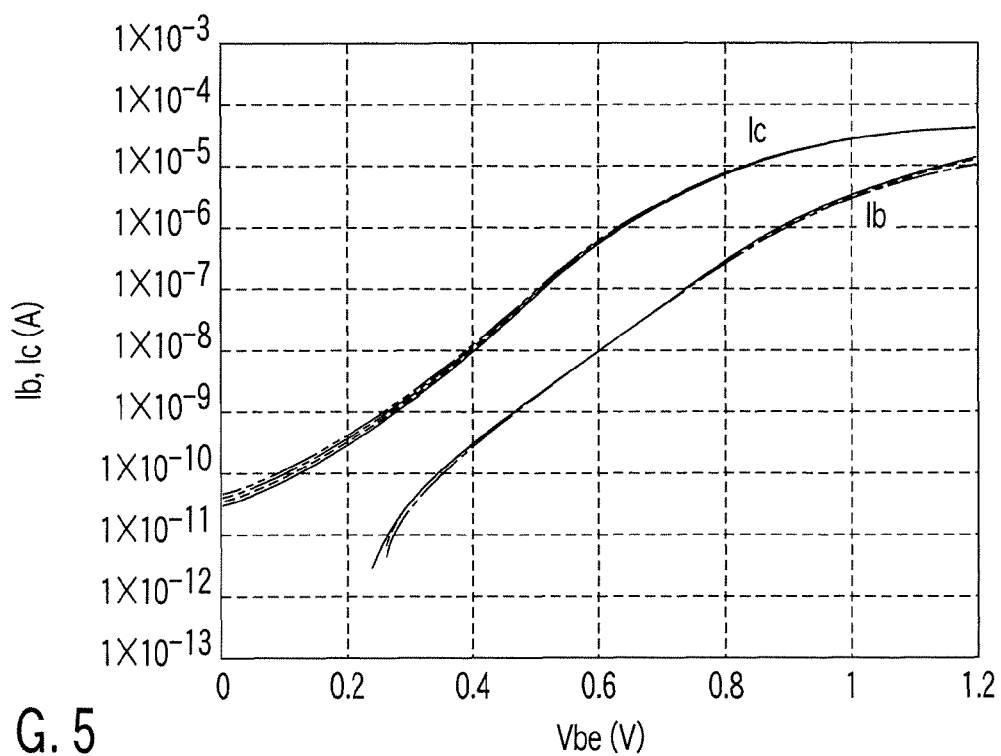
FIG. 5 is a graph showing Gummel plots of the thin-film transistor according to the first embodiment of the invention.
Figure 28:
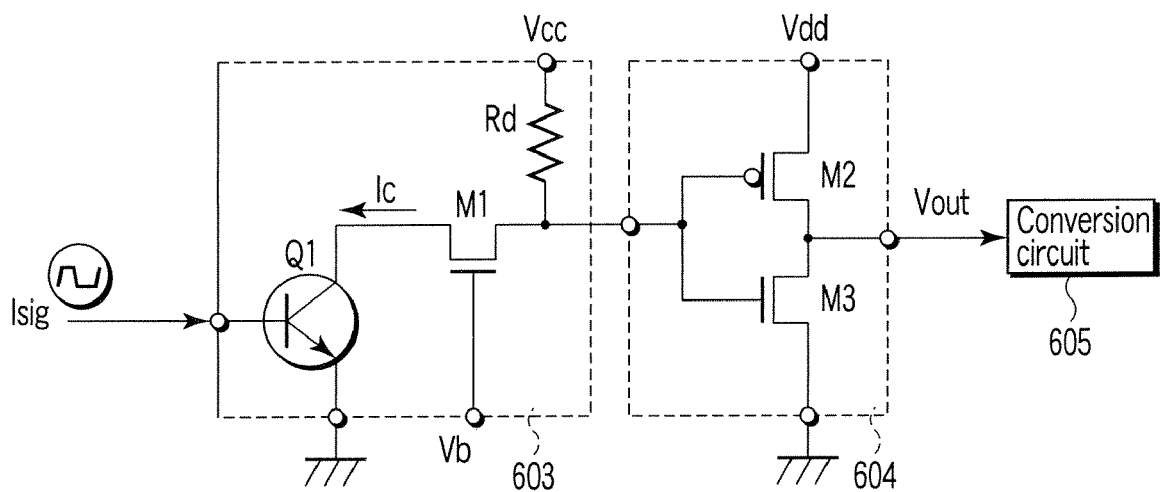
FIG. 28 shows the structure of a signal interface circuit according to the sixth embodiment of the invention.
Figure 34:
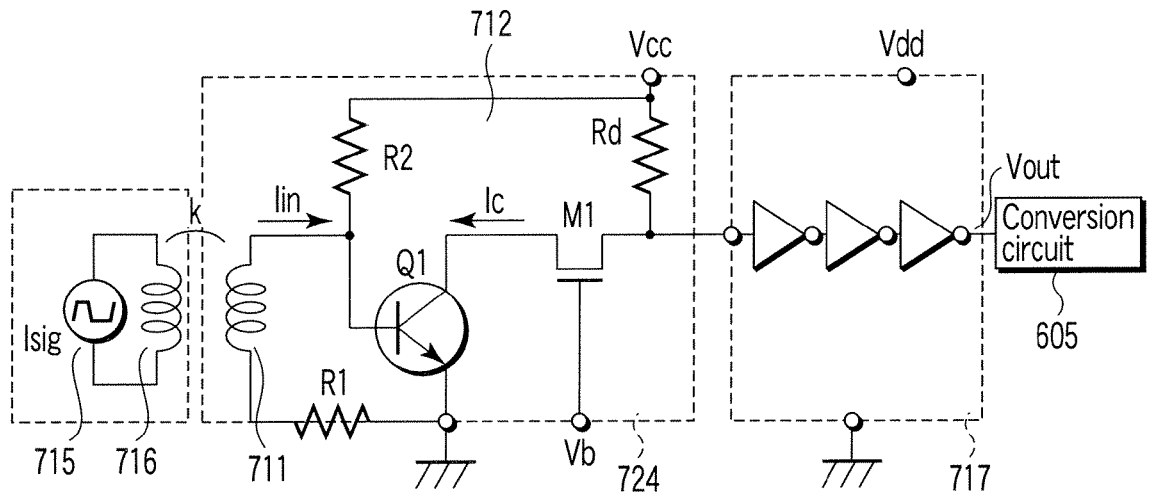
FIG. 34 shows the structure of a signal interface circuit in the seventh embodiment of the invention.

FIG. 4 is a graph showing input/output characteristics of the NPN-type lateral bipolar thin-film transistor 100 according to the first embodiment shown in FIG. 1A to FIG. 1C. In FIG. 4, the abscissa indicates an emitter-collector voltage (Vce), and the ordinate indicates a collector current (Ic). FIG. 4 shows a measurement result that was obtained by increasing the base current in steps of 5 μA. FIG. 5 is a graph showing Gummel plots. In FIG. 5, the abscissa indicates a base-emitter voltage (Vcb), and the ordinate indicates a base current (Ib) and a collector current (Ic). It is understood from FIG. 4 and FIG. 13A that a current amplification factor of 10 or more, for example, is obtained with an output current of 0.01 mA. It is also understood from FIG. 13A that the mobility should preferably be about 350 $cm^2/V \cdot s$ or more. In addition, it is understood that good saturation characteristics are obtained, which are desirably applied to analog circuits. This transistor is suited, for example, to a transistor of an input section of a current-driving serial interface circuit as shown in FIG. 28 or FIG. 34.

Next, referring to FIG. 6 to FIG. 13B, a description is given of an embodiment of the MOS-lateral bipolar hybrid thin-film transistor in the above-described electronic device.

(1-2) MOS-Bipolar Hybrid Thin-Film Transistor

Figure 8:
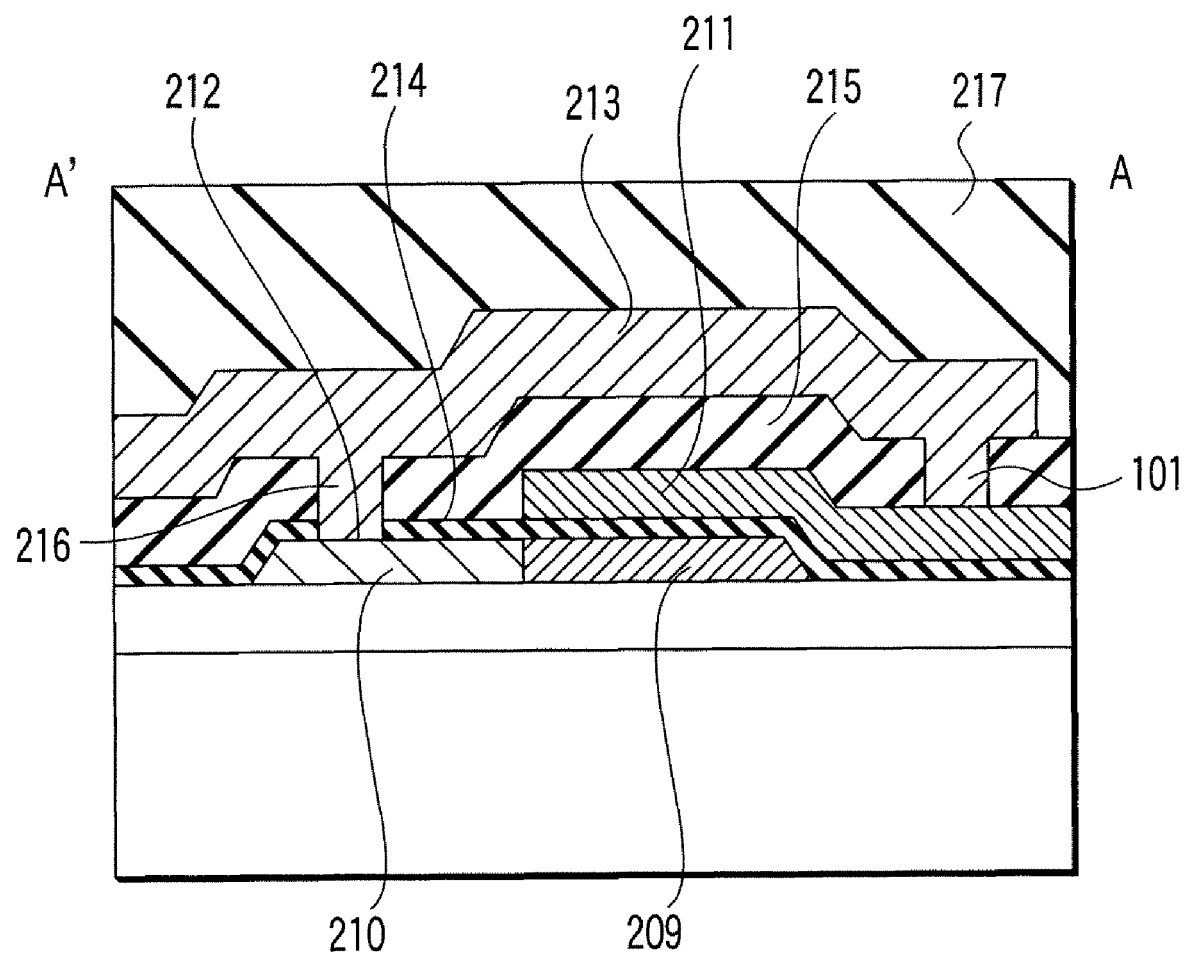
FIG. 8 is a cross-sectional view, taken along line A-A' in FIG. 6, showing the MOS-bipolar hybrid transistor according to the first embodiment of the invention.

FIG. 6 is a plan view of a MOS-bipolar hybrid thin-film transistor 200 formed on a glass substrate, according to an embodiment of the present invention. FIG. 7 is a cross-sectional view taken along line Z-Z' in FIG. 6. FIG. 8 is a cross-sectional view taken along line A-A' in FIG. 6. The MOS-bipolar hybrid thin-film transistor 200 is a transistor having functions of both a MOS thin-film transistor and bipolar transistor. The source of the MOS thin-film transistor also functions as the emitter of the bipolar transistor. The channel of the MOS thin-film transistor also functions as the base of the bipolar transistor. The drain of the MOS thin-film transistor also functions as the collector of the bipolar transistor.

The entirety of the MOS-bipolar hybrid transistor 200 is formed on an insulation film, e.g. a buffer insulation film 204. The buffer insulation film 204 comprises an SiNx film 202 with a thickness of, e.g. 50 nm and an $SiO_2$ film 203 with a thickness of, e.g. 100 nm, which are formed on a no-alkali glass substrate 201. The substrate that is usable is not limited to the no-alkali glass substrate, and, for example, a quartz substrate, a plastic substrate, or a silicon substrate having an $SiO_2$ film on its surface may be used. The buffer insulation film 204 functions to prevent diffusion of impurities from the glass substrate 201. The structure of the buffer insulation film 204 is not limited to this example. For example, the buffer insulation film 204 may be formed of an $SiO_2$ film alone, or an SiNx film alone. Depending on cases, a semiconductor thin film 205 may directly be formed on the insulating substrate such as glass substrate 201.

A semiconductor thin film 205, which has a substantially T-shape with a thickness of 200 nm, is formed on the $SiO_2$ film 203 as an example of a film for forming the transistor. An Si thin film is formed as an example of the semiconductor thin film 205 (see 112 in FIG. 2). In this embodiment, as this Si thin film, an Si thin film including a single-crystal grain with a length of several μ or more is used, the Si thin film being formed by a lateral crystal growth method using a laser, as will be described later.

An $N^+$ doped emitter region (source region) 206, an $N^-$ doped collector region (part of a drain) 207, an $N^+$ doped collector contact region (part of the drain region) 208, a $P^-$ doped base region (channel region) 209 and a $P^+$ doped base region (channel region) contact 210 are formed in the semiconductor thin film 205.

The device of this embodiment differs from the lateral bipolar thin-film transistor in that a gate electrode 211, which is formed of an MoW alloy film, is formed on the base region via a gate insulation film 214 which is formed of $SiO_2$ with a thickness of 30 nm. The above description relates to an NPN-type MOS-bipolar hybrid thin-film transistor 200 (N-channel MOS thin-film transistor). However, a PNP-type MOS-bipolar hybrid thin-film transistor (P-channel MOS thin-film transistor) can similarly be constructed. Wiring lines 213, which are formed of three-layer metal films of, e.g. Ti/Al/Ti, are connected to the upper surfaces of the Si thin film 205 and gate electrode 211 via contact through-holes 216 which are formed in a first interlayer insulation film 215. As is understood from the cross-sectional view of FIG. 8 taken along line A-A', the gate electrode 211 and contact region 212 of the base region (channel region) 209 are connected by the electrode wiring pattern 213, i.e. the pattern of the three-layer metal film of Ti/Al/Ti in this embodiment, so that their potentials are equalized. A second interlayer insulation film 217, which is formed of, e.g. an $SiO_2$ film, is formed so as to cover the entirety of the above-described parts.

Although the width W and length LB of the base region 209 are not limited to values mentioned below, it is preferable that the minimum value of the base length be set at 2 μm or less. In this embodiment, the width W of the base region 209 is 2.5 μm and the length (equal to the distance between the emitter and collector) LB is 1 μm.

Like the embodiment of the lateral bipolar thin-film transistor, the emitter region (source region) 206 is doped with phosphorus, the base region (channel region) 209 is doped with boron and the collector region (drain region) 207, 208 is doped with impurities, e.g. phosphorus. The dopants are not limited to the above-mentioned materials. The selective doping of impurity atoms can be carried out by using ion implantation techniques in ordinary semiconductor fabrication technologies.

The above-described MOS-bipolar hybrid thin-film transistor 200 can be formed on the same insulating substrate, e.g. a no-alkali glass substrate, as the lateral bipolar thin-film transistor 100, as needed. In this case, the single crystal formation of the semiconductor thin films (105, 205), in which these transistors are formed, can be carried out in the same crystallization step.

Figure 9:
FIG. 9 is a plan view showing a part of a transistor with a base width of 100μ, in which 20 MOS-bipolar hybrid transistors according to the first embodiment of the invention are connected in parallel.

FIG. 9 is a plan view showing a part of a hybrid thin-film transistor with a base region (channel region) width W of 100μ as a whole, in which 20 hybrid thin-film transistors (the base region (channel region) width W is 5 μm in this example) shown in FIGS. 6 to 8 are connected in parallel. A plurality of emitter regions (source regions) 206 and collector regions (drain regions) 207 are formed between a plurality of associated base regions (channel regions) 209 which are formed with intervals on an Si pattern 219. The base regions (gate electrodes) 209, emitter regions (source regions) and collector regions (drain regions) are connected to a common gate (base) electrode 220, a common emitter (source) electrode 221 and a common collector (drain) electrode 222, respectively.

As has been described above, in the case of the device with the side-surface contact, the base region (channel region) width is restricted. Thus, in a transistor that drives a large current, good characteristics can be maintained by arranging a plurality of transistors each with a small width W in parallel. This structure can prevent self-heat production of the device at a time of a large current operation.

In the operation of the present device, like the ordinary bipolar transistor, a current between the emitter region (source region) and collector region (drain region) is controlled by flowing a base current between the base region (gate region) 209 and emitter region (source region) 206, while applying a positive voltage to the collector region (drain region) 208. Since the gate electrode 211 and base region (channel region) contact 212 are connected, a voltage of 1 to 2V, which is applied between the base region and emitter region, becomes a voltage between the gate region and source region. If this voltage is higher than a threshold voltage Vt of the MOS thin-film transistor, a surface channel is formed in the channel region 209, and a surface current flows. Electrons, which are injected from the emitter region (source region) 206 to the base region (channel region) 209 by the bipolar operation, flow through the surface channel. Thus, a greater driving current is obtained with this device than in the case of the operation with the bipolar device alone or MOS device alone.

Figure 10:
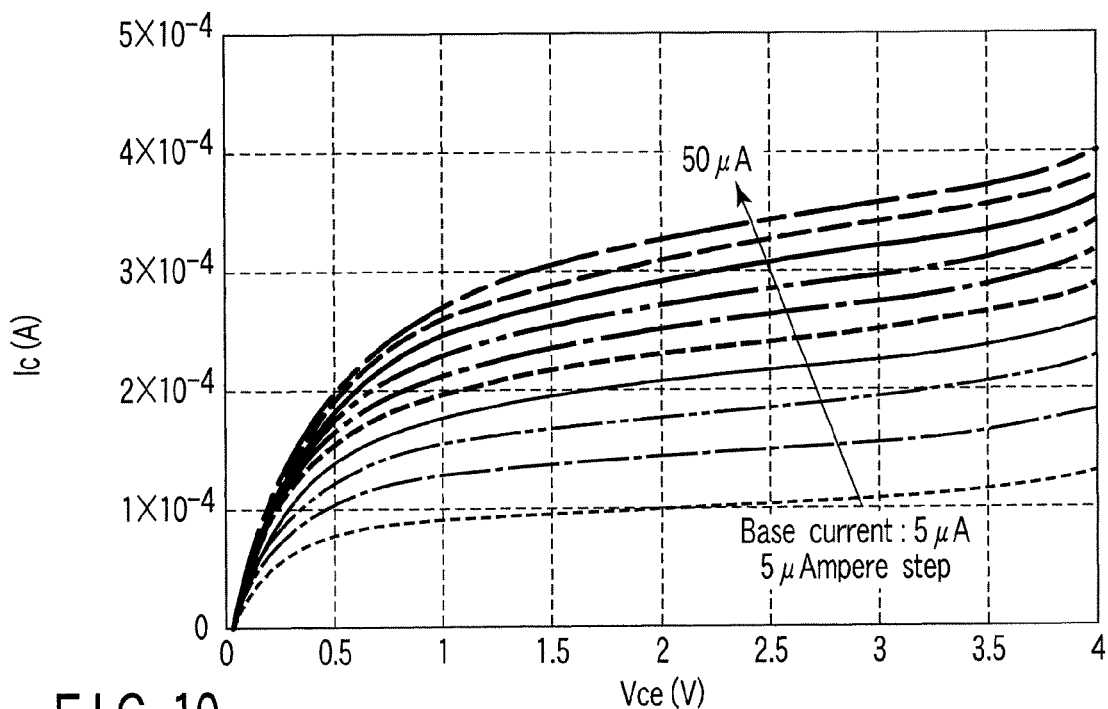
FIG. 10 is a graph showing input/output characteristics of the MOS-bipolar hybrid transistor according to the first embodiment of the invention.
Figure 11:
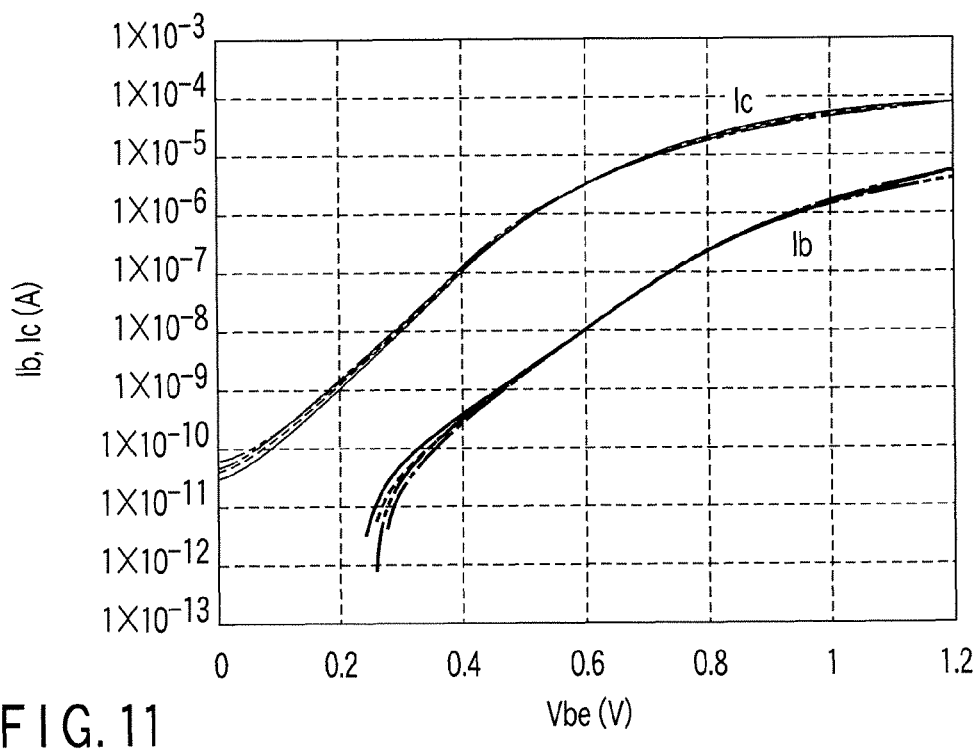
FIG. 11 is a graph showing Gummel plots of the MOS-bipolar hybrid transistor according to the first embodiment of the invention.

FIG. 10 and FIG. 11 show input/output characteristics and Gummel plots of the above-described MOS-bipolar hybrid thin-film transistor 200 (hereinafter also referred to as "TFT"). With this thin-film transistor 200, a higher driving current can be obtained than with the lateral bipolar thin-film transistor 100 shown in FIG. 4 and FIG. 5. In addition, it is understood that the current amplification factor hFE is higher. It was understood that the current value shown in FIG. 10 is about double the current at the time of the operation of the MOS device alone without connection of the base electrode.

Figure 12:
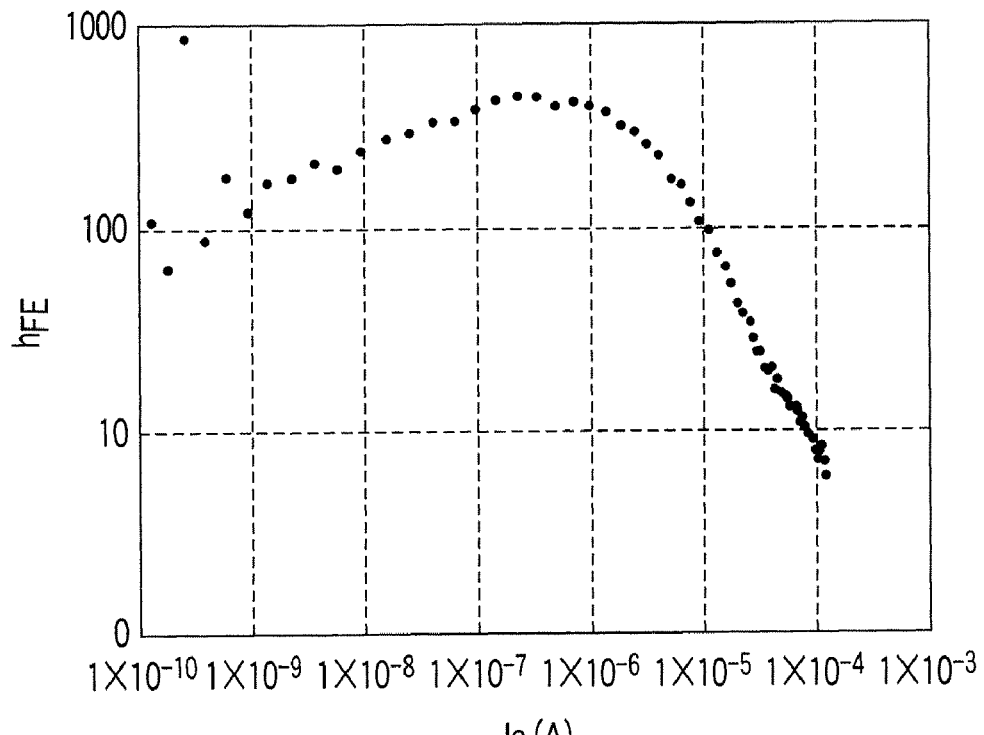
FIG. 12 is a graph showing the collector current dependency of the current amplification factor of the MOS-bipolar hybrid transistor according to the first embodiment of the invention.

FIG. 12 shows the relationship between the collector (drain) current and the current amplification factor hFE of the hybrid TFT 200. According to the characteristics shown in FIG. 12, a maximum current amplification factor hFE of about 500 is obtained. Thus, the hybrid TFT 200 can obtain a higher current gain by the hybrid operation.

Figure 13A:
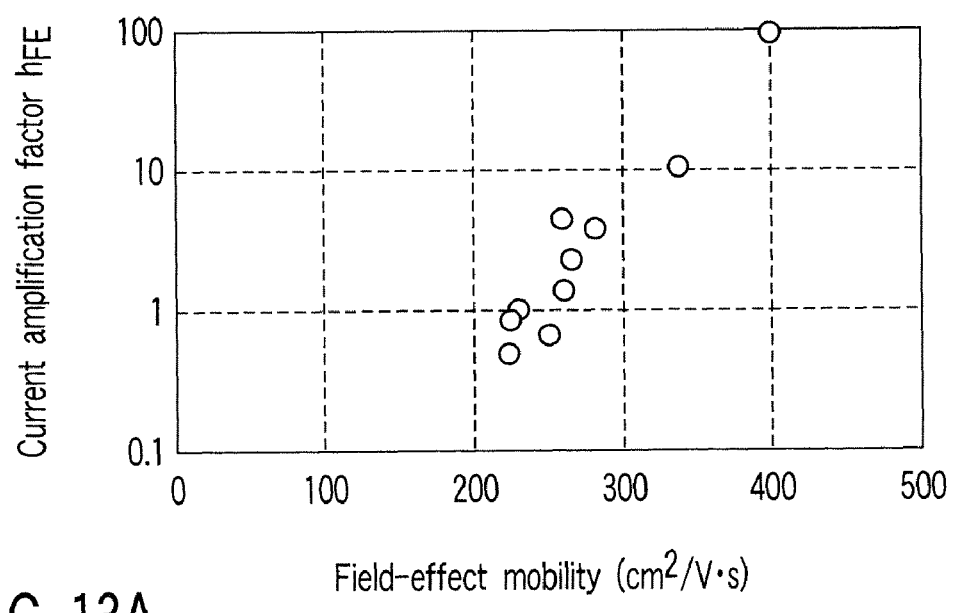
FIG. 13A is a graph showing the relationship between the current amplification factor and field-effect mobility of the MOS-bipolar hybrid transistor according to the first embodiment of the invention.

FIG. 13A shows the relationship between the field-effect mobility at the time of the operation in the MOS mode and the current amplification factor at the time of the operation in the bipolar mode in the hybrid TFT 200 in which the film quality of the Si thin film 205 was varied. The field-effect mobility and the current amplification factor are substantially proportional. For example, in order to obtain a practically sufficiently high current amplification factor hFE of 10 or more in the case of the use for the input circuit of a display device, it is necessary to use an Si film with such a high quality that the surface channel mobility of 350 (cm$^2$/V·/s) is obtained. It is thus proper to use a crystallized Si film.

It is understood that desirable characteristics for the application to analog circuits are obtained by this hybrid TFT. In addition, this hybrid TFT 200 is suitable as a transistor in an input section of a current-driving serial interface circuit, for example, as shown in FIG. 28 or FIG. 34.

FIG. 13B is a graph showing a carrier passage time ($\tau$) between the emitter and collector, relative to a base length LB, in the hybrid TFT 200. The carrier passage time ($\tau$) is derived from a plot of ½ $\pi f_T$ relative to $1/I_C$. FIG. 13B shows that the carrier passage time increases substantially linearly in relation to the base length LB and the motion of electrons is restricted by drift. The presence of the surface channel contributes to this, and the surface channel effectively absorbs injected electrons and increases the movement within the base.

(1-3) MOS Thin-Film Transistor

Figure 14B:
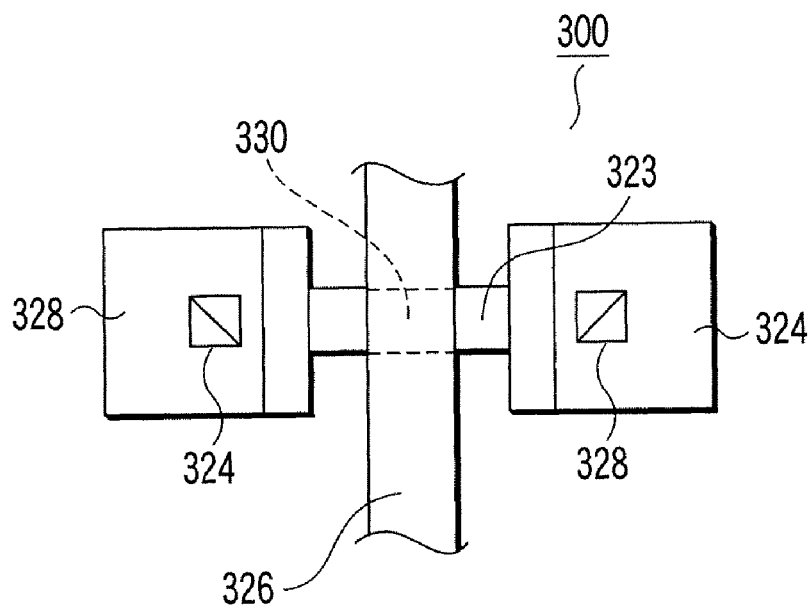
FIG. 14B is a plan view of the MOS thin-film transistor shown in FIG. 14A.

Next, referring to FIG. 14A and FIG. 14B, a description is given of an embodiment of the MOS thin-film transistor in the above-described electronic device.

FIG. 14A and FIG. 14B are a cross-sectional view and a plan view showing a MOS-type TFT 300 which is formed on the same (single) insulating substrate as the above-described bipolar TFT 100 or hybrid TFT 200.

The entirety of the MOS-type TFT 300 is formed on a buffer insulation film, which comprises an SiNx film 321 with a thickness of, e.g. 50 nm and an SiO$_2$ film 322 with a thickness of, e.g. 100 nm, which are formed on a no-alkali glass substrate 301.

Like the ordinary field-effect transistor, the MOS-type TFT 300 can be formed as a P-type transistor or an N-type transistor having a source/drain region 324 and a channel 330 by properly selecting impurities to be doped. A gate insulation film 325, which is formed of SiO$_2$ with a thickness of, e.g. 30 nm, is formed on a silicon single-crystal region 323 that is formed, for example, by crystallizing an amorphous Si thin film in a predetermined direction. A gate electrode 326 of, e.g. an MoW alloy film, which extends across the single-crystal region 323, is formed on the surface of the gate insulation film 325. The channel length is determined by the width of the gate electrode 326. In order to use this MOS transistor as a circuit element of a display device, the gate length of the MOS transistor should preferably be set at 1 µm or less, and the maximum value of the field-effect mobility of this MOS transistor, which is formed in the crystallized silicon single-crystal region, should preferably be set at 350 cm$^2$/Vs or more.

An interlayer insulation film 327 of, e.g. SiO$_2$ is formed so as to cover the entirety of the above-described parts. Electrode wiring lines 329, which are formed of three-layer metal films of, e.g. Ti/Al/Ti, are formed via contact through-holes 328 which are formed in the interlayer insulation film 327. The metal film may be formed of various electrically conductive materials, aside from Ti/Al/Ti. Depending on the conditions of use relating to an electronic circuit to be used, the MOS thin-film transistor can be formed in a non-crystallized semiconductor thin film, and both types of transistors may be formed in a hybrid fashion.

In the case where an electronic device according to the invention, which includes a plurality of semiconductor devices, is to be formed on an insulating substrate, the electronic device is formed to include, as such semiconductor devices, the above-described MOS thin-film and at least either of the lateral bipolar thin-film transistor and the MOS-bipolar hybrid thin-film transistor, which are formed in the crystallized semiconductor thin film and have high current amplification factors.

An integrated circuit, which is configured such that a MOS transistor and a bipolar transistor are integrated at the same time, is formed on an insulating substrate which includes a display device.

Figure 14C:
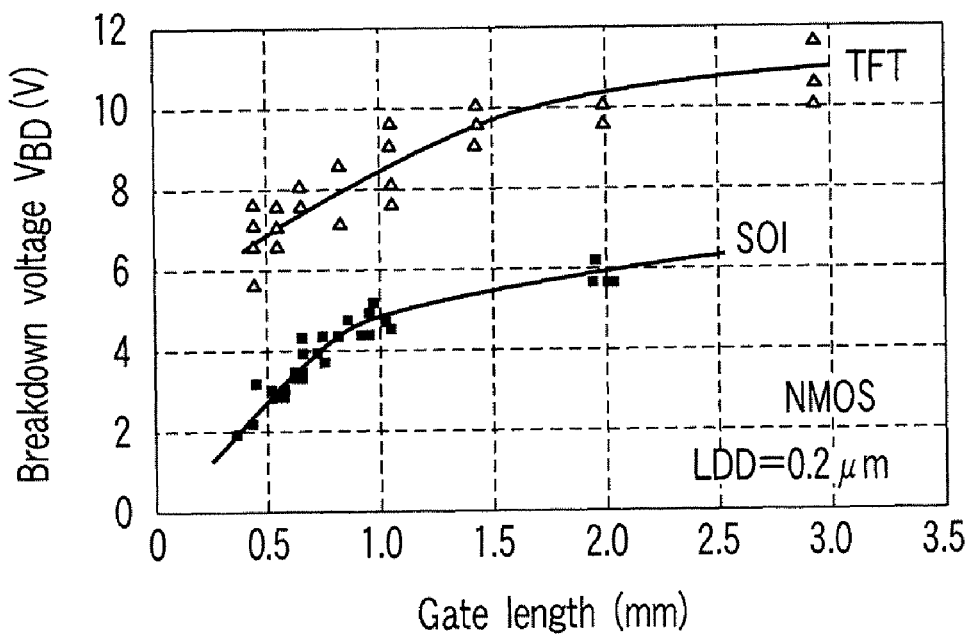
FIG. 14C is a graph showing a source-drain breakdown voltage ($V_{BD}$) relative to a gate length of an N-channel poly-Si MOS thin-film transistor and an SOI-MOS thin-film transistor.

FIG. 14C is a graph showing a source—drain breakdown voltage ($V_{BD}$) relative to the gate length of an N-channel poly-Si MOS thin-film transistor and an SOI-MOS thin-film transistor. In the MOS-type thin-film transistor that is used in the display device, a serious problem is posed by the decrease in $V_{BD}$ due to a floating-body effect. The crystallized poly-Si MOS thin-film transistor formed in the single crystal region has a higher breakdown voltage than the SOI-MOS thin-film transistor, and is suited as a device for use in the display device.

Second Embodiment

Embodiment of Crystallization of a Semiconductor Thin Film

Next, a description is given of an embodiment of the formation of a semiconductor thin film that is crystallized in a predetermined direction, in which the above-described lateral bipolar thin-film transistor 100 and MOS-bipolar hybrid thin-film transistor 200, for instance, are formed.

The control for image display using, e.g. a liquid crystal panel, can be executed by using thin-film transistors which use an amorphous silicon thin film that is formed on an insulating substrate, e.g. a glass substrate, which is used in fabrication of ordinary thin-film transistors. In general, the amorphous silicon thin film is used after it is annealed. However, it is particularly effective to use, as a display substrate, a substrate having a plurality of insular regions which are formed in an array and are substantially formed of a single crystal thin film, namely, regions of a semiconductor thin film that is crystallized in a predetermined direction, as will be described later.

The reason for this is that by further subjecting a deposited semiconductor thin film to crystallization, a plurality of regions which are "substantially" formed of a single crystal thin film can be obtained in a uniform condition in the entire substrate of a large area that is required by a display device. The word "substantially" in this context means that in some cases the plurality of regions may be formed of a plurality of single-crystal regions when crystal growth is performed by the method of the invention to be described below, although the plurality of regions should preferably be formed of a perfect single-crystal thin film.

Figure 15:
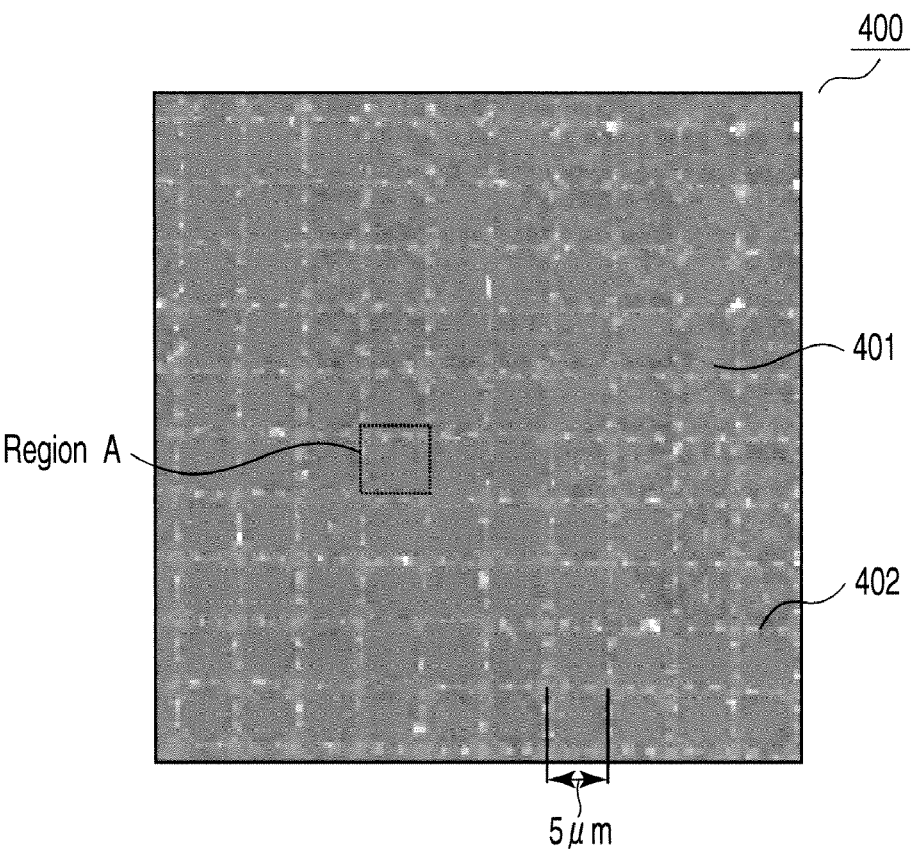
FIG. 15 is an electron microscopic image of a crystal array pattern according to the second embodiment, which can be used in the lateral bipolar thin-film transistor, MOS-bipolar hybrid transistor and MOS thin-film transistor according to the first embodiment of the invention.

FIG. 15 is an electron microscopic image of a substrate 400 according to a second embodiment, which is used in the present invention. A substrate having a plurality of regions formed of arrayed single-crystal thin films is not limited to a glass substrate. In this embodiment, however, a transparent no-alkali glass substrate 101, 201 is used. This substrate for display has such a structure that a plurality of regions formed of, e.g. silicon thin films each with a size of about 5 μm×5 μm, which are arrayed in a two-dimensional matrix, are arranged at intervals of 5 μm in vertical and horizontal directions.

In FIG. 15, poly-crystal regions 402 are present at boundary portions surrounding each single-crystal region 401 that is crystallized, and many crystal grain boundaries 403 are present. In the crystal grain boundaries 403, there are electrically active defects functioning as centers of generation/recoupling of carriers. Thus, the poly-crystal regions 402 are excluded from the formation regions of the base or channel region of the thin-film transistor. FIG. 15 shows the state in which the entire substrate has been subjected to the crystallizing process. Alternatively, only a part of the substrate, for example, only a part where any one of thin-film transistors is formed, may be subjected to the crystallizing process.

Figure 16:
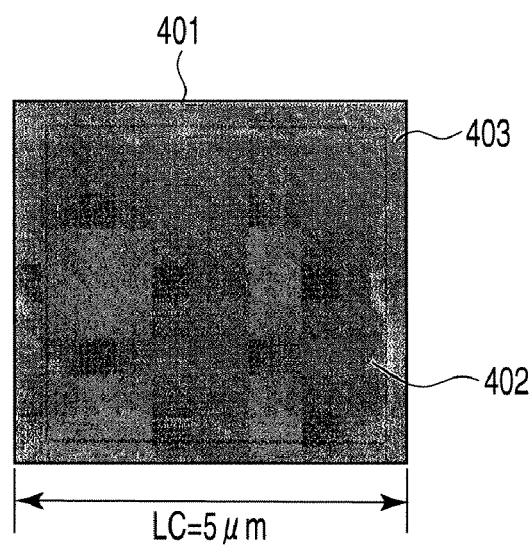
FIG. 16 is an enlarged view of the electron microscopic image of the crystal array pattern which can be used in the first embodiment of the invention.

FIG. 16 is an enlarged view of a region A which is one of single-crystal regions in FIG. 15. In the region with a dimension of 5 μm, a peripheral region of about 0.5 μm is a poly-crystal region 402, and there are many defects which occur in crystal boundaries. Thus, the base (channel) region of the transistor is disposed so as not to include the defective region 402 of about 0.5 μm.

The method of fabricating the substrate having crystallized semiconductor thin films is described in detail in Japanese Patent Application No. 2003-209598 that was filed on Aug. 29, 2003 by the applicant of the present application.

A description will now be given of an example of a method of forming a thin-film array having substantially rectangular single-crystal regions each with a dimension of each side of about 4 μm, which are arranged with a pitch of 5 μm, as shown in FIG. 15 and FIG. 16.

In the case where a substrate which is used as a display substrate is a glass substrate, high temperatures as in a case of fabricating a silicon wafer cannot be used in order to obtain a single crystal. To begin with, an amorphous silicon thin film, for instance, is formed on a glass substrate by an arbitrary method. Then, a pulse-like ultraviolet laser beam is applied to the amorphous silicon thin film, thereby melting the laser-applied region of the amorphous silicon film. The molten amorphous silicon film is recrystallized and a silicon thin-film region, which is partly made into a single crystal, is formed. In this embodiment, silicon is used, but the usable semiconductor material is not limited to silicon. For instance, a Group III-V semiconductor may be used.

When recrystallization is performed, the following method is adopted in order to obtain a single-crystal region having a largest possible area. The thin film is melted such that a temperature gradient is imparted to each array part. With the temperature gradient being maintained, the temperature of the substrate is lowered and thus the silicon is recrystallized. To achieve this, such a method is adopted that transmissive light with a light intensity distribution of an inverted peak pattern is generated by using a phase shift mask with a proper pattern, thereby imparting a spatial distribution to the light intensity of a laser beam that is radiated to the substrate surface and imparting a lateral (horizontal) temperature gradient to each array part. According to this method, in a non-radiation period after the radiation of the laser beam, the temperatures of the respective parts of the substrate decrease on the basis of the temperature gradient at the time of melting, the solid-liquid interface moves from the lowest-temperature part toward the high-temperature part, and crystal growth occurs in the lateral direction. Thus, from the initially produced polycrystalline portion, crystal growth progresses with a seed of crystal portion that is particularly suited to crystal growth, and a large single-crystal region is formed. In some cases, a plurality of single-crystal regions are formed. Even in this case, the size of the grown crystal is greater than the size of the channel region of an ordinary thin-film transistor. By this method, it becomes possible to obtain an array having a plurality of substantially single-crystal regions 401 each having a substantially rectangular shape with the dimension of each side of about 4 μm.

Figure 17A:
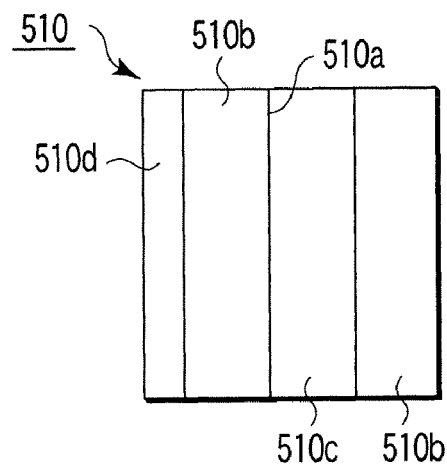
FIG. 17A shows a phase shift mask which is used in order to obtain a single-crystal array in the second embodiment of the invention.

Next, referring to FIG. 17A to FIG. 17D, the recrystallizing step using, e.g. a phase shift mask is described. A phase shift mask 510 shown in FIG. 17A is formed such that a transparent medium, such as a quartz material, is provided with mutually adjacent regions with different thicknesses. At stepped portions (phase shift portions) 510a between these adjacent regions, the incident laser beam is diffracted or interfered. In this manner, a cyclic spatial distribution is imparted to the intensity of the incident laser beam.

The phase shift mask 510 is configured such that the adjacent patterns have opposite phases (with a 180° phase difference). Specifically, alternately arranged regions comprise a first strip region (phase region) 510b with a phase π0 and a second strip region (phase region) 510c with a phase 0. Each strip region (phase shift line region) has a width of 10 μm in this example. To be more specific, the phase shift mask 510 is fabricated by pattern-etching a rectangular quarts plate with a refractive index of 1.5 so as to have a depth corresponding to a phase π relative to light with a wavelength of 248 nm, that is, a depth of 248 nm. The region that is thinned by etching becomes the first strip region 510b, and the non-etched region becomes the second strip region 510c.

Figure 17B:
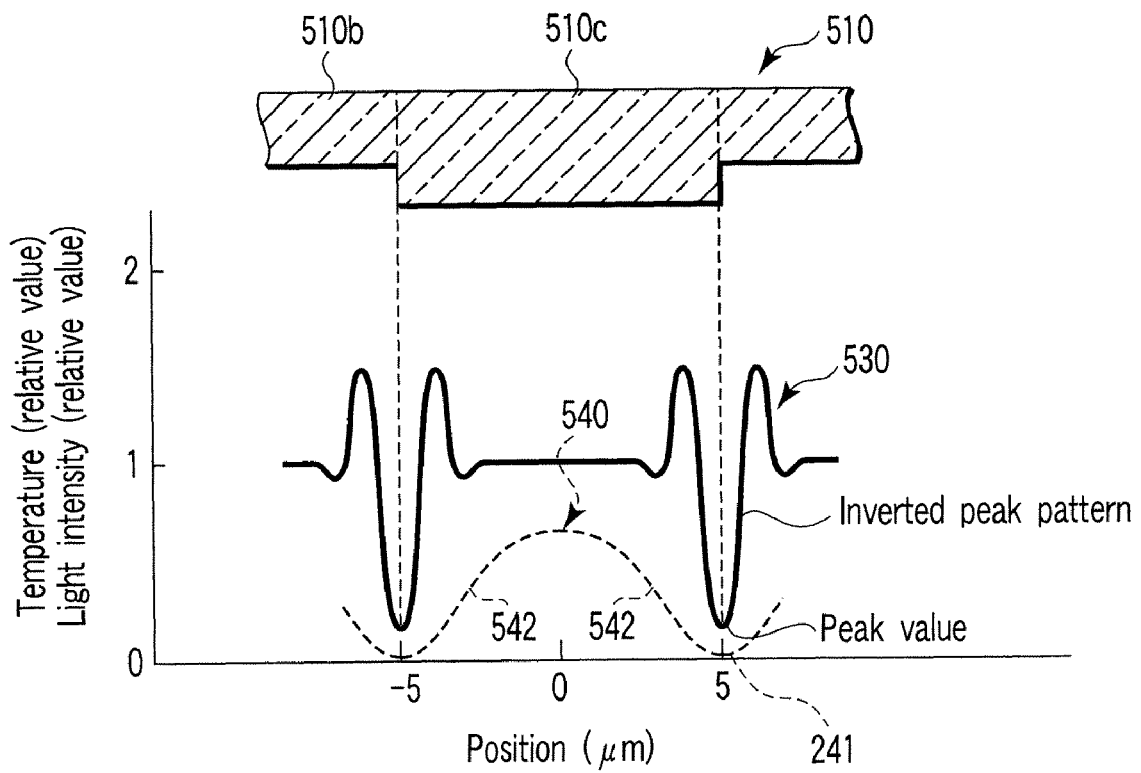
FIG. 17B shows a cross section of the phase shift mask, a light intensity distribution of a laser beam and a temperature distribution in the second embodiment of the invention.

When the phase shift mask 510 with this structure is used, the laser beam that has passed through the thick second phase region 510c delays by 180°, relative to the laser beam that has passed through the thin first phase region 510b. As a result, interference and diffraction occur between the laser beams. A laser beam intensity distribution 530 with an inverted peak pattern, as shown in FIG. 17B, is obtained. Specifically, since the adjacent laser beams that have passed through the phase shift regions have opposite phases, a laser beam that has passed through the phase shift portion between the adjacent phase regions has a minimum light intensity, for example, 0. The temperature of the portion with the minimum light intensity decreases to the minimum, and a cyclic temperature distribution 540 is provided on the substrate surface.

When the irradiation of the laser beam is stopped, a lowest-temperature region 241 or a region near the region 241 has a temperature of a melting point or below, and a great number of polycrystals that are nuclei for semiconductor recrystallization occur in the region. At first, polycrystals are produced in the lowest-temperature region 541. However, while crystals are grown in succession in accordance with the temperature gradient, a crystal portion with a crystal orientation, which is particularly suited to crystal growth, grows. Thus, at each temperature gradient portion 542, a substantially single-crystal region is obtained.

In the above description, the phase shift mask 510 is configured to have, by way of example, a line-and-space structure including mutually parallel, linear phase shift portions, as shown in FIG. 17A and FIG. 17B. However, the configuration of the phase shift mask 510 is not limited to this example. For example, the phase shift lines may be crossed at right angles, and the portion with a phase of 0 and the portion with a phase of π may be arranged in a lattice fashion (not shown). In this case, a region at which the light intensity of the lattice is 0 is formed along the phase shift line. Consequently, a crystal seed occurs at an arbitrary position on the phase shift line, and it becomes difficult, in some cases, to control the position and shape of crystal grains. In the meantime, an area-modulation type phase shifter is also usable.

In order to control the occurrence of a crystal seed, it is desirable that the regions with a light intensity of 0 be distributed at predetermined cycles in dot shapes. In one possible method for this, the phase shift amount of each of perpendicularly crossing phase shift lines is set at less than 180°. In this case, at the position corresponding to each phase shift line, the light intensity decreases but does not completely become 0. However, by properly choosing the shift amount, as described below, the sum of complex transmittance in the vicinity of the intersection of the phase shift lines can be reduced to 0. In this case, the light intensity at the intersection can be reduced to 0.

Figure 17C:
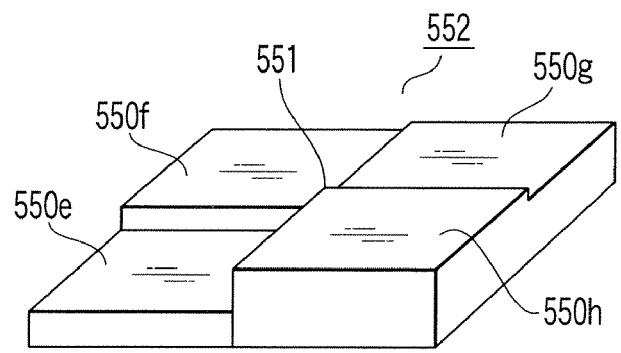
FIG. 17C shows another example of the phase shift mask which is used in order to obtain a single-crystal array in the second embodiment of the invention.
Figure 17D:
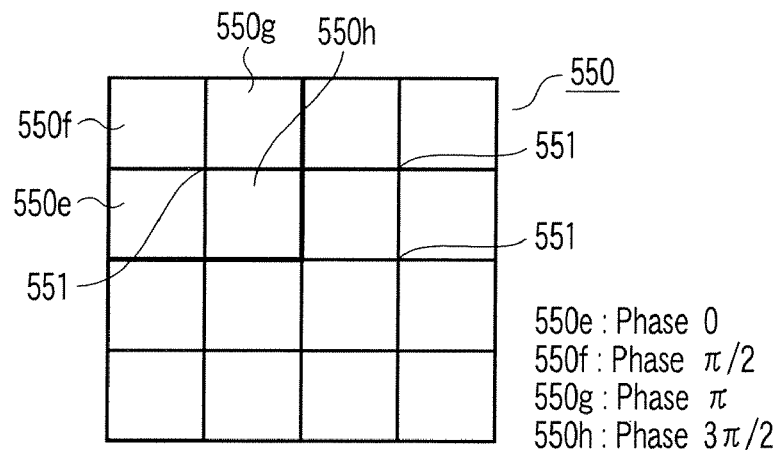
FIG. 17D is a plan view of the phase shift mask shown in FIG. 17C, which is used in order to obtain a single-crystal array in the second embodiment of the invention.

An example is described referring to FIG. 17C and FIG. 17D. A phase shift mask 550 includes a plurality of square patterns 552 each comprising four square regions 550e, 550f, 550g and 550h, which have different thicknesses, as shown in FIG. 17C and FIG. 17D. In each pattern, as shown in FIG. 17C, the first region 550e is the thinnest and has a phase 0. The fourth region 550h is the thickest and has a phase that shifts from the phase of the first region 550e by $3\pi/2$. The second and third regions 550f and 550g have thicknesses between the thicknesses of the first and fourth regions 550e and 550h and have phases that shift from the phase of the first region 550e by $\pi/2$ and $\pi$, respectively.

In the above-described mask, a center point 551 of the square pattern, at which the first to fourth regions neighbor, has an intensity 0. Therefore, this center point becomes a nucleus of crystal growth. In FIG. 17C, the center point of the pattern, that is, each lattice point 551, can be set to have the intensity 0. Therefore, the position of occurrence of the crystal grain can easily be controlled. The technique using this kind of phase shift mask is described in the specification of International Application PCT/JP03/03366 which is based on Japanese Patent Application No. 2002-120312 and was filed on Mar. 19, 2003 by the same applicant as the present application.

Third Embodiment

Another Embodiment of the Phase Shifter

A description is given of an embodiment of the phase shifter for forming a semiconductor thin film that is crystallized in a predetermined direction, in which the above-described lateral bipolar thin-film transistor and MOS-bipolar hybrid thin-film transistor are formed.

Figure 18:
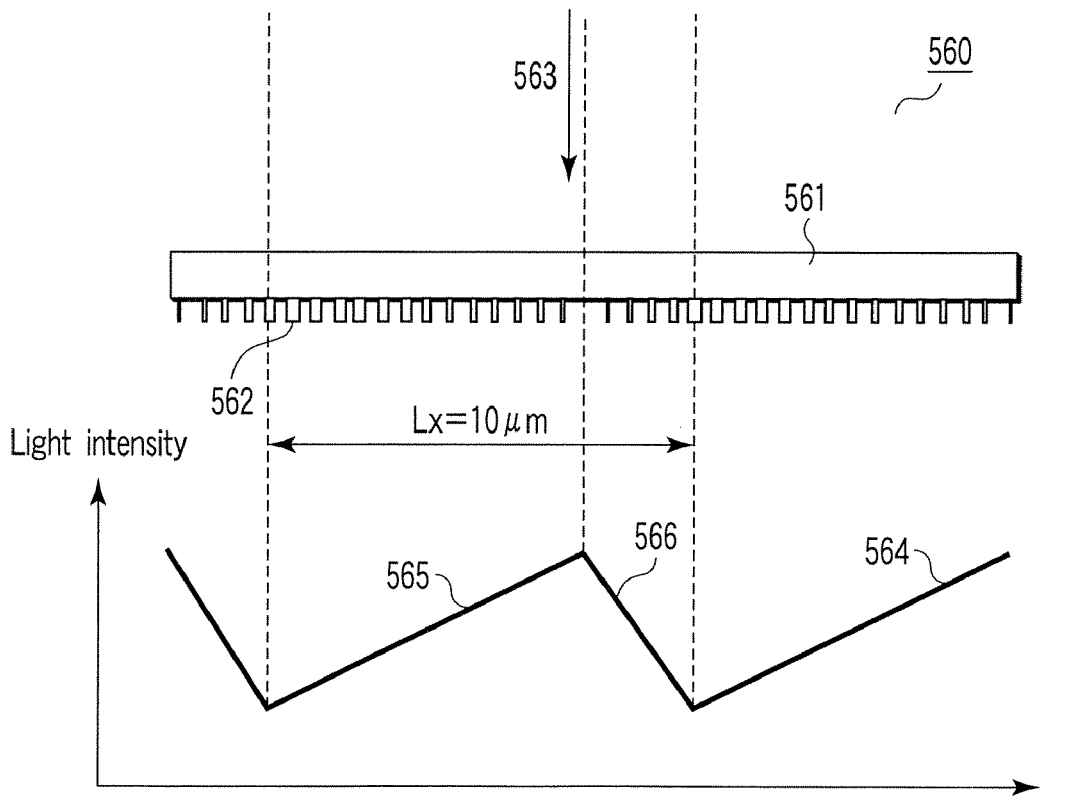
FIG. 18 shows another example of the phase shift mask which is used in order to obtain a single-crystal array in a third embodiment of the invention.

FIG. 18 shows a cross section of another phase shifter 560 which is used in order to form a semiconductor thin film that is crystallized in a predetermined direction, and also schematically shows a light intensity distribution. This phase shifter 560 is configured such that a plurality of projection patterns 562, which are formed of $SiO_2$ and have predetermined sizes, are arranged on, e.g. a quarts plate 561 with a predetermined density. By passing a spatially homogenized laser beam 563 through the phase shifter 560, a light intensity distribution 564 with sawtooth repetitive patterns, for example, 100 patterns, can be provided on an irradiation surface of a multi-layer substrate (not shown).

In this embodiment, the pitch Lx of repetition of projection patterns 562 is set at 10 µm, but this value can be set at a desired value by designing. The light intensity distribution 564 shown in FIG. 18 includes sawtooth portions formed of a pair of straight portions 565 and 566 with different inclinations. The light intensity distribution 564 is not limited to the sawtooth distribution, and may be an arbitrary light intensity distribution which is suited to crystallization.

Fourth Embodiment

Another Embodiment Relating to the Lateral Bipolar Transistor

Figure 19:
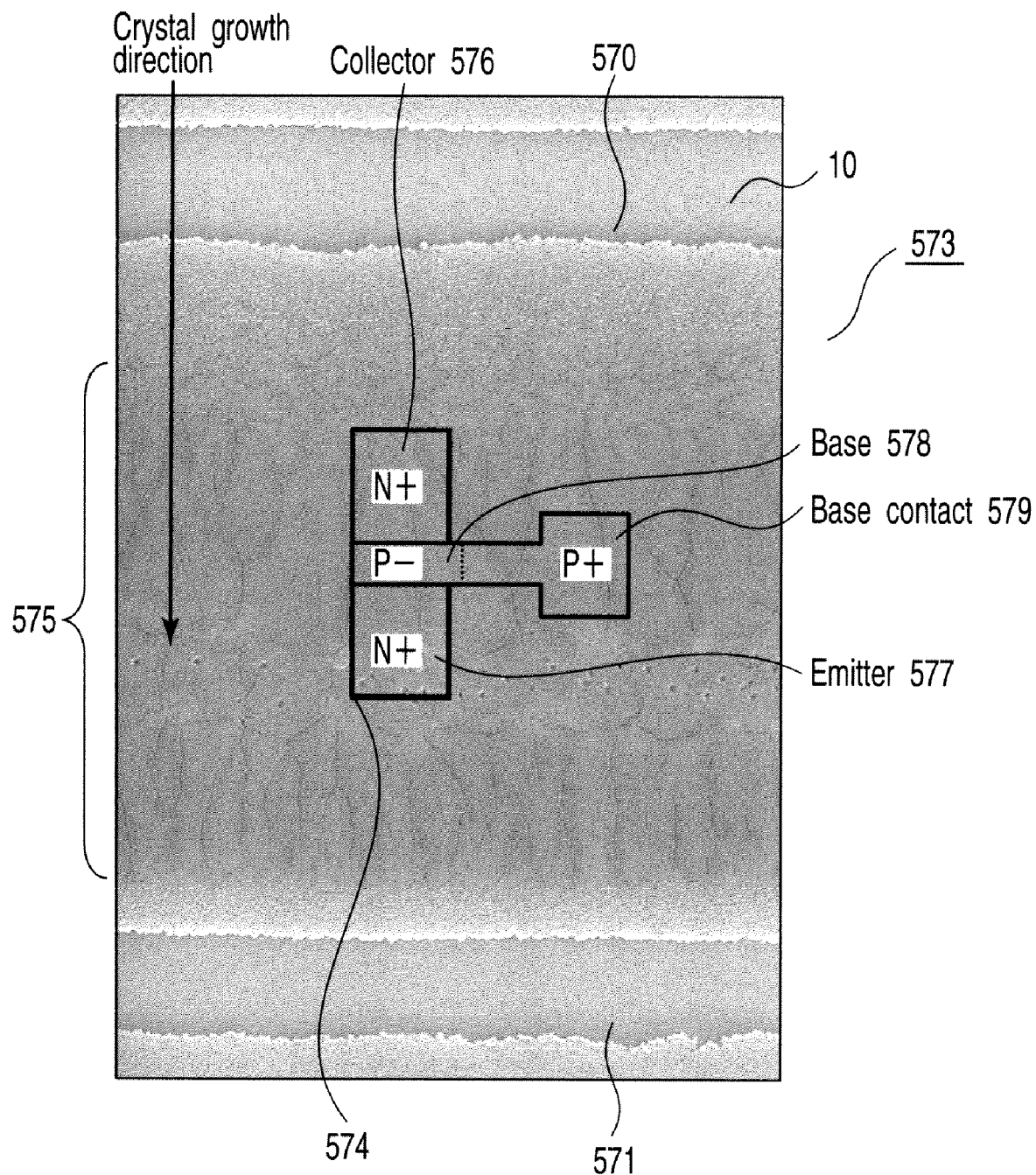
FIG. 19 shows a surface SEM image of a crystallized Si film according to a fourth embodiment of the invention, and an arrangement of a bipolar thin-film transistor which is formed in the Si film.

FIG. 19 shows a surface SEM image of a crystallized Si film which is formed according to the invention. FIG. 19 shows an embodiment of the disposition of the lateral bipolar transistor that is formed in the crystallized Si film. A multi-layer substrate is heated by irradiation of a laser beam with the light intensity distribution 564 as shown in FIG. 18, and an amorphous semiconductor film is melted. Then, the irradiation of the laser beam is stopped in a turn-off period of the laser beam, and the temperature is let to fall and the semiconductor film is crystallized. At this time, melting/recrystallization occurs from a region with a low laser intensity toward a region with a high laser intensity (i.e. from an upper region to a lower region in FIG. 19). As a result, a crystallization start portion 570 is in a polycrystalline state, and as crystal growth progresses in the horizontal direction of the substrate, a crystal grain having directivity for easy crystallization becomes gradually larger. Thus, an aggregation of single crystal grains, which is greater in size than a TFT that is to be formed subsequently, can be formed. A poly-crystal is formed in the vicinity of a crystallization termination portion 571 at which crystallization progresses and the crystal collides with a neighboring crystallization region.

In the above-described embodiment, the pulse-like ultraviolet laser beam has been described as an example of the laser beam for crystallization. However, it should suffice to emit a laser beam having such an energy as to melt the amorphous semiconductor (silicon) thin film, and it is possible to use a continuous-wave laser beam. A crystallizing device using a continuous-wave laser beam emits a continuous-wave laser beam in the state in which a laser beam source and an amorphous semiconductor (silicon) thin film are moved relative to each other. Thereby, a crystallized region with a large grain size can be formed.

In the above-described embodiment, the size of the crystallized region is such a size that at least a channel region (active layer) of each transistor is formed within one crystallized region.

FIG. 19 shows a pattern image of a bipolar transistor according to the embodiment, which is disposed on a semiconductor thin film that is crystallized in a predetermined direction that is determined by a temperature distribution corresponding to the intensity distribution of the laser beam. This transistor is arranged such that the collector-emitter direction, in which a current flows, is parallel to the direction of crystal growth. Thereby, the flow of carriers is not hindered by crystal grain boundaries, and good characteristics are obtained. In this arrangement, the collector region is positioned near the crystal growth start point and the emitter region is positioned near the crystal growth termination point. Hereinafter, this arrangement is defined as "forward-arrangement". On the other hand, the arrangement in which the positions of the collector and emitter are reversed is defined as "reverse-arrangement". The same arrangement is applicable to the MOS-bipolar hybrid thin-film transistor.

Figure 21A:
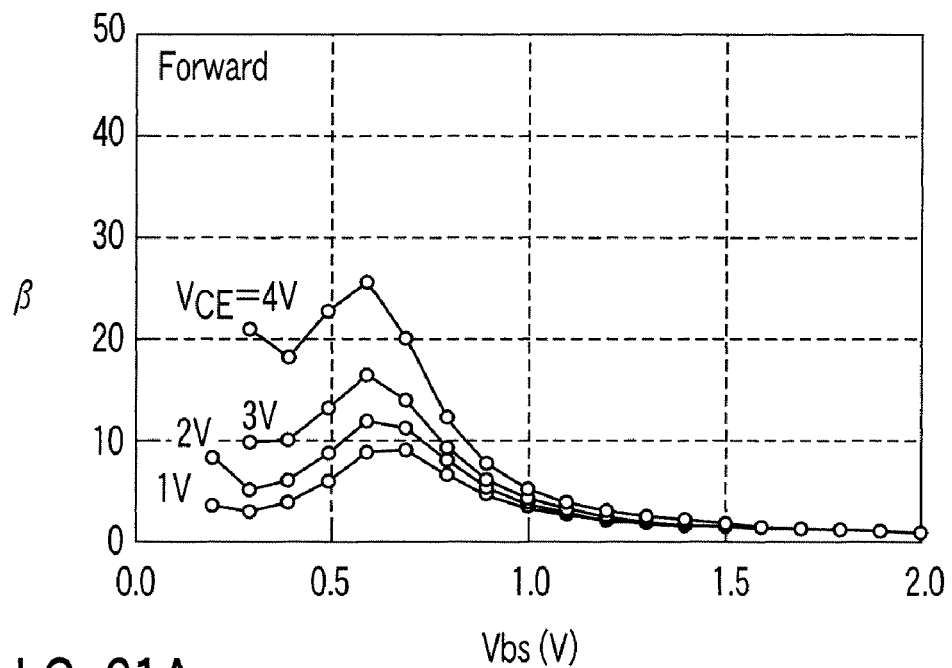
FIG. 21A is a graph showing the base voltage dependency of a current amplification factor β of the bipolar thin-film transistor according (forward-arrangement) shown in FIG. 19 according to the invention.
Figure 21B:
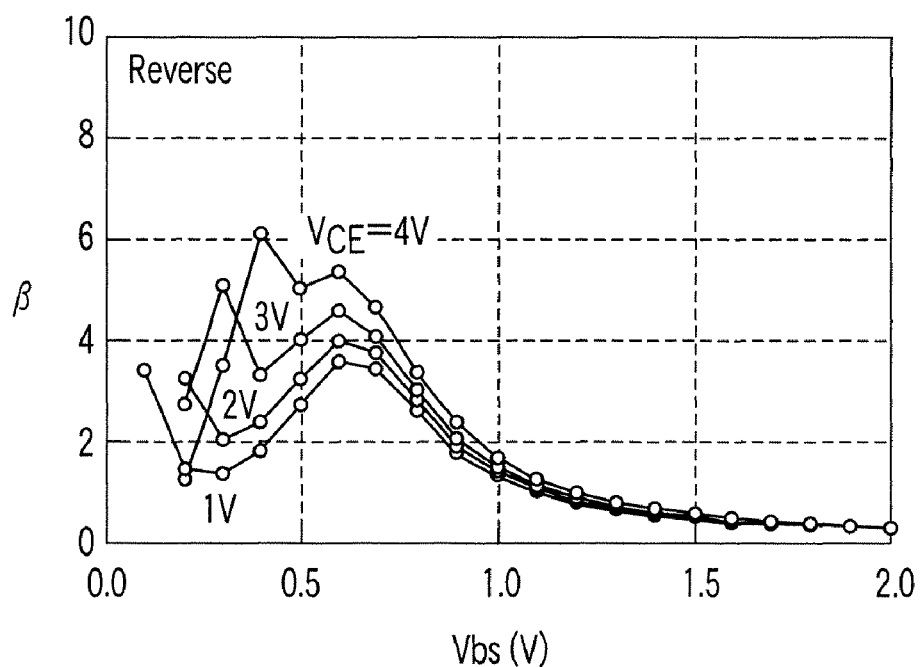
FIG. 21B is a graph showing the base voltage dependency of a current amplification factor β of the bipolar thin-film transistor according (reverse-arrangement) shown in FIG. 19 according to the invention.

FIG. 20A and FIG. 20B show Gummel plots in the forward-arrangement and reverse-arrangement of the bipolar transistor shown in FIG. 19. The current amplification factor is higher in the forward-arrangement (FIG. 20A) than in the reverse-arrangement (FIG. 20B). FIG. 21A and FIG. 21B are graphs in which the current amplification factor β is plotted relative to the base-emitter voltage Vbs in the forward-arrangement and reverse-arrangement, respectively. In the forward-arrangement, β is near 30, whereas in the reverse-arrangement, β is about 6. From this result, it is preferable to arrange the collector region near the crystal growth start point and the emitter region near the crystal growth termination point, whereby good transistor characteristics are obtained. It is considered that this asymmetry in characteristics occurs due to a difference in electrical characteristics between the base-collector junction and the base-emitter junction.

Figure 22:
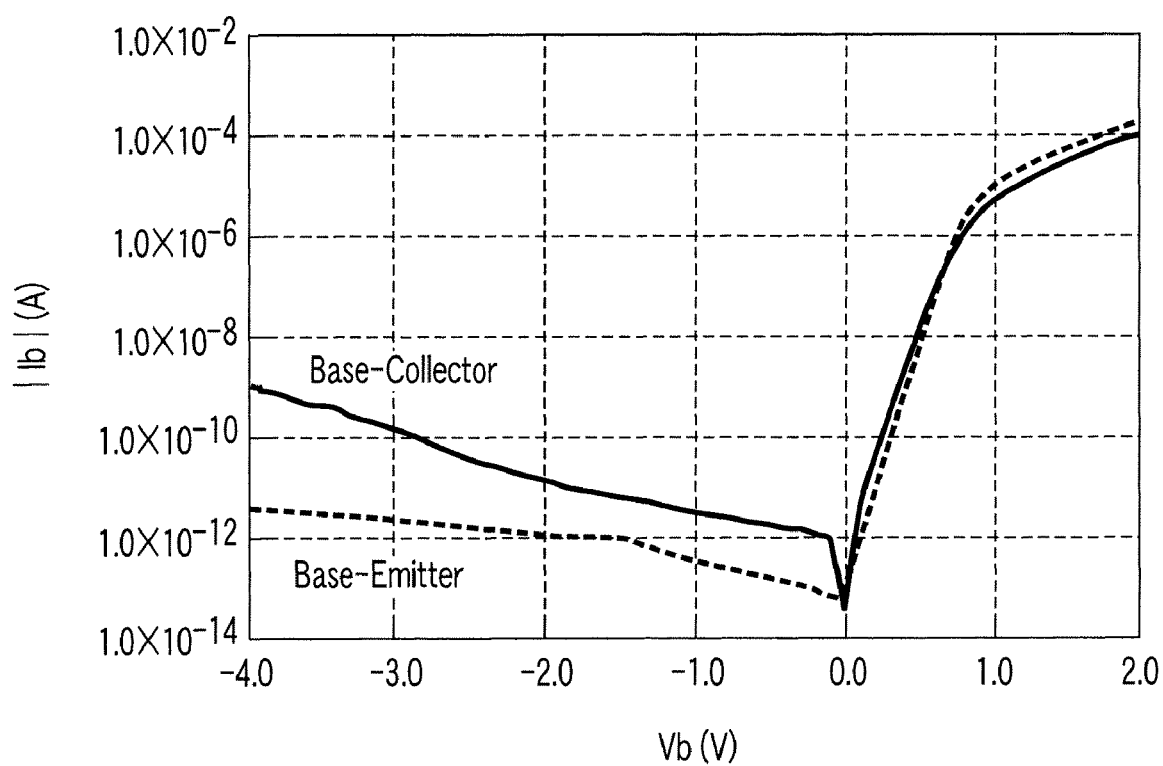
FIG. 22 is a graph showing base-emitter junction and base-collector junction characteristics of the bipolar thin-film transistor shown in FIG. 19 according to the invention.

FIG. 22 is a graph showing diode characteristics of the base-collector junction and base-emitter junction in the same device. In the case of the base-collector junction, a reverse-directional leak current is greater and also the n value of forward-directional characteristics is greater. It is understood that the density of defects functioning as centers of re-coupling is higher in the base-collector junction. The reason for this appears to be that since the width of the crystal grain increases with the progress of lateral crystal growth, as is understood from the SEM is image of FIG. 19, the density of crystal grain boundaries decreases toward the crystal growth termination point. As described above, in the case where the bipolar transistor is formed on a crystal that is grown in one direction, a greater current amplification factor can be obtained by arranging the collector near the crystal growth start point and the emitter near the crystal growth termination point.

Fifth Embodiment

Figure 23:
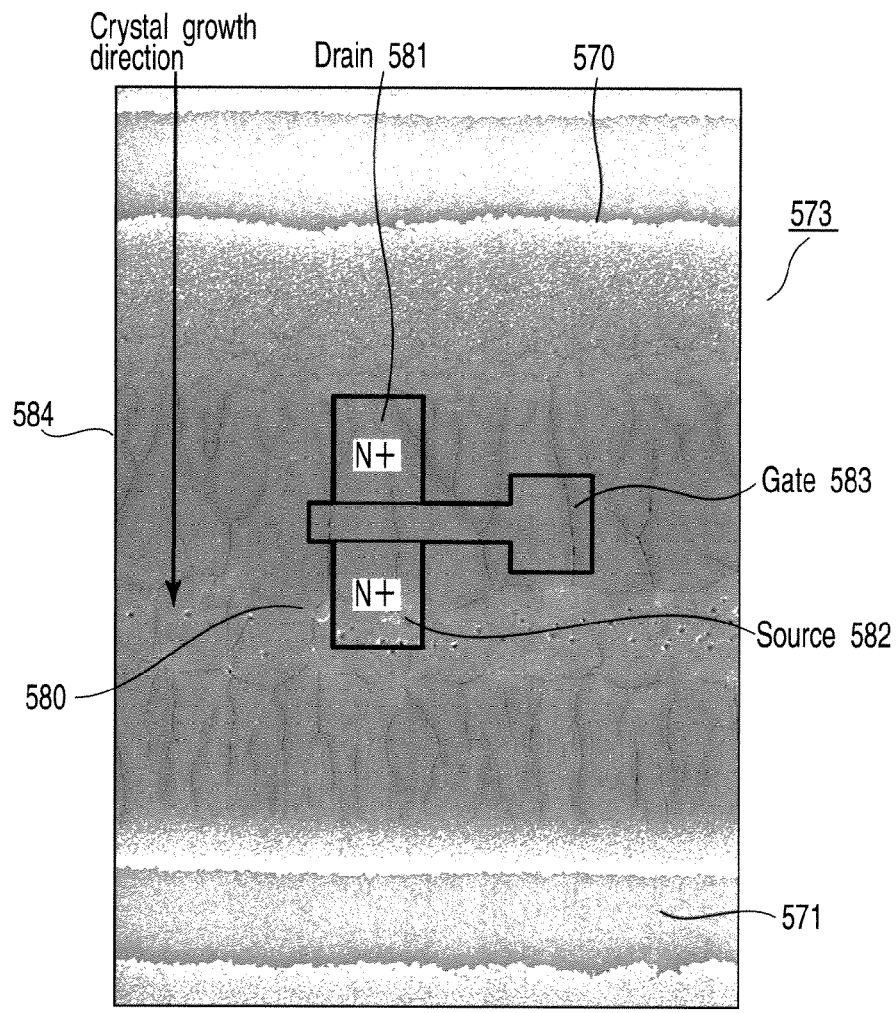
FIG. 23 shows an electron microscopic image of an Si crystal film in a fifth embodiment of the invention, and a schematic diagram of a MOS thin-film transistor, which is laid over the electron microscopic image.
Figure 24:
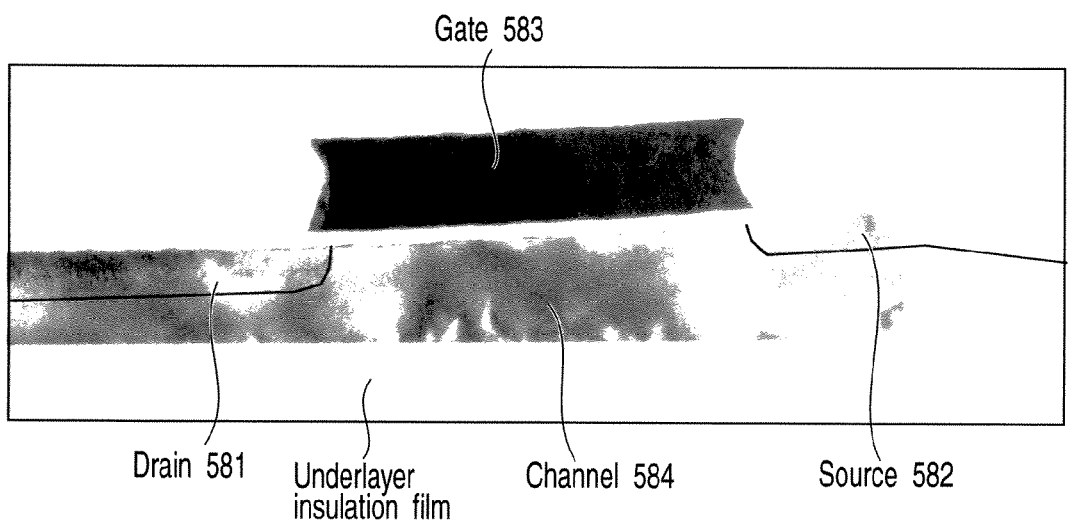
FIG. 24 shows a cross-sectional transmissive electron microscopic image of the MOS thin-film transistor shown in FIG. 23 according to the invention.

Embodiment Relating to the MOS Transistor Formed in the Crystallized Semiconductor Thin Film FIG. 23 is a schematic plan view showing an embodiment of a MOS transistor which is formed in a crystallized semiconductor thin film having the same structure as shown in FIG. 19. In this embodiment, in particular, this transistor is arranged such that the source-drain direction, in which a current flows, is parallel to the direction of crystal growth. Thereby, the flow of carriers is not hindered by crystal grain boundaries, and better characteristics are obtained. In the arrangement of this embodiment, the drain is positioned near the crystal growth start point and the source is positioned near the crystal growth termination point. Like the case of the bipolar transistor, this arrangement is defined as "forward-arrangement". On the other hand, the arrangement in which the positions of the drain and source are reversed is defined as "reverse-arrangement". FIG. 24 is a cross-sectional transmissive electron microscopic image of the MOS thin-film transistor that is disposed in this fashion.

Figure 25A:
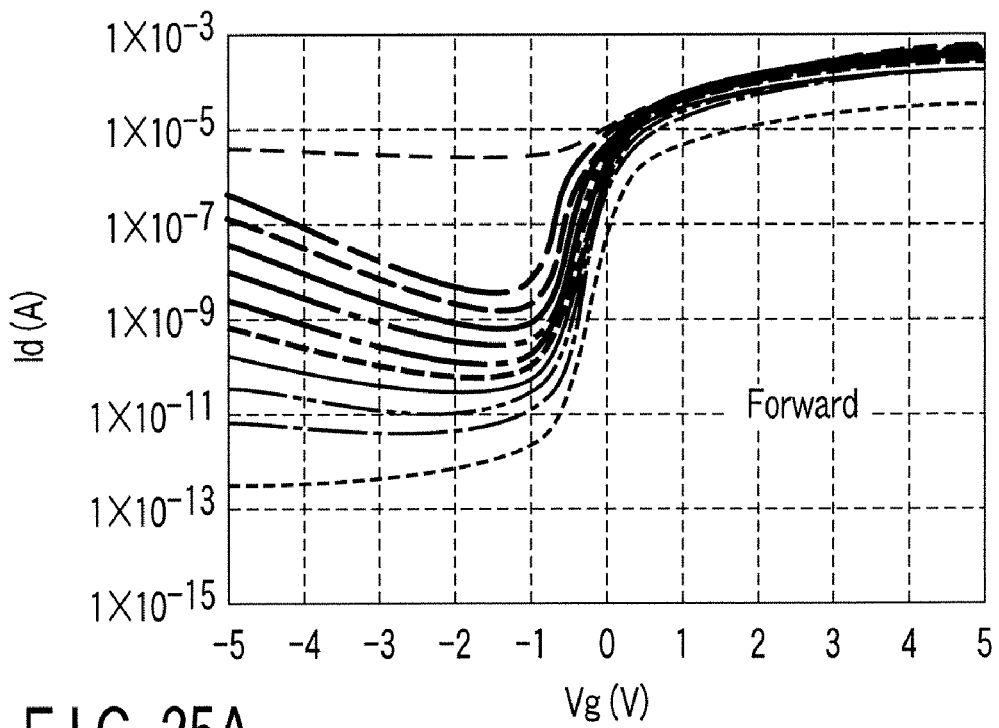
FIG. 25A is a graph showing ID-VG characteristics of the MOS thin-film transistor (forward-arrangement) shown in FIG. 23 according to the invention.
Figure 25B:
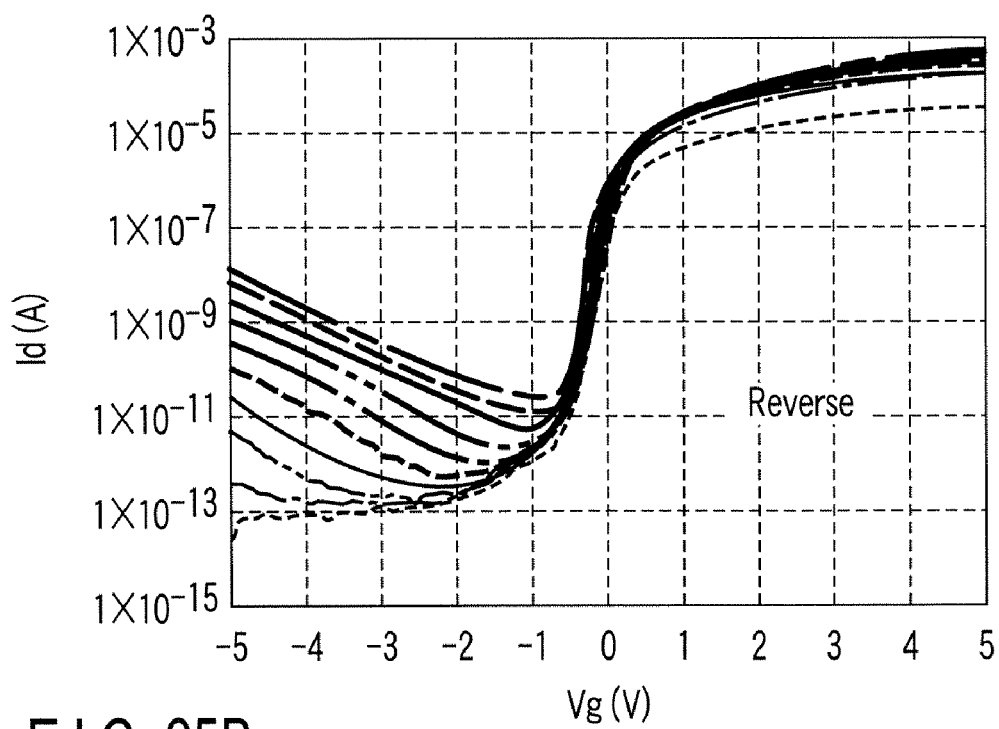
FIG. 25B is a graph showing ID-VG characteristics of the MOS thin-film transistor (reverse-arrangement) shown in FIG. 23 according to the invention.
Figure 26:
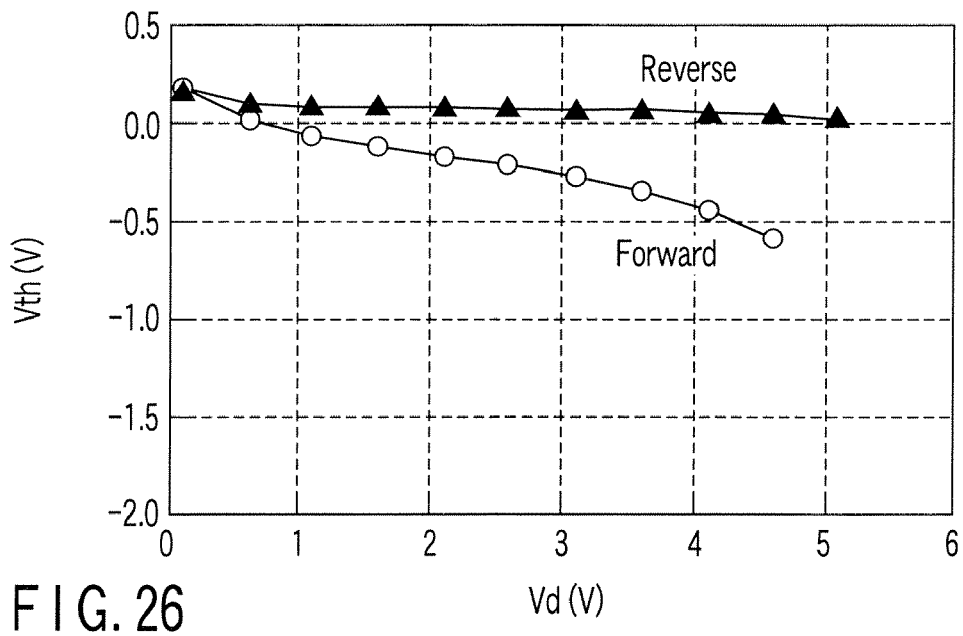
FIG. 26 is a graph showing the drain voltage dependency of a threshold voltage Vth of the MOS thin-film transistor shown in FIG. 23 according to the invention.

FIG. 25A and FIG. 25B show ID-VG characteristics of the thus fabricated MOS transistor, which were measured by varying the source-drain voltage between 0.1V and 5.1V in the forward-arrangement and the reverse-arrangement. FIG. 26 shows a result obtained by plotting the threshold voltage Vth of the transistor as a function of the drain voltage on the basis of the results shown in FIG. 25A and FIG. 25B.

In the reverse-arrangement, the drain voltage dependency of Vth is low. In the forward-arrangement, the Vth decreases as the drain voltage increases, and the Vth takes a negative value when the drain voltage is 0.5V or more. It is also understood that the drain voltage dependency of leak current is greater in the forward-arrangement in the region in which the gate voltage is negative.

It is considered that the decrease in Vth results from the potential variation of the body due to a drain-junction leak current. It is considered that the Vth, which gently lowers in the middle-level Vd region in the forward-arrangement, is associated with a body potential variation due to both drain leakage and impact ionization. The difference in degree of decrease in Vth between the forward-arrangement and reverse-arrangement indicates that the intensity of body potential variation differs between the two arrangements.

If the Vth decreases in accordance with the increase in drain voltage, a large punch-through current undesirably flows due to the drain voltage that is actually used in the electronic device. It was found by a detailed analysis that this asymmetry of the drain current dependency of Vth occurs due to the leak current at the drain junction and source junction and the asymmetry of current amplification factor β, as shown in FIG. 21A, FIG. 21B and FIG. 22. FIG. 21A and FIG. 21B show the variation of β relative to the Vbs. Attention should be paid to the fact that the β differs about 5 times between the forward-arrangement and the reverse-arrangement. It is considered that since both the leak current at the junction and the bipolar gain are different, the asymmetry occurs in the decrease in Vth in the case where the source region and drain region are reversed.

From the above result, it is desirable that in the case where the MOS transistor is formed on the crystal that is grown in one direction, the MOS transistor should be formed such that the source region is positioned near the crystal growth start point and the drain region is positioned near the crystal growth termination point. Thereby, the drain voltage dependency of Vth and the drain leak current can be reduced. If the thin-film transistor, which is formed in the crystal region, is fabricated such that a current flows in the crystal growth direction, the thin-film transistor having good mobility characteristics can be obtained.

Sixth Embodiment

Embodiment Relating to a Current-Driving Type Interface

Figure 27:
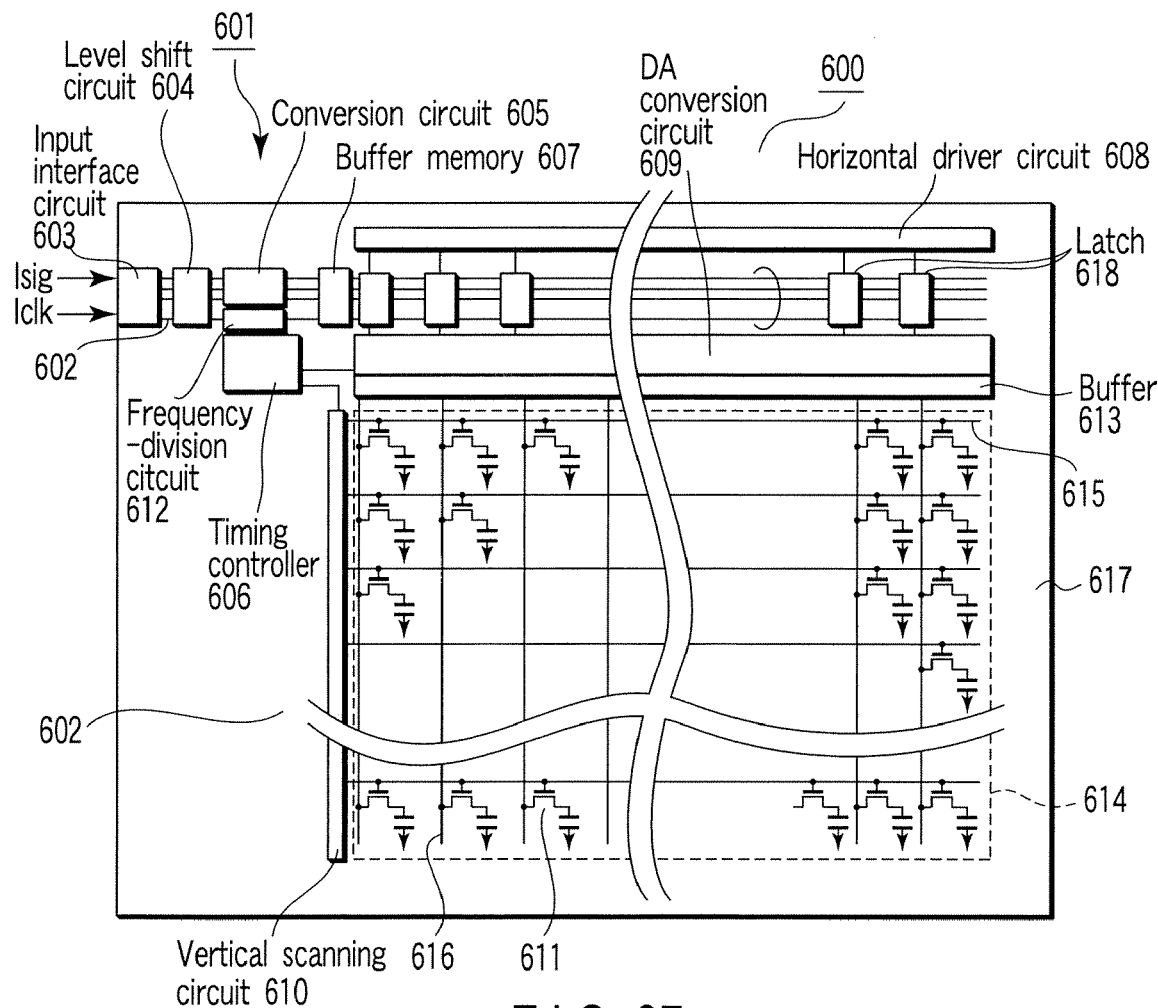
FIG. 27 shows the entire structure of a liquid crystal display device according to a sixth embodiment of the invention.

As has been described above, the lateral bipolar transistor 100 or hybrid transistor 200, which is formed in the crystallized semiconductor thin film formed on the glass substrate, as shown in FIG. 1A or FIG. 6, is different from the ordinary bipolar transistor. These transistors are not used in an electronic circuit that requires a large driving current, but are suited to amplification of a relatively small current. It is thinkable that these transistors are applicable to a current-driving-type serial interface in a display device 600 that makes use of this feature. FIG. 27 shows an example of a front-end circuit 601 of such a current-driving-type interface. FIG. 27 is a circuit structure diagram showing an embodiment which is applied to an amplification circuit that amplifies a small current of 100 μA or less flowing in an antenna, for example, when a radio signal is received by the antenna and converted to an electric signal, as an input to a display device such as a liquid crystal display device of a liquid crystal TV or a terminal. The small current flowing in the antenna is indicated by Isig. The feature of this embodiment is that the amplification circuit is composed of a thin-film transistor circuit. Such a small current of 100 μA or less is amplified by a current-amplification type thin-film transistor circuit which is formed in the semiconductor thin film that is formed on the insulating substrate, and the amplified current is voltage-amplified by a voltage-amplification type thin-film transistor circuit.

The current-amplification type thin-film transistor circuit is characterized by being composed of the above-described lateral bipolar transistor 100 or hybrid transistor 200, which is formed in the crystallized semiconductor thin film on the insulating substrate, e.g. a glass substrate. The current-amplification type thin-film transistor circuit functions both as an interface circuit and as a circuit for converting a current input signal to a voltage output signal. The voltage-amplification type thin-film transistor circuit is composed of a MOS thin-film transistor circuit which is formed in a crystallized region or a non-crystallized region of the semiconductor thin film.

Specifically, if the resolution and the number of colors of an image increase, the amount of data to be transmitted increases accordingly. However, since the refresh speed of image display is fixed, the clock frequency of a transmission path 602 needs to be increased if the amount of data increases. In this way, if the frequency of the transmission path 602 increases, such a problem arises that unwanted electromagnetic radiation occurs from the transmission path and noise is caused in an external device due to electromagnetic interference (EMI). To solve this problem, a method is adopted in which EMI is reduced by low-voltage differential driving, which is known as, e.g. LVDS (Low Voltage Differential Signaling). An example of this technique is disclosed in, e.g. Jpn. Pat. Appln. KOKAI Publication No. 2002-176350. In addition, in recent years, as a transmission scheme that is capable of more effectively reducing EMI, there has been proposed a serial interface by current driving. One example is disclosed in Jpn. Pat. Appln. KOKAI Publication No. 2003-76345. In the circuit shown in FIG. 27, it is assumed that a current signal Isig of two values, or two or more values, is supplied from the system side. An input interface circuit (IF) 603 is configured to receive the signal Isig and to convert it to a voltage signal. A level shift circuit 604 executes voltage amplification of the voltage signal, and delivers the amplified voltage to a subsequent serial/parallel conversion circuit 605. The feature resides in that a lateral bipolar transistor, which is formed in the crystallized semiconductor thin film, is used in the input section of the input interface circuit. The above-described lateral bipolar thin-film transistor may be replaced with a MOS-bipolar hybrid thin-film transistor which is formed in the crystallized semiconductor thin film (the same applies to other embodiments to be described later).

FIG. 28 shows an example of the circuit configurations of the input interface circuit (IF) 603 and level shift circuit 604 shown in the block diagram of FIG. 27. The input section is configured such that an emitter-grounded lateral bipolar thin-film transistor Q1 and a gate-grounded MOS thin-film transistor M1, which are formed in the crystallized semiconductor thin film, are cascode-connected. The first-stage transistor Q1, which is a current amplification section, current-amplifies the input signal Isig. The input signal is then converted to a voltage signal by the second-stage MOS thin-film transistor M1 and a load resistor Rd. Subsequently, the voltage signal is input to the level shift circuit 604 which is composed of a CMOS inverter at the third stage. By using the bipolar thin-film transistor Q1 with the high amplification factor, which can directly amplifies the current in the input section, the level of the input signal current Isig can be lowered. Thus, the power consumption on the signal transmission system side (not shown) can be reduced. In this example, the lateral bipolar thin-film transistor Q1 and MOS thin-film transistors M1 to M3 according to the present invention are formed on a substrate 617 on which the display device 601 is formed, whereby the input interface circuit (IF) 603 and level shift circuit 604 of the display device are constituted. In the current amplification section, the lateral bipolar thin-film transistor may be replaced with the MOS-bipolar hybrid transistor according to the invention. Preferably, the maximum value of the current amplification factor of the lateral bipolar thin-film transistor or MOS-bipolar hybrid thin-film transistor should be 10 or more, when these transistors are used in the input interface circuit.

Figure 29:
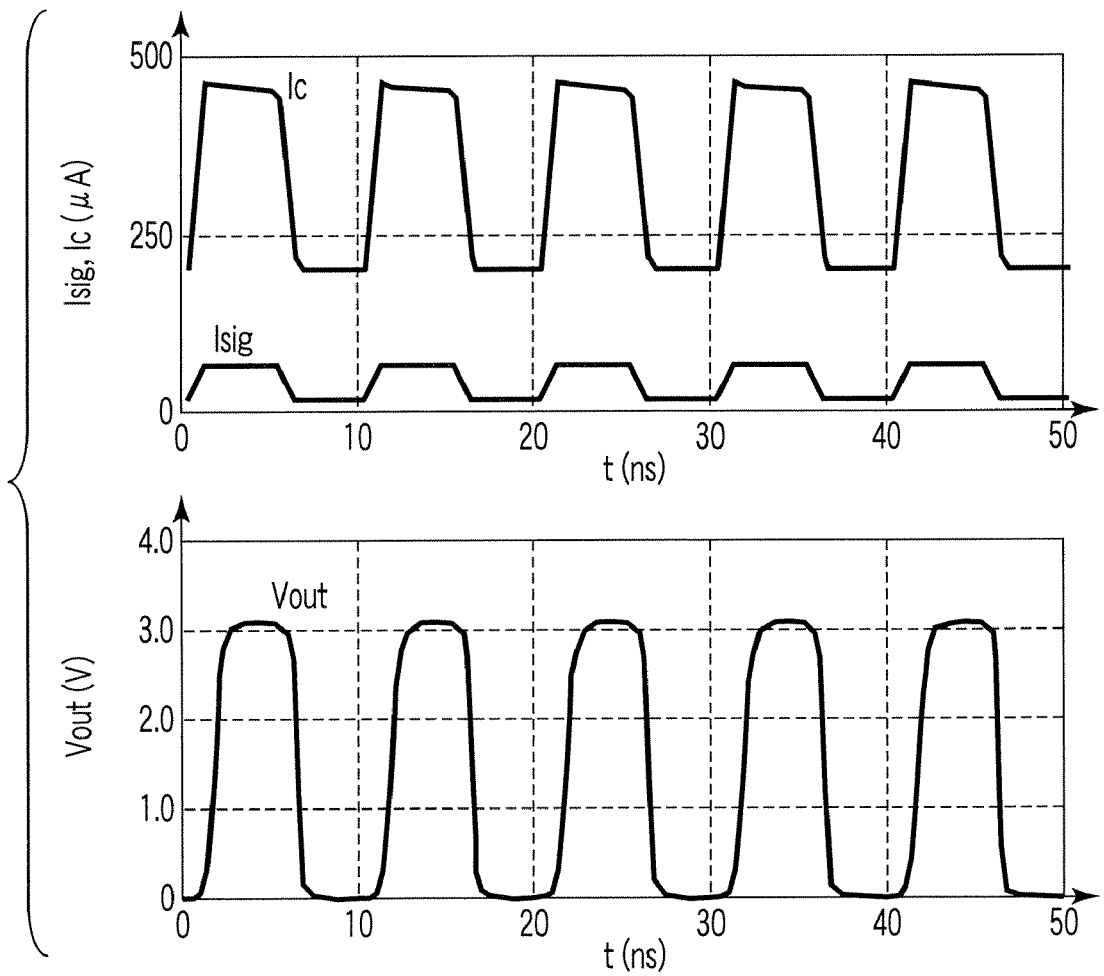
FIG. 29 shows an input current waveform, a collector current waveform and an output voltage waveform of the signal interface circuit according to the sixth embodiment of the invention.

FIG. 29 shows signal waveforms of the input current signal Isig, a collector current Ic flowing in the lateral bipolar thin-film transistor Q1 and an output voltage Vout of the level shift circuit 604 in the circuit shown in FIG. 28. Since the level of the small current Isig is very low and is 0 to 70 µA, the EMI of the input section can be minimized. In addition, the small current signal of 0 to 70 µA can be converted to a voltage signal of 0 to 3V by a very simple circuit comprising the four transistors Q1, M1, M2 and M3.

In the present embodiment, the cascode-connected circuit of the lateral bipolar thin-film transistor Q1 and MOS thin-film transistor M1 is used in the input interface circuit 603, and the CMOS inverter is used in the level shift circuit 604. However, the circuit configurations are not limited to this example, and an ordinary differential amplification circuit, for instance, may be used.

FIG. 27 shows the structure of the entire liquid crystal display device including the input interface circuit 603 and level shift circuit 604, as described above. The interface circuit 603 shown in FIG. 27 and FIG. 28 receives not only a video signal, but also a clock signal Iclk, a control signal, etc., as current signals, and converts them to voltage signals. The signals are supplied to the level shift circuit 604, which follows the interface circuit 603, and are adjusted to proper voltage levels. The video signal is converted to a parallel signal by the serial/parallel conversion circuit 605.

The clock signal Iclk is frequency-divided by a frequency-division circuit 612 in accordance with the degree of parallel conversion, and the frequency-divided signal is delivered to a timing controller 606. The parallel-converted video signal, together with the frequency-divided clock signal, is delivered to a horizontal driver circuit 608 via a buffer memory 607. In the horizontal driver circuit 608, the video signal is latched at a proper timing, and is delivered to a DA conversion circuit 609 which is provided in association with each signal line. The DA conversion circuit 609 converts the video signal to an analog signal and supplies it to the display section. In the display section, a switch transistor 611, which is provided in each pixel, is turned off/off by a scanning signal that is supplied from a vertical scanning circuit 610, and the analog voltage from the horizontal driver circuit is supplied to the liquid crystal layer, and an image is displayed by an active-matrix display unit 614.

Figure 30:
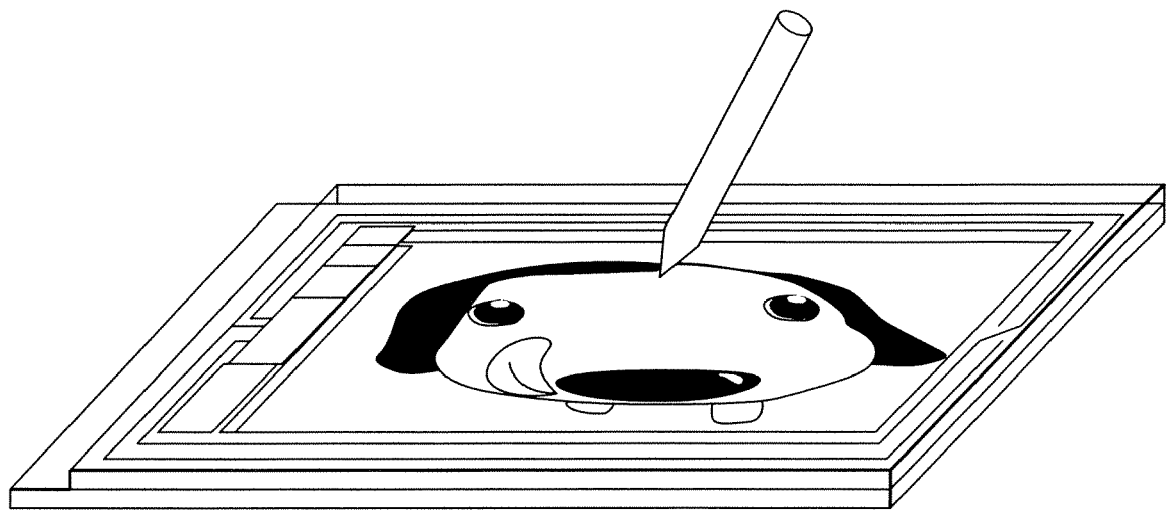
FIG. 30 is a perspective view of a liquid crystal display device according to the sixth embodiment of the invention.
Figure 31:
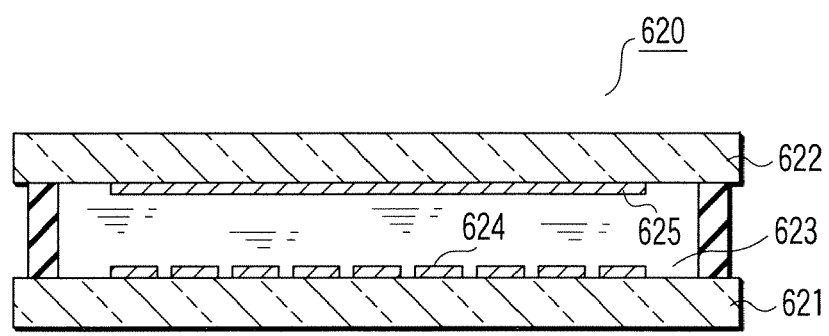
FIG. 31 is a cross-sectional view of the liquid crystal display device according to the sixth embodiment of the invention.

FIG. 30 is a birds-eye view of an entire liquid crystal display device 620. FIG. 31 is a cross-sectional view of the liquid crystal display device 620. A liquid crystal material 623 is disposed between transparent insulating substrates 621 and 622. A plurality of pixel electrodes 624, which are driven by the active-matrix circuit shown in FIG. 27 and are arrayed in a matrix, are formed on the transparent substrate 621. A counter-electrode 625 is disposed on the transparent insulating substrate 622. The potential of each pixel electrode 624 is controlled by the switch transistor 611 shown in FIG. 27. The optical characteristics of the liquid crystal material 623 are controlled by controlling the potential that is applied to the liquid crystal material 623 disposed between the counter-electrode 625 and the pixel electrodes 624.

By adopting the current-driving-type input interface and using the lateral bipolar thin-film transistor Q1 in the input circuit 603 on the display device side, signal transmission is enabled at a lower signal level than in the prior art. Therefore, the EMI and the power consumption of the entire system can be reduced. Moreover, in the present system, the transmission frequency can be increased by virtue of low EMI of the current interface. Therefore, the present system is advantageously applicable to a liquid crystal display device with a high definition and a large number of gray levels.

Furthermore, in the present embodiment, the signal transmission by current driving is applied, by way of example, to the transmission path between the display external system (not shown) and input section 603 of the display substrate 617. The present invention, however, is not limited to this example, and the invention is applicable to signal transmission in a circuit block within an active-matrix substrate. For example, in a case where the horizontal driver circuit is composed of a plurality of blocks, the signal transmission of this invention is applicable to signal transmission between the respective blocks.

Seventh Embodiment

Figure 32:
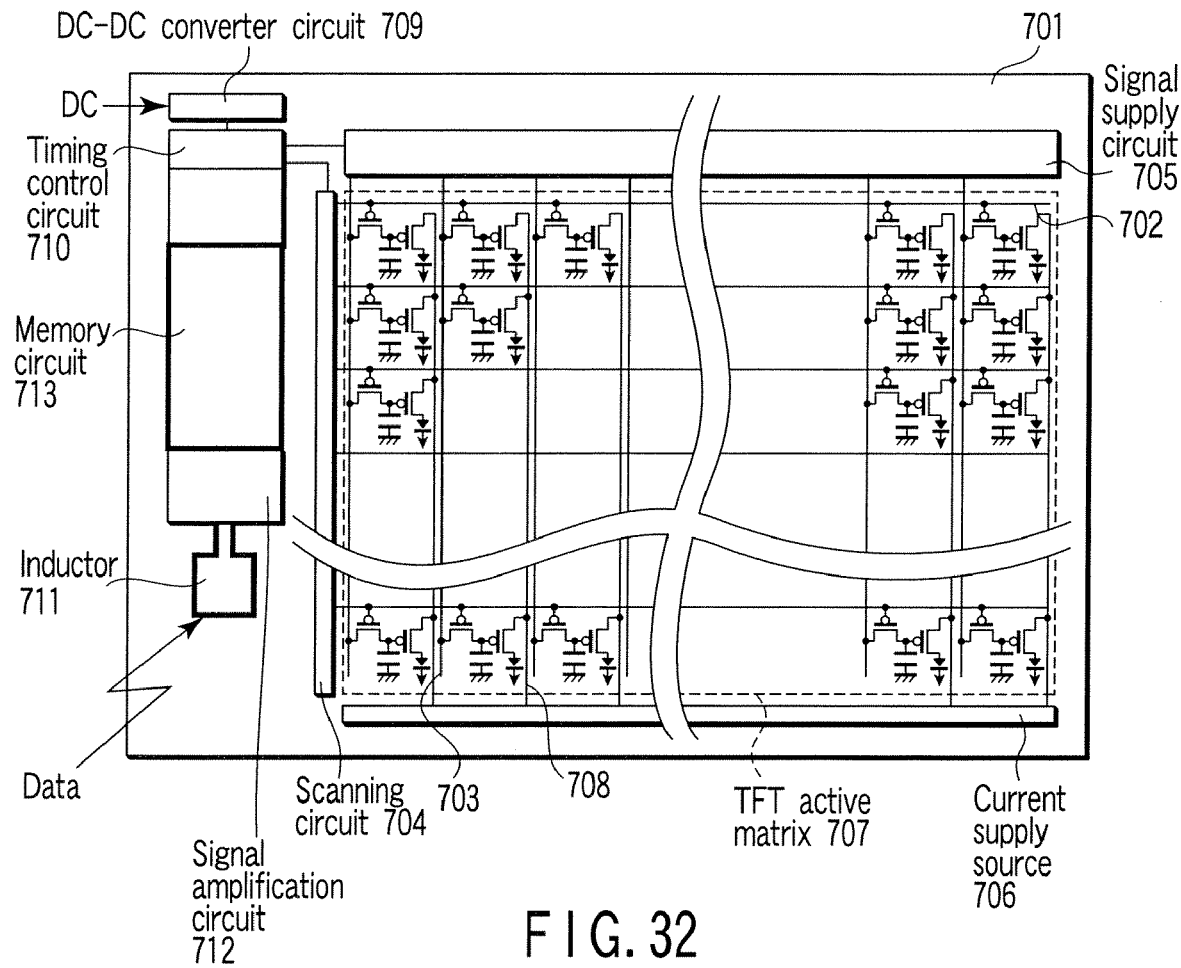
FIG. 32 shows the entire structure of a liquid crystal display device according to a seventh embodiment of the invention.

Embodiment Relating to an Active-Matrix Liquid Crystal Display Device Using Organic LEDs FIG. 32 shows the structure of an active-matrix display device according to a seventh embodiment of the present invention. In this display device, an inductor element 711 is used for receiving an input signal, and organic LED elements are used as display elements. A plurality of scanning lines 702 and a plurality of video signal lines 703 are arranged in a matrix on a no-alkali glass substrate 701. In addition, a TFT active-matrix display section 707, in which two P-type thin-film transistors and a capacitor element are disposed in each of rectangular pixel regions defined by the scanning lines 702 and video signal lines 703, and a scanning circuit 704 and a signal supply circuit 705, which are composed of TFTs and drive the TFT active-matrix display section 707, are disposed on the no-alkali glass substrate 701.

In this embodiment, an electric current is supplied to organic LED elements that constitute pixels, thereby causing the organic LED elements to emit light, and executing a display operation. A current supply source 706, which supplies a current to the organic LED elements, is configured to supply, through current supply lines 708, a current to the transistors which are formed on the same substrate within the TFT active-matrix display section 707.

In this embodiment, an ordinary DC-DC converter circuit 709, which converts an externally supplied power supply voltage DC and supplies a voltage necessary for the driving circuits 704 and 705, and an ordinary timing control circuit 710, which receives video data, control signals, etc., executes necessary processing for them and supplies the processed data, control signals, etc. to the driving circuits 704 and 705, are also composed of the TFTs according to the invention and are integrated on the glass substrate.

In the present embodiment, an inductor 711, which is composed of a metal thin film, is formed on a region of the glass substrate 701 at a position outside the TFT active-matrix display section 707 as an element for receiving compressed image data that is supplied from outside. The inductor 711 is connected to a data processing circuit including an ordinary signal amplification circuit 712 and an ordinary expansion circuit for expanding compressed data. In addition, an ordinary semiconductor memory circuit 713, which temporarily stores compressed image data and is used at a time of data expansion processing, is formed of TFTs, which are formed in the crystallized semiconductor thin film, at a position neighboring the data processing circuit. These circuits and memory circuit 713 are all composed of TFTs formed on the glass substrate.

Figure 33:
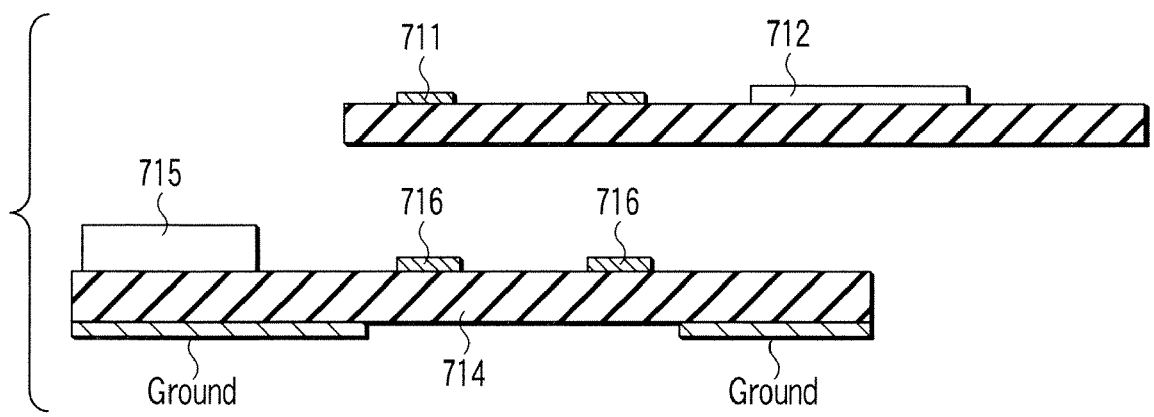
FIG. 33 is a schematic cross-sectional view of an inductive-coupling type non-contact transmission path in the seventh embodiment of the invention.

FIG. 33 is a schematic cross-sectional view of an inductive-coupling type non-contact transmission path which is constituted by the inductor element 711 formed on the display substrate and another inductor element TL formed on a substrate 714 that constitutes a data-transmission-side system.

An image data transmission circuit 715 and an inductor 716 with self-inductance L1 are formed on the system substrate 714, and the inductor 716 is disposed substantially coaxial with the inductor 711 with self-inductance L2 that is formed on the display substrate. A signal voltage from the image data transmission circuit 715 is transmitted from the inductor 716 to the inductor 711 via a mutual inductance Lm therebetween, and the transmitted signal voltage is amplified by the TFT in the data processing circuit and stored in the memory.

FIG. 34 shows a circuit configuration in which a lateral bipolar thin-film transistor Q1, which is formed in the crystallized semiconductor thin film, is used in the amplification circuit 712 which is a current amplification section of a signal that is received by the inductor 711 in the above-described system.

In the present system, a signal transmission path is formed by electromagnetic coupling (coupling coefficient: k) between the two mutually opposed inductors 716 and 711. In the transmission circuit, a signal is generated by varying a current, which is supplied to the transmission-side inductor 716, in a range of between 0 and 2 mA. In the reception-side inductor 711, a current that is proportional to the current variation ratio of the Isig and the coupling coefficient k occurs only while the Isig is varying. This signal has a small amplitude of several μA, and it is difficult to directly convert the signal to a voltage by the MOS-type TFT circuit.

Thus, as shown in FIG. 34, the signal current is once amplified by the lateral bipolar thin-film transistor Q1 that is formed in the crystallized semiconductor thin film, and the amplified current is converted to a voltage signal by the cascode-connected MOS thin-film transistor M1 and resistor Rd. The resultant voltage is supplied to and amplified by an amplification circuit 717. In FIG. 34, R1 and R2 are resistors for supplying a bias current to the lateral bipolar thin-film transistor Q1. In the present circuit, since the amplitude of the current that is detected by the inductor 711 is small, a bias current is supplied to the lateral bipolar thin-film transistor Q1 so that the transistor Q1 is set at a proper operation point. In the current amplification section, the lateral bipolar thin-film transistor may be replaced with the MOS-bipolar hybrid transistor according to the invention. Preferably, the maximum value of the current amplification factor of the lateral bipolar thin-film transistor or MOS-bipolar hybrid thin-film transistor should be 10 or more, for example, when these transistors are used in the current amplification section.

Figure 35:
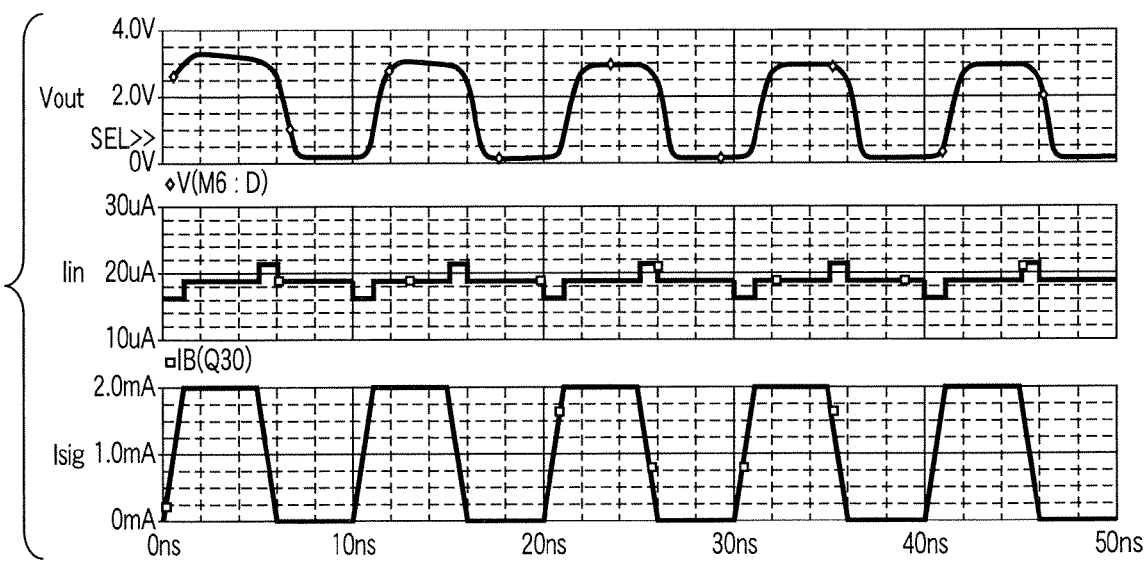
FIG. 35 shows a signal current waveform, a detection current waveform and an output voltage waveform of the signal interface circuit in the seventh embodiment of the invention.

FIG. 35 shows waveforms of the current Isig of the input signal transmission inductor, the small current Iin of 100 μm or less flowing in the reception inductor, and the output voltage Vout of the amplification circuit. It is understood that proper signal transmission, including amplification of current and voltage, is performed. In the non-contact type signal transmission system using the inductor 711 as in the present embodiment, a signal of a lower level can be detected by using the lateral bipolar thin-film transistor which is formed in the crystallized semiconductor thin film. Therefore, a noise margin at a time of transmission can be secured, and a transmission speed can be increased.

Eighth Embodiment

Embodiment Relating to a Display Substrate Including a Light-Receiving Circuit

FIG. 36 and FIG. 37 show a display substrate 721 and a light-receiving circuit 722 according to an eighth embodiment of the present invention. Non-contact signal transmission is performed by optical coupling using a photosensor 723 that is formed of, e.g. a photodiode, instead of the capacitive coupling or electromagnetic coupling using the inductor. In this embodiment, an optical transmission path (not shown) is used as transmission means. Instead of the capacitive coupling or electromagnetic coupling using the inductor, the photosensor 723 is integrated on a display substrate 721. FIG. 37 shows an example of the structure of the circuit that includes a current amplification section which receives a signal current from the photosensor and amplifies the signal current. In this example, the circuit comprises a photodiode 723 which is formed of a single-crystal silicon thin film, and an interface circuit 724. The interface circuit 724 has the same structure as in the seventh embodiment. A current signal from the photodiode 723 is current-amplified and converted to a voltage signal, and the voltage signal is delivered to the serial/parallel conversion circuit.

By using light as signal transmission means, the effect of electromagnetic noise can be eliminated. In addition, a good SN ratio can be achieved by using the lateral bipolar thin-film transistor or the MOS-bipolar hybrid transistor, which is formed in the crystallized semiconductor thin film, in the input section. Hence, the transmission speed can be enhanced. In particular, by using the photodiode which is formed in the crystallized silicon thin film on the transparent glass substrate, a signal can be received regardless of whether the transmission circuit is disposed on the front surface or back surface of the glass substrate. Therefore, the degree of freedom of mounting design can be increased.

Ninth Embodiment

Embodiment Relating to a Signal Interface Circuit

Figure 38:
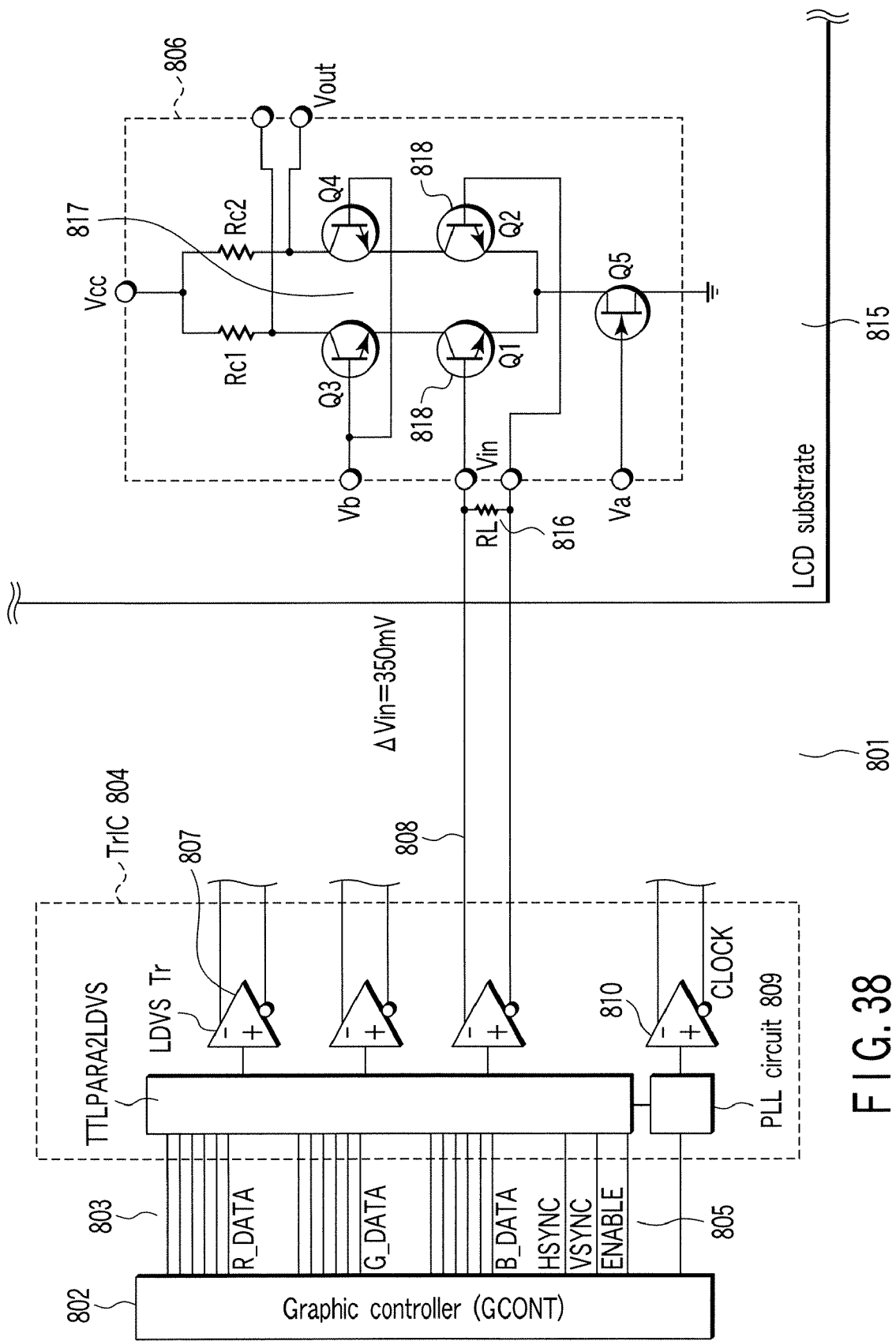
FIG. 38 shows the structure of a signal interface circuit according to a ninth embodiment of the invention.

FIG. 38 shows an example 802 of the structure of a signal interface circuit, which is different from the structure of the signal interface circuit 724 according to the embodiment of the invention shown in FIG. 34 or FIG. 37. In this embodiment, a reception-side circuit of an interface circuit of a standard LVDS (Low-Voltage Differential Signaling) scheme is composed of a cascode-type differential amplification circuit 806 which uses the bipolar thin-film transistor or hybrid thin-film transistor according to the present invention.

Video data from the system side, together with control signals (HSYNC, VSYNC, ENABLE SCLOCK) 805, are sent from a graphic controller (GCONT) 802 to a standard LDVS transceiver IC (TrIC) 804, which is mounted on a system-side board, as 18-bit parallel data 803 of 6 bits×3 (corresponding to the three colors of RGB). The signal level in this case is a CMOS level of 3.3V. The transceiver IC executes parallel-serial conversion for converting 6-bit parallel data of each color to serial data, and a process of converting the input signal with the signal level of a 3.3V amplitude to a differential signal of a low amplitude of 0.35V, and delivers the differential signal from a transmission amplifier (LDVS) 807 to a transmission line 808.

The clock signal (SCLOCK) is subjected to a clock multiplication process and phase adjustment in a PLL circuit 809, and is similarly output from a transmission amplifier (CLOCK) 810 to a transmission line.

The transmission line is a balanced-type differential transmission line, and is characterized by robustness against external noise. In addition, since the amplitude of the transmission signal is 0.35V and small, the electromagnetic interference can be reduced.

On an LCD substrate 815, the transmitted differential signal 808 is applied via a terminal resistor (RL) 816 of 100Ω to bases 818 of bipolar transistors Q1 and Q2, which are structural components of a first-stage amplifier 817 and are formed in the crystallized semiconductor thin film. The first-stage amplifier 817 is a cascode-type differential amplification circuit 806 which comprises four bipolar transistors Q1 to Q4 that are formed in the crystallized semiconductor thin film, load resistors Rc1 and Rc2 and a MOSFET (Q5) which functions as a constant voltage source. The transistors Q1 to Q4 may be the above-described lateral bipolar thin-film transistors 100 (see, e.g. FIG. 1A and FIG. 1B) formed on the crystallized Si thin film or the hybrid thin-film transistors 200 (see, e.g. FIG. 6 and FIG. 7) formed on the crystallized Si thin film.

Since the voltage amplitude of the input signal is small, it is difficult to detect such a small signal by the MOS FET formed on the Si thin film, which has a large variance in threshold voltage. Thus, in general, the conventional first-stage amplifier uses a dedicated LVDS receiver that is fabricated on an Si wafer.

In the present embodiment, the differential amplifier 817 is composed of the bipolar TFTs that are formed in the crystallized semiconductor thin film. Thereby, the detection sensitivity of the input can be improved by more than an order of magnitude. Therefore, the conventionally used LVDS receiver IC can be dispensed with, and the cost of the LCD panel can effectively be reduced. Furthermore, since a signal can be received as such from a transmitter of standard LVDS specifications, a general-purpose transmitter IC is usable and there is no need to modify a system-type interface. This also contributes to reduction in cost.

The structure of the present circuit is also applicable to the current detection interfaces 603 and 724 as shown in FIG. 28, FIG. 34 and FIG. 37.

Tenth Embodiment

Embodiment Relating to A Memory Circuit Using Bipolar TFTs

Figure 39:
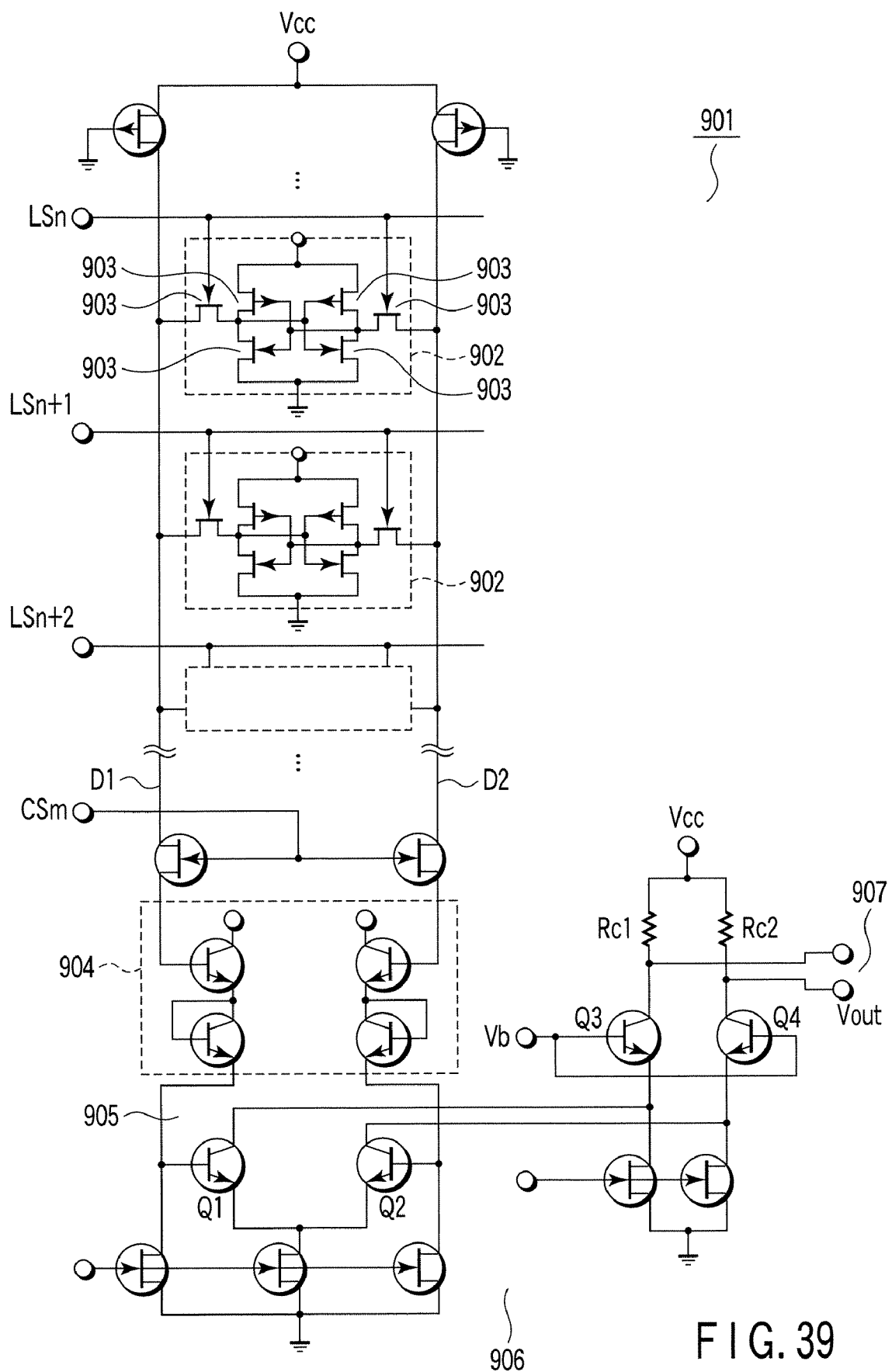
FIG. 39 shows a memory circuit which makes use of a bipolar TFT according to a tenth embodiment of the invention.

FIG. 39 shows an embodiment of a memory circuit which uses bipolar TFTs formed in a crystallized semiconductor thin film, which are particularly effective in the display, as shown in FIG. 32, in which the memory circuit 901 is provided on the glass substrate. The memory circuit according to this embodiment relates to a static RAM (SRAM) which is configured such that one memory cell 902 is composed of six MOS FETs 903. A memory array is formed by arranging an N-number of rows of memory cells 902 and an m-number of columns of memory cells 902 in a matrix. FIG. 39 shows only one column of memory cells 902. One column is selected by a column selection signal CSm. Further, a row selection signal is applied to, for example, LSn. Accordingly, a memory cell in the n-th row is selected, and bit information stored in the memory cell, which is selected by a pair of data lines D1 and D2, is output. As a result, the potential of the data lines D1 and D2 varies. The output signal is shifted by 2Vbe (Vbe is a base-emitter voltage of the bipolar TFT) by a level shift circuit 904 in which two diodes are connected. The level-shifted signal is input to the bases of paired differential transistors Q1 and Q2 of a sense amplifier 905.

The transistors Q1 and Q2, together with similar bipolar TFTs Q3 and Q4 and load resistors Rc1 and Rc2, constitute a cascode-type differential amplifier 906. An amplified signal is output from Vout 907 and is input to a subsequent-stage circuit.

In the case where the sense amplifier of the memory circuit is composed of the bipolar TFTs, as described above, which are formed in the crystallized semiconductor thin film, a smaller voltage variation can be detected than in the case where the sense amplifier is composed of MOSFETs. Since the time, which is consumed until a voltage is amplified up to a sufficiently high value, is not needed, a high-speed access can be executed. In particular, in the case where the sense amplifier is composed of MOSFETs that are formed on an Si thin film, a circuit structure for canceling the non-uniformity in threshold voltage is indispensable, and the time for the operation of canceling the threshold voltage is needed. Consequently, the access time of the memory becomes very long. This problem can be solved by using the bipolar TFTs that are formed in the crystallized semiconductor thin film, and high-speed access is enabled.

In the above embodiment, the SRAM has been described by way of example. However, the same advantageous effects can be obtained with the similar structure in the case of using a dynamic RAM (DRAM). In the case of the DRAM, the potential difference between two data lines, which is to be detected, becomes smaller, and thus a greater effect of high-speed access can be obtained by using the bipolar TFTs that are formed in the crystallized semiconductor thin film.

Eleventh Embodiment

Another Embodiment of the Hybrid TFT

Figure 40:
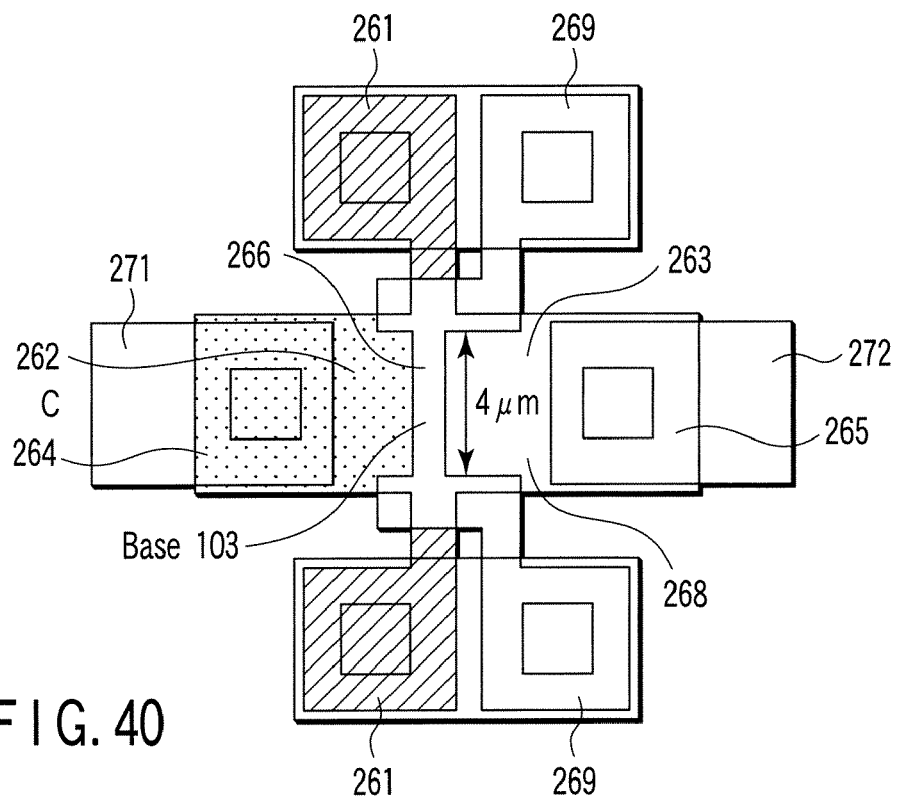
FIG. 40 shows a plan-view pattern of a hybrid TFT according to another embodiment of the invention.

FIG. 40 shows a plan-view pattern of a hybrid TFT according to another embodiment of the present invention. This TFT is formed on an Si island 268 which is depicted in a horizontally elongated rectangular shape in FIG. 40. The cross-sectional structure of this embodiment is substantially the same as shown in FIG. 7. In the plan-view structure of this embodiment, like the structure shown in FIG. 3A, base contact portions 261 are led out from both side surfaces of a base region 103 and are connected to a gate electrode 266. The width of the base region 103 is 4 μm. With this structure, the entire base region 103 functions as an effective region of the bipolar transistor. Therefore, the collector current can be increased.

An emitter 262 and a collector 263 are formed at both ends of the base region 103. The emitter 262 and collector 263 function as a source 264 and a drain 265 when this hybrid TFT operates as a MOS transistor. A gate 266 is formed over the base region 103 via a gate insulation film (not shown). The gate 266 is connected to another element via a gate electrode 269. Reference numeral 271 denotes an emitter (source) electrode, and 272 denotes a collector (drain) electrode.

Figure 41A:
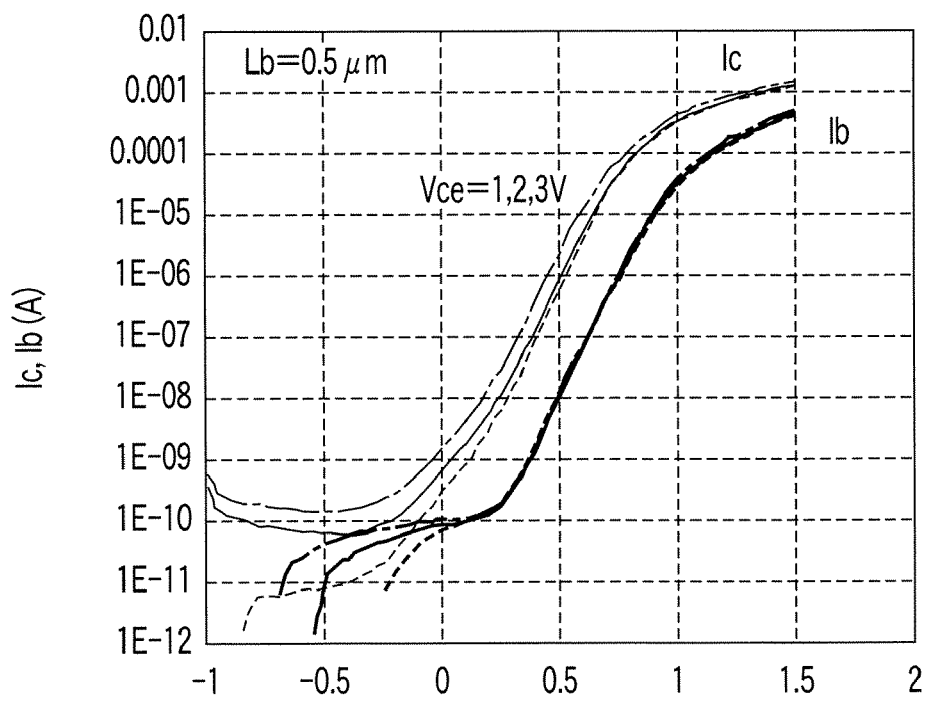
FIG. 41A is a graph showing Gummel plots of a TFT in which 18 hybrid TFTs shown in FIG. 40 are connected in parallel.

FIG. 41A is a graph showing Gummel plots of a TFT in which 18 hybrid TFTs shown in FIG. 40 are connected in parallel. The base length Lb is 0.5 μm. The abscissa in FIG. 41A indicates a base-emitter voltage (Vbe), and the ordinate indicates a base current (Ib) and a collector current (Ic).

Figure 41B:
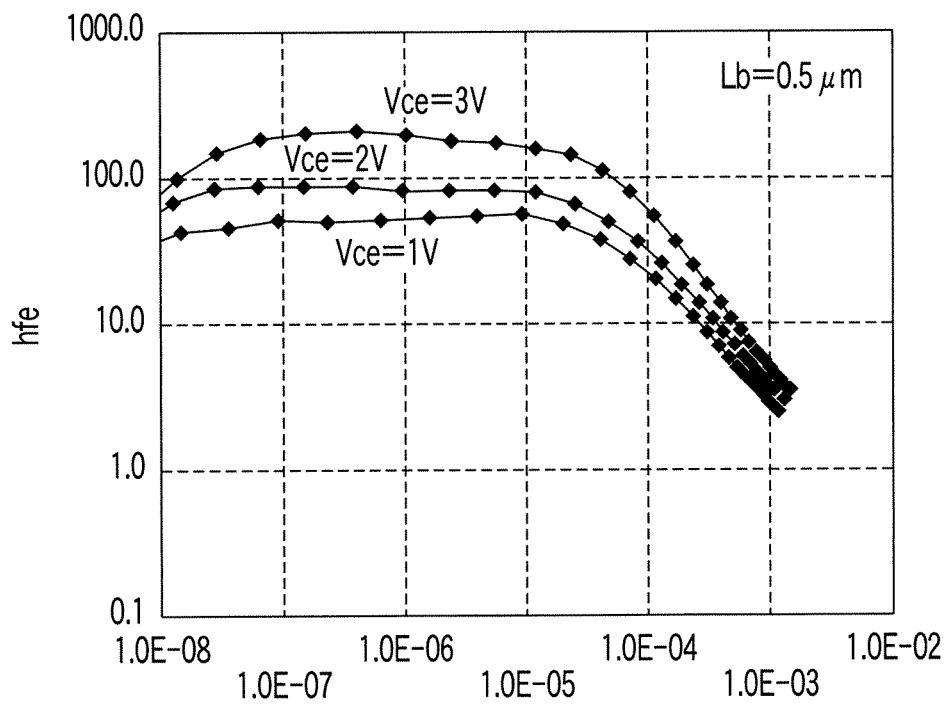
FIG. 41B is a graph showing the relationship between a collector current and a current amplification factor hFE of a hybrid TFT 200 according to the invention.

FIG. 41B is a graph showing the relationship between a collector current (Ic) and a current amplification factor hFE of the hybrid TFT 200. According to the characteristics shown in FIG. 41B, the current amplification factor hFE of about 200 at maximum is obtained.

Figure 41C:
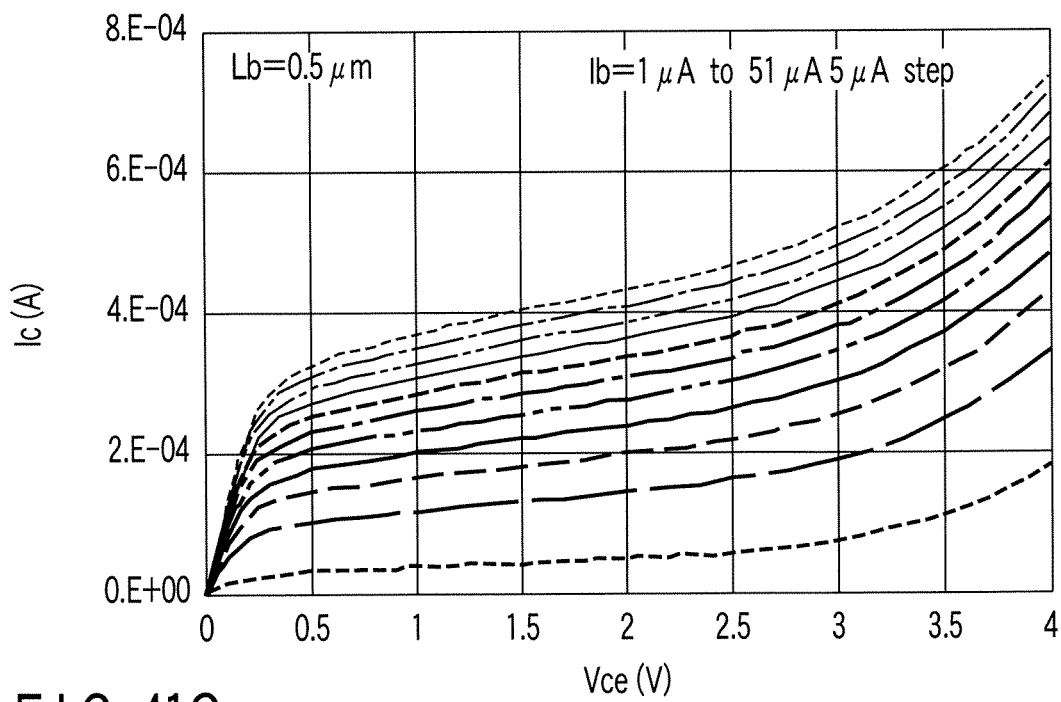
FIG. 41C is a graph showing input/output characteristics of the hybrid TFT.

FIG. 41C is a graph showing input/output characteristics of the hybrid TFT. Saturation characteristics, which are applicable to the use as current-control-type current source, are obtained. It is understood that characteristics, which are desirable for the application to an analog circuit, are obtained.

FIG. 42A is a graph showing the base length dependency of hFE at a time when the collector current, which is found from the characteristic diagram of FIG. 41B, is 0.1 mA. The current amplification factor hFE has a dependency of nearly hFE∝Lb$^{-2}$, relative to the base length Lb. This suggests that a re-coupled current is dominant in the base current. Since hFE exhibits a high dependency on Lb in this manner, it is effective to reduce the base length Lb in order to increase hFE. FIG. 42B is a graph showing the base length dependency of an early voltage (VA).

FIG. 43A and FIG. 43B show the collector current dependency of a cutoff frequency ($f_T$) and a maximum oscillation frequency (fmax) of hybrid TFTs having different base lengths (0.5 μm to 1.5 μm). The cut-off frequency ($f_T$) is defined as a frequency at which a current gain (h21) is 1. The maximum oscillation frequency (fmax) is defined as a frequency at which a maximum available power gain (MAG) or a Mason's unilateral gain (U) is 1.

The maximum available power gain (MAG) is a power gain in a case where impedance matching of a device is performed both on the input side and output side. The Mason's unilateral gain (U) is a power gain which is obtained when unilateralization is performed by virtually providing such a neutralizing circuit as to reduce to zero a reverse-directional gain from an output to an input.

MAG is given by $$MAG = |S_{21}/S_{12}|(k-(k^2-1)^{0.5})$$

where k is called "stabilizing coefficient", and is defined by $$k=(1+|S_{11}S_{11}-S_{12}S_{21}|^2-|S_{11}|^2-|S_{22}|^2)/2|S_{12}S_{21}|.$$

U is given by $$U = (|S_{21}/S_{12}-1|^2/2)/(K|S_{21}/S_{12}|-Re(S_{21}/S_{12}))$$
$$= MAG|S_{21}/_{12}-1|^2/|S_{21}/S_{12}-MAG|^2.$$

As is understood from the above equations, when MAG=1, U=1. Accordingly, fmax is obtained no matter which of MAG and U is used for evaluation.

In the above equations, S11, S12, S21 and S22 are 4-terminal scatter (S) parameters of the hybrid TFT, and are quantities that are measured by using a vector network analyzer.

With the device having a base length of 0.5 μm, $f_T$=2 GHz and fmax=5.2 GHz were obtained under the conditions of a base-emitter voltage=3V and a collector current=1 mA (≅14 μA/μm).

Figure 43C:
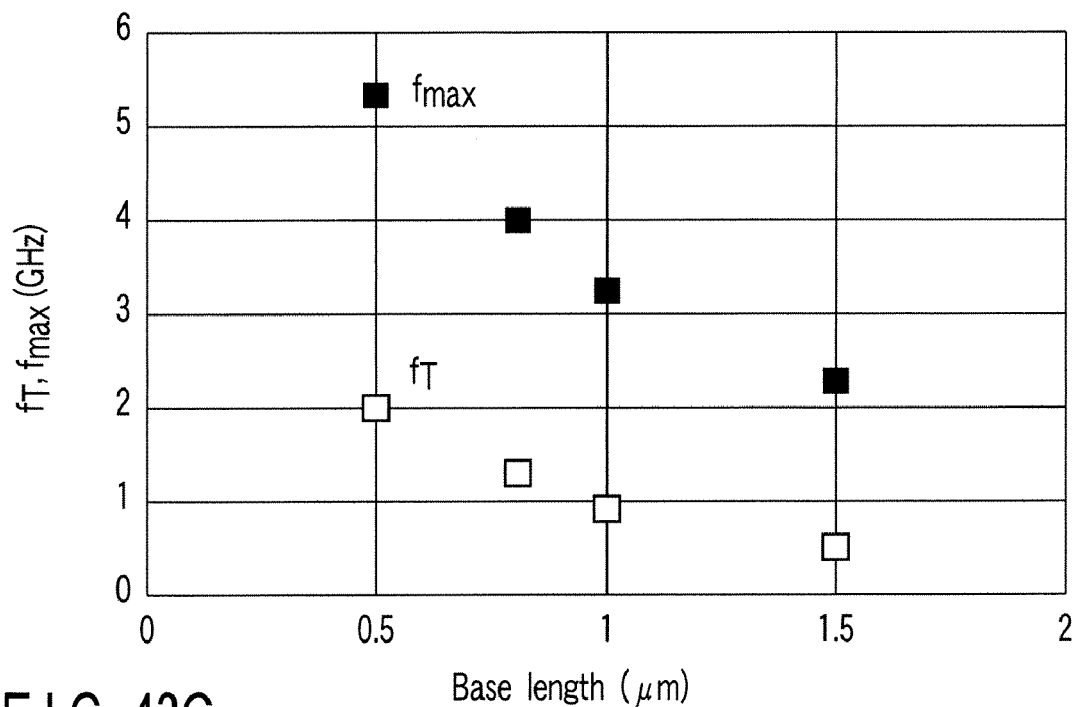
FIG. 43C is a graph showing the base length dependency of the cutoff frequency ($f_T$) and maximum oscillation frequency (fmax)

FIG. 43C is a graph showing the base length dependency of the cutoff frequency ($f_T$) and maximum oscillation frequency (fmax). Both the cutoff frequency ($f_T$) and maximum oscillation frequency (fmax) increase as the base length decreases. In order to realize better high-frequency characteristics, it is important to reduce the base length Lb. At each value of the base length, the maximum oscillation frequency (fmax) is a value on the order of GHz, which is an adequate value for use in a high-frequency circuit of several-ten MHz to several-hundred MHz.

In order to design a circuit for a high-frequency operation by using the above-described TFTs, it is necessary to derive an equivalent circuit from an admittance (Y) parameter of the device.

Figure 44A:
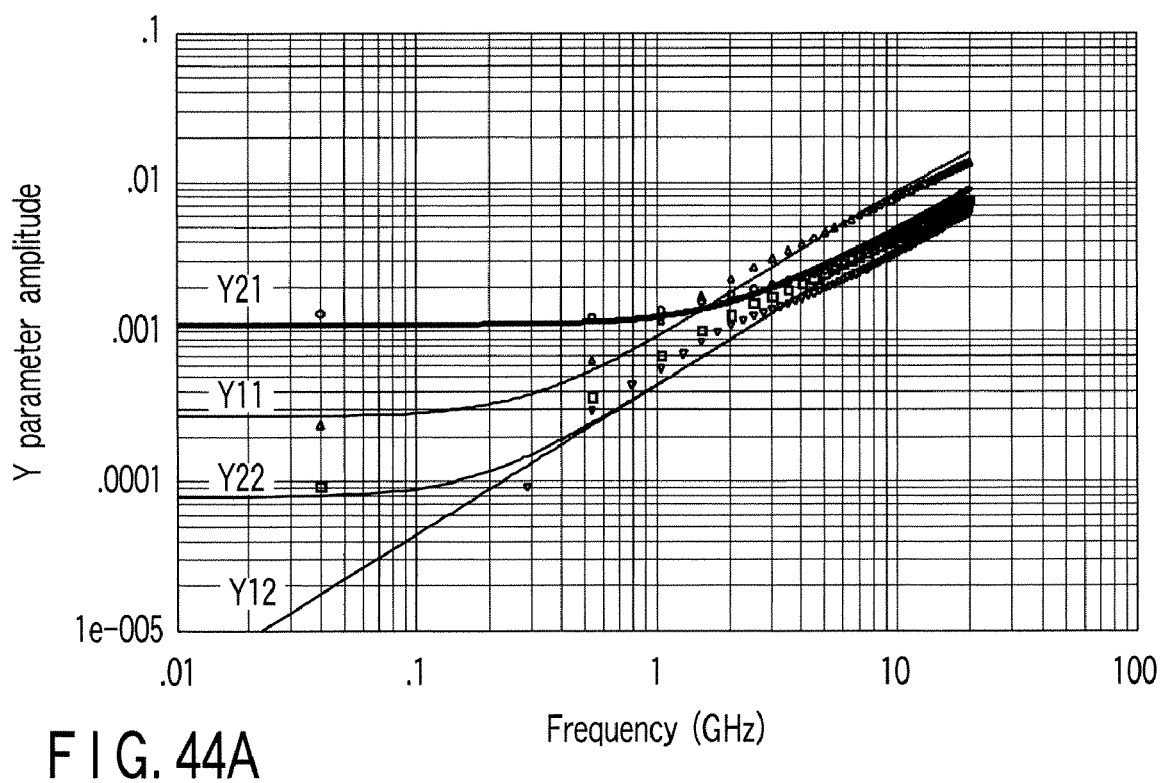
FIG. 44A is a graph in which an S parameter measurement value of a hybrid TFT with a base length of 0.5 μm is converted to a Y parameter and is plotted in relation to a frequency, the ordinate indicating an absolute value (amplitude) of the Y parameter.

FIG. 44A and FIG. 44B are graphs in which an S parameter measurement value of a hybrid TFT with a base length of 0.5

μm is converted to a Y parameter and is plotted in relation to a frequency. FIG. 44A shows the absolute value of the Y parameter, and FIG. 44B shows the phase of the Y parameter. In these Figures, symbols, such as "□", "○", "∇" and "Δ", indicate measurement values. Solid lines indicate calculation values based on a device model in which a bipolar transistor and a MOS transistor are connected in parallel, as shown in FIG. 44C. It is understood that the calculation values based on the device model substantially agree with the measurement values.

FIG. 44D and FIG. 44E show equivalent circuits of the bipolar transistor and the MOS transistor shown in FIG. 44C. FIG. 44D is an equivalent circuit diagram of a part which functions as the bipolar transistor. FIG. 44E is an equivalent circuit diagram of a part which functions as the MOS transistor. The measurement values of the Y parameter can be well reproduced by selecting proper values as the parameter. It was thus understood that the device model shown in FIG. 44C is advantageously usable for the circuit simulation using the hybrid TFT.

Twelfth Embodiment

Figure 45A:
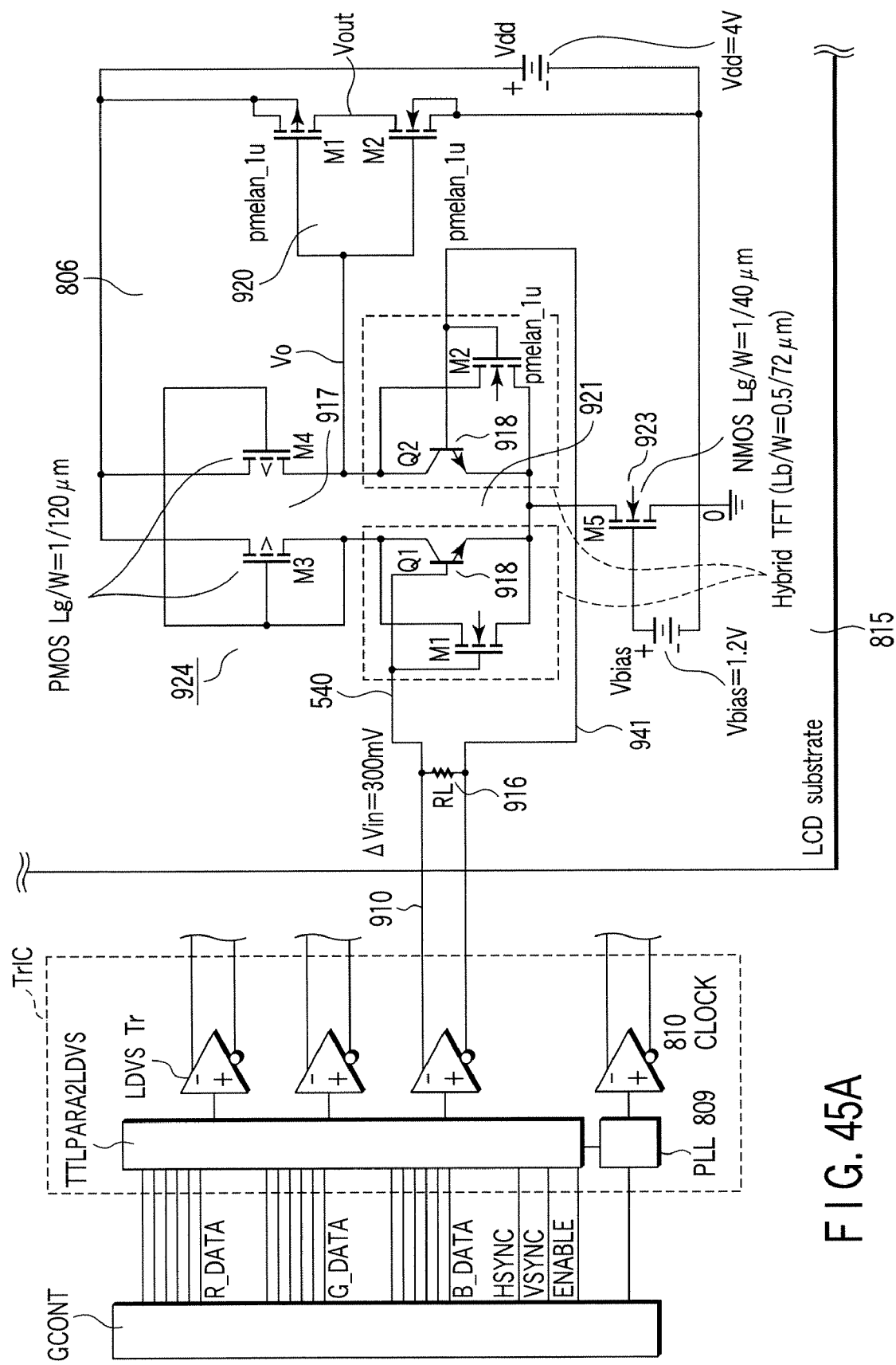
FIG. 45A shows another embodiment of the invention, which relates to a reception-side circuit of an LVDS interface circuit which is composed by combining hybrid TFTs and MOS TFTs.

Another Embodiment Relating to the Reception-Side Circuit of the LVDS Interface Circuit FIG. 45A shows another embodiment relating to the reception-side circuit of the LVDS interface circuit of the display device, as shown in FIG. 38, which is composed by combining the above-described hybrid TFTs and MOSFETs. This circuit is a differential amplification circuit 924 which comprises a current source load 917 that is composed of a pair of P-type MOS-FETs M3 and M4, drive transistors 921 that are composed of a pair of above-described hybrid thin-film transistors (M1, Q1) and (M2, Q2), and a constant current source 923 that is composed of an N-type MOS-FET M5.

A transmission line 910 is a balanced-type differential transmission line, and is characterized by robustness against external noise. In addition, since the amplitude of the transmission signal is 0.30V and small, the electromagnetic interference can be reduced. A differential signal voltage can be generated by flowing a current of ±3 mA through a terminal resistor (RL) 916 of 50Ω, and the generated differential signal voltage is applied to bases 918 of hybrid TFTs Q1 and Q2, which are structural components of the differential amplification circuit 924 and are formed in the crystallized semiconductor thin film. The output of the first-stage amplifier is further amplified by a buffer amplifier that is composed of a CMOS inverter 920, and is boosted up to such a level that the output can be handled by TFTs in the LCD panel.

Figure 45B:
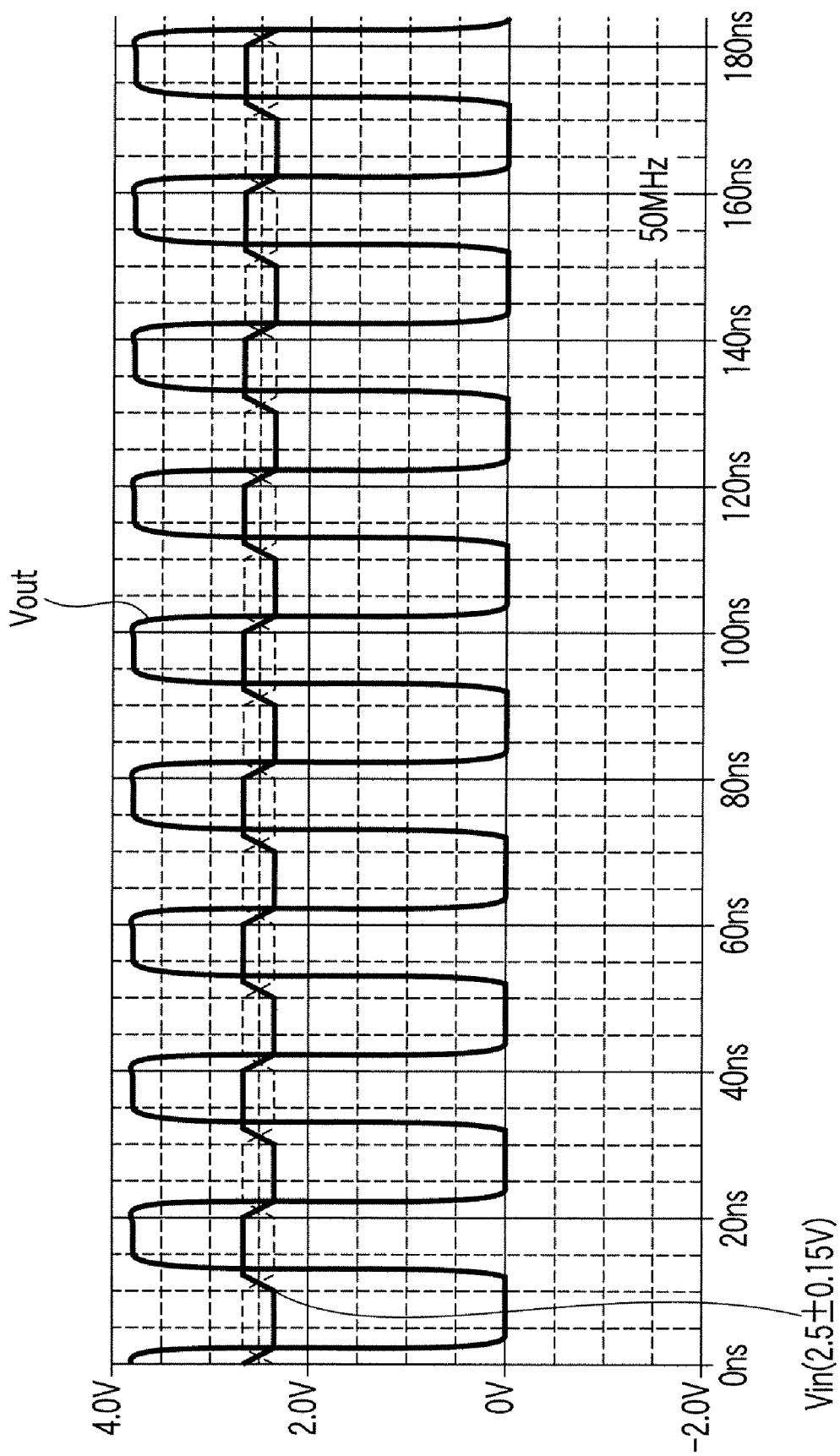
FIG. 45B is a graph showing input and output signal waveforms of the interface circuit shown in FIG. 45A.

FIG. 45B is a graph showing input and output signal waveforms of the interface circuit shown in FIG. 45A. The frequency is 50 MHz. An input voltage of ±0.15V is amplified to an amplitude of about 4V without disturbance of the waveform.

Figure 45C:
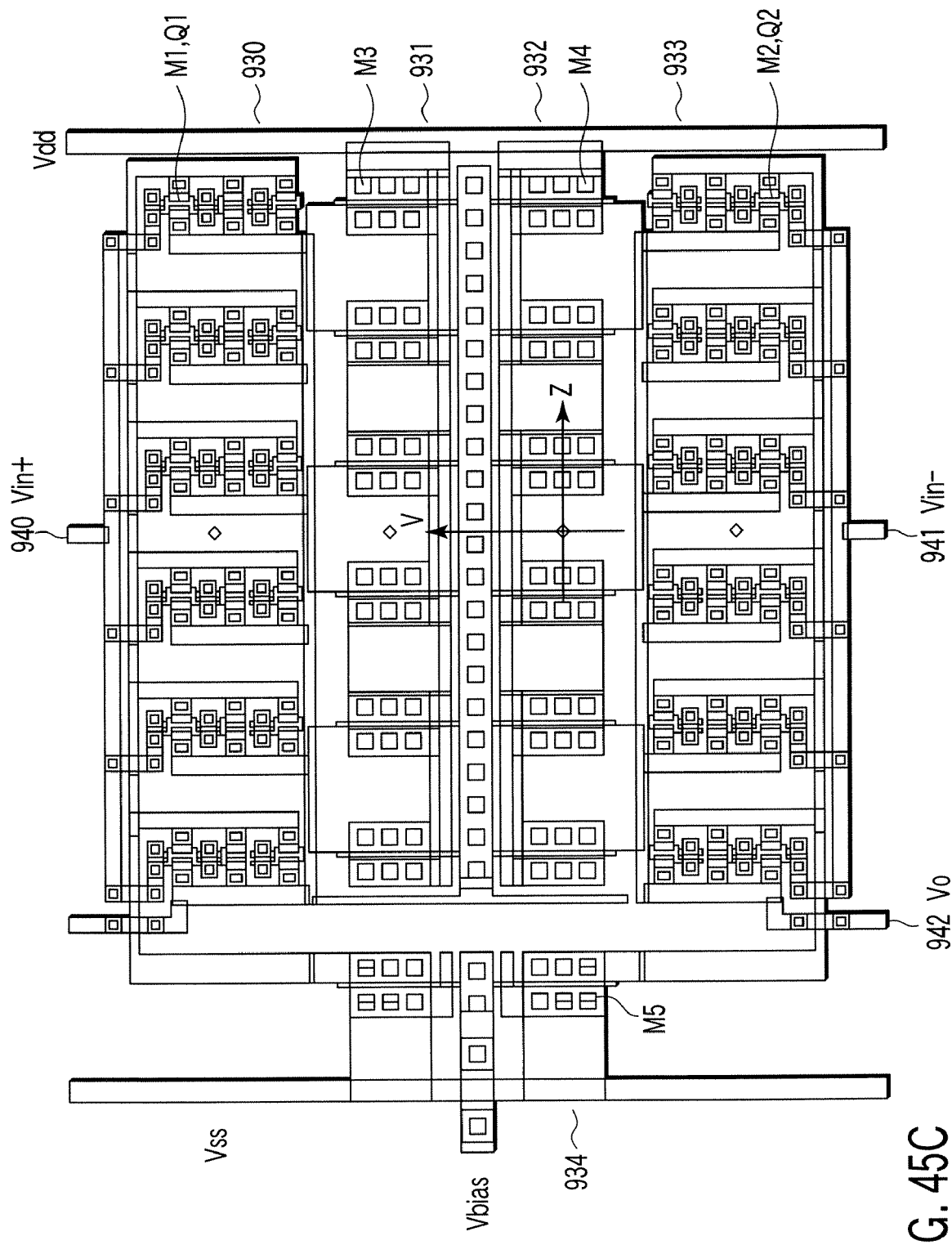
FIG. 45C shows a plan-view layout of the interface circuit according to the invention.

FIG. 45C shows a plan-view layout of the interface circuit shown in FIG. 45A. The interface circuit is arranged within an area of 200 μm×250 μm, and thus the interface circuit can well be disposed on a peripheral part of the LCD substrate.

In the plan-view layout of FIG. 45C, for example, left-side transistors M1 and Q1 of the drive transistors 921 shown in FIG. 45A are disposed in a first-stage block 930. A left-side transistor M3 of the current load 917 is disposed in a second-stage block 931. A right-side transistor M4 of the current load 917 is disposed in a third-stage block 932. Right-side transistors M2 and Q2 of the drive transistors 921 are disposed in a fourth-stage block 933. In each of the stages, 3×6=18 TFTs are connected in parallel. An N-type MOS-TFT M5 of the constant current source 923 is disposed in a left-side block 934 in FIG. 45C. The constant current source 923 is configured such that 3×2=6 TFTs are connected in parallel.

An input signal from the transmission line 910 in FIG. 45A is input to Vin+ 940 and Vin− 941, and is amplified and output from Vo 942.

Since the voltage amplitude of the input signal is small in this differential transmission system, it is difficult to detect a small voltage signal by the MOS FET formed on the Si thin film, which has a large variance in threshold voltage. Thus, in general, the conventional first-stage amplifier uses a dedicated LVDS receiver that is fabricated on an Si wafer.

In the present embodiment, the differential amplifier 817 is composed of the hybrid TFTs that are formed in the crystallized semiconductor thin film. Thereby, the detection sensitivity of the input can be improved by more than an order of magnitude. Therefore, the conventionally used LVDS receiver IC can be dispensed with, and the cost of the LCD panel can effectively be reduced. Furthermore, since a signal can be received as such from a transmitter of standard LVDS specifications, a general-purpose transmitter IC is usable and there is no need to modify a system-side interface. This also contributes to reduction in cost.

The present invention is usable as an image display device for a mobile information terminal or a mobile phone, or as an image display device of an information apparatus such as a personal computer.

What is claimed is:

1. An electronic device including an insulation film formed on an insulating substrate,
   a non-crystallized semiconductor thin film formed on the insulation film,
   a crystallized region in which a predetermined transistor formation region of the non-crystallized semiconductor thin film is crystallized in a lateral direction, and
   a plurality of semiconductor devices which are formed in the non-crystallized semiconductor thin film or the crystallized region on the insulation film, the plurality of semiconductor devices including:
   a MOS thin-film transistor; and
   at least either one of a lateral bipolar thin-film transistor and a MOS-bipolar hybrid thin-film transistor, wherein
   a base region or a channel region of the lateral bipolar thin-film transistor and the MOS-bipolar hybrid thin-film transistor is provided in a single crystallized region, and the channel region of the MOS thin-film transistor is provided in the non-crystallized semiconductor thin film or the crystallized region, and
   directions of movement of carriers in the MOS thin-film transistor, the lateral bipolar thin-film transistor and the MOS-bipolar hybrid thin-film transistor formed in the crystallized region are parallel to the direction of the crystallization.

2. The electronic device according to claim 1, wherein no crystal grain boundary is present in the base region or the channel region of the MOS thin-film transistor, the lateral bipolar thin-film transistor and the MOS-bipolar hybrid thin-film transistor formed in the crystallized region.

3. The electronic device according to claim 1, wherein a thickness of the non-crystallized semiconductor thin film is 30 nm to 360 nm.

4. The electronic device according to claim 1, wherein a base length of the lateral bipolar thin-film transistor is 2 μm or less.

5. The electronic device according to claim 1, wherein a minimum value of the base length of the lateral bipolar hybrid thin-film transistor is 2 μm or less.

6. The electronic device according to claim 1, wherein a width of the base region of the lateral bipolar thin-film transistor is 5 μm or less.

7. The electronic device according to claim 1, wherein a minimum value of a gate length of the MOS thin-film transistor is 1 μm or less.

8. The electronic device according to claim 1, wherein the crystallized region in which the predetermined transistor formation region of the non-crystallized semiconductor thin film is crystallized in a lateral direction forms a temperature gradient in the predetermined transistor formation region of the non-crystallized semiconductor thin film to melt the non-crystallized semiconductor thin film, a base length of the lateral bipolar thin- film transistor, which is a re-crystallized region, being 2 μm or less.

* * * * *